United States Patent
Akutsu et al.

(10) Patent No.: US 11,487,619 B2
(45) Date of Patent: Nov. 1, 2022

(54) DISTRIBUTED STORAGE SYSTEM

(71) Applicant: Hitachi, Ltd., Tokyo (JP)

(72) Inventors: Hiroaki Akutsu, Tokyo (JP); Shunji Kawamura, Tokyo (JP); Kota Yasunaga, Tokyo (JP); Takahiro Yamamoto, Tokyo (JP); Atsushi Kawamura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 17/326,504

(22) Filed: May 21, 2021

(65) Prior Publication Data

US 2021/0271551 A1     Sep. 2, 2021

Related U.S. Application Data

(60) Continuation of application No. 16/680,772, filed on Nov. 12, 2019, now Pat. No. 11,036,585, which is a
(Continued)

(30) Foreign Application Priority Data

Sep. 30, 2014     (WO) .................. PCT/JP2014/076105

(51) Int. Cl.
*G06F 11/10*     (2006.01)
*G06F 3/06*      (2006.01)
(Continued)

(52) U.S. Cl.
CPC .......... *G06F 11/1076* (2013.01); *G06F 3/064* (2013.01); *G06F 3/067* (2013.01);
(Continued)

(58) Field of Classification Search
CPC ......... G06F 2211/1028; G06F 11/1076; G06F 3/067; H04L 67/1097
See application file for complete search history.

(56) References Cited

U.S. PATENT DOCUMENTS

| 5,388,108 A | 2/1995 | DeMoss et al. |
| 5,488,731 A | 1/1996 | Mendelsohn |

(Continued)

FOREIGN PATENT DOCUMENTS

| JP | 2000-039970 A | 2/2000 |
| JP | 2003-131818 A | 5/2003 |

(Continued)

OTHER PUBLICATIONS

International Search Report of PCT/JP2015/077853 dated Dec. 15, 2015 and Written Opinion.

(Continued)

*Primary Examiner* — Joseph D Torres
(74) *Attorney, Agent, or Firm* — Mattingly & Malur, PC

(57) ABSTRACT

A first node group including at least three nodes is predefined in a distributed storage system. Each node of the first node group is configured to send data blocks stored in storage devices managed by the node to other nodes belonging to the first node group. A first node is configured to receive data blocks from two or more other nodes in the first node group. The first node is configured to create a redundant code using a combination of data blocks received from the two or more other nodes and store the created redundant code to a storage device different from storage devices holding the data blocks used to create the redundant code. Combinations of data blocks used to create at least two redundant codes in redundant codes created by the first node are different in combination of logical addresses of constituent data blocks.

12 Claims, 45 Drawing Sheets

Related U.S. Application Data continuation of application No. 16/108,265, filed on Aug. 22, 2018, now Pat. No. 10,496,479, which is a division of application No. 15/120,840, filed as application No. PCT/JP2015/077853 on Sep. 30, 2015, now abandoned.

(51) Int. Cl.
*H04L 29/08* (2006.01)
*H04L 67/1097* (2022.01)
*H03M 13/29* (2006.01)

(52) U.S. Cl.
CPC ...... *G06F 3/0619* (2013.01); *H03M 13/2906* (2013.01); *H04L 67/1097* (2013.01); *G06F 2211/1028* (2013.01)

(56) References Cited

U.S. PATENT DOCUMENTS

| | | | |
|---|---|---|---|
| 5,519,849 A | 5/1996 | Malan et al. | |
| 5,689,678 A | 11/1997 | Stallmo | |
| 6,460,122 B1 | 10/2002 | Otterness | |
| 6,990,547 B2 | 1/2006 | Ulrich | |
| 6,990,667 B2 | 1/2006 | Ulrich | |
| 7,054,927 B2 | 5/2006 | Ulrich | |
| 7,296,180 B1 | 11/2007 | Waterhouse | |
| 7,313,663 B2 | 12/2007 | Hirakawa | |
| 7,328,303 B1 | 2/2008 | Waterhouse | |
| 7,389,393 B1* | 6/2008 | Karr | G06F 3/067 711/156 |
| 7,536,693 B1 | 5/2009 | Manczak | |
| 7,546,342 B2 | 6/2009 | Li et al. | |
| 7,552,356 B1 | 6/2009 | Waterhouse | |
| 7,636,814 B1 | 12/2009 | Karr | |
| 7,734,643 B1 | 6/2010 | Waterhouse | |
| 7,743,210 B1 | 6/2010 | Jernigan, IV | |
| 7,827,350 B1 | 11/2010 | Jiang | |
| 7,962,689 B1 | 6/2011 | Kazar et al. | |
| 7,975,102 B1 | 7/2011 | Hyer, Jr. | |
| 8,001,580 B1 | 8/2011 | Hyer, Jr. | |
| 8,082,362 B1 | 12/2011 | Ewing | |
| 8,302,192 B1 | 10/2012 | Cnudde et al. | |
| 8,578,094 B2 | 11/2013 | Chambliss et al. | |
| 8,645,799 B2 | 2/2014 | Li et al. | |
| 8,756,598 B1 | 6/2014 | Costea et al. | |
| 8,910,156 B1 | 12/2014 | Kenchammana-Hosekote | |
| 9,294,558 B1* | 3/2016 | Vincent | H04L 67/1004 |
| 9,335,937 B2* | 5/2016 | Seo | G06F 3/0658 |
| 9,430,330 B1 | 8/2016 | Bardhan | |
| 2001/0044879 A1* | 11/2001 | Moulton | G06F 3/0689 709/213 |
| 2001/0048284 A1 | 12/2001 | Moulton | |
| 2002/0048284 A1* | 4/2002 | Moulton | G06F 11/1076 714/E11.034 |
| 2002/0124137 A1 | 9/2002 | Ulrich | |
| 2002/0138559 A1 | 9/2002 | Ulrich | |
| 2002/0156840 A1 | 10/2002 | Ulrich | |
| 2002/0156891 A1 | 10/2002 | Ulrich | |
| 2002/0156974 A1 | 10/2002 | Ulrich | |
| 2002/0161846 A1 | 10/2002 | Ulrich | |
| 2002/0161850 A1 | 10/2002 | Ulrich | |
| 2002/0161973 A1 | 10/2002 | Ulrich | |
| 2002/0165942 A1 | 11/2002 | Ulrich | |
| 2002/0166026 A1 | 11/2002 | Ulrich | |
| 2002/0166079 A1 | 11/2002 | Ulrich | |
| 2002/0169827 A1 | 11/2002 | Ulrich | |
| 2002/0191311 A1 | 12/2002 | Ulrich | |
| 2002/0194526 A1 | 12/2002 | Ulrich | |
| 2004/0064633 A1 | 4/2004 | Oota | |
| 2004/0128587 A1 | 7/2004 | Kenchammana-Hosekote | |
| 2005/0076077 A1 | 4/2005 | Katayama | |
| 2005/0080916 A1 | 4/2005 | Katayama | |
| 2005/0125549 A1 | 6/2005 | Katayama | |
| 2006/0047896 A1 | 3/2006 | Nguyen et al. | |
| 2006/0248088 A1 | 11/2006 | Kazar et al. | |
| 2006/0248273 A1 | 11/2006 | Jernigan, IV et al. | |
| 2006/0248379 A1 | 11/2006 | Jernigan, IV | |
| 2007/0101069 A1 | 5/2007 | Corbett et al. | |
| 2007/0156842 A1 | 7/2007 | Vermeulen | |
| 2007/0214183 A1 | 9/2007 | Howe | |
| 2008/0126712 A1 | 5/2008 | Mizushima | |
| 2008/0295094 A1 | 11/2008 | Korupolu | |
| 2009/0049240 A1 | 2/2009 | Oe | |
| 2009/0077443 A1 | 3/2009 | Nguyen et al. | |
| 2009/0216986 A1 | 8/2009 | Sakurai et al. | |
| 2009/0307524 A1 | 12/2009 | Kumano | |
| 2009/0328151 A1 | 12/2009 | Tamura | |
| 2010/0064166 A1 | 3/2010 | Dubnicki | |
| 2010/0180153 A1 | 7/2010 | Jernigan, IV et al. | |
| 2011/0138144 A1 | 6/2011 | Tamura et al. | |
| 2011/0202721 A1 | 8/2011 | Popovski | |
| 2011/0208995 A1 | 8/2011 | Hafner et al. | |
| 2011/0208996 A1 | 8/2011 | Hafner | |
| 2011/0289052 A1 | 11/2011 | Rambacher | |
| 2012/0079189 A1 | 3/2012 | Colgrove | |
| 2012/0079318 A1 | 3/2012 | Colgrove | |
| 2012/0084504 A1 | 4/2012 | Colgrove | |
| 2012/0084507 A1 | 4/2012 | Colgrove | |
| 2012/0260150 A1 | 10/2012 | Cideciyan | |
| 2012/0290714 A1 | 11/2012 | Cohen | |
| 2013/0111166 A1 | 5/2013 | Resch | |
| 2013/0138908 A1 | 5/2013 | Iwasaki | |
| 2013/0204849 A1 | 8/2013 | Chacko | |
| 2014/0237321 A1* | 8/2014 | Gold | G06F 11/1658 714/773 |
| 2015/0227318 A1 | 8/2015 | Banka et al. | |

FOREIGN PATENT DOCUMENTS

| | | |
|---|---|---|
| JP | 2004-126716 A | 4/2004 |
| JP | 2008-511064 A | 4/2008 |
| JP | 2008-159013 A | 7/2008 |
| JP | 2012-033169 A | 2/2012 |
| JP | 2013-114624 A | 6/2013 |
| JP | 2014-53005 A | 3/2014 |

OTHER PUBLICATIONS

United States Non-Final Office Action received in corresponding U.S. Appl. No. 15/662,510 dated Dec. 15, 2017.
Japanese Office Action received in corresponding Japanese Application No. 2016-552148 dated Mar. 6, 2018.
U.S. Final Office Action received in corresponding U.S. Appl. No. 15/662,510 dated Apr. 20, 2018.
Japanese Office Action received in corresponding Japanese Application No. 2021-021418 dated Apr. 12, 2022.

* cited by examiner

| VIRTUAL VOLUME MANAGEMENT TABLE 218 | | | |
|---|---|---|---|
| VIRTUAL VOLUME# | SIZE (BLOCK) | USE NODE# | SYNC/ASYNC |
| 0x0100 | 0x21210000 | 0x00, 0x01, 0x02 | GEO : ASYNC<br>SITE : SYNC<br>NODE : SYNC |
| 0x0101 | 0x12301200 | 0x00 | |
| 0x1100 | 0x42123000 | 0x00, 0x01, 0x02 | |
| 0x2100 | 0x12124120 | 0x00, 0x02 | |
| 0x3100 | 0x12181230 | 0x00, 0x03, 0x04 | |

Fig. 5A

| POOL VOLUME MANAGEMENT TABLE 219 | | |
|---|---|---|
| POOL VOLUME# | SIZE (BLOCK) | NODE# |
| 0x0000 | 0x21210000 | 0x00 |
| 0x0001 | 0x12301200 | 0x00 |
| 0x1000 | 0x42123000 | 0x01 |
| 0x2000 | 0x12124120 | 0x02 |
| 0x3000 | 0x12181230 | 0x03 |

Fig. 5B

| DRIVE MANAGEMENT TABLE 220 | | | |
|---|---|---|---|
| POOL VOLUME# | TYPE | DRIVE# | SIZE (BLOCK) |
| 0x0000 | SSD | 0x40 | 0x20000000 |
| | | 0x41 | 0x20000000 |
| | | 0x42 | 0x20000000 |
| 0x0001 | NL-SAS (7.2Krpm) | 0x20 | 0xE0000000 |
| | | 0x21 | 0xE0000000 |
| | | 0x22 | 0xE0000000 |

Fig. 5C

| DRIVE STATE MANAGEMENT TABLE 221 |||
|---|---|---|
| DRIVE# | STATE | ERROR COUNT |
| 0x40 | NORMAL | 0 |
| 0x41 | NORMAL | 0 |
| 0x42 | FAILURE | 50 |
| 0x20 | NORMAL | 0 |
| 0x21 | WARNING | 4 |
| 0x22 | NORMAL | 0 |

Fig. 5D

| NODE STATE MANAGEMENT TABLE 222 |||
|---|---|---|
| NODE# | STATE | ERROR COUNT |
| 0x00 | NORMAL | 0 |
| 0x01 | NORMAL | 0 |
| 0x02 | FAILURE | 10 |

Fig. 5E

| SITE STATE MANAGEMENT TABLE 223 |||
|---|---|---|
| SITE# | STATE | ERROR COUNT |
| 0x00 | NORMAL | 0 |
| 0x01 | NORMAL | 0 |
| 0x02 | FAILURE | 200 |

Fig. 5F

| PAGE MAPPING TABLE 215 | | | | |
|---|---|---|---|---|
| VIRTUAL VOLUME# | LBA | RANGE | POOL VOLUME# | LBA |
| 0x0000 | | | | |
| | | | | |
| | | | | |
| 0x0001 | | | | |
| | | | | |

Fig. 6A

| PAGE LOAD FREQUENCY TABLE 216 | | | |
|---|---|---|---|
| VIRTUAL VOLUME# | LBA | RANGE | IO FREQUENCY |
| 0x0000 | | | |
| | | | |
| | | | |
| 0x0001 | | | |
| | | | |

Fig. 6B

| PAGE LOAD DISTRIBUTION TABLE (AMONG SITE / AMONG NODE / IN NODE) 217 | |
|---|---|
| IO FREQUENCY LEVEL | PAGE AMOUNT |
| | |
| | |
| | |
| | |

Fig. 6C

| STATIC MAPPING TABLE (LAYER #2 (SITE))   211 | | | |
|---|---|---|---|
| SITE STRIPE TYPE # | DATA NODE # | REDUNDANT CODE(1) NODE # | REDUNDANT CODE(2) NODE # |
| 0x0000 | 0x00, 0x10, 0x20, 0x30 | 0x52 | 0x43 |
| 0x0001 | 0x00, 0x21, 0x22, 0x35 | 0x32 | 0x41 |
| 0x0002 | | | |
| 0x0003 | | | |
| 0x0004 | | | |

Fig.7A

| STATIC MAPPING TABLE (LAYER #3 (GEO))   212A | | | |
|---|---|---|---|
| GEO STRIPE TYPE # | DATA SITE # | REDUNDANT CODE(1) SITE # | REDUNDANT CODE(2) SITE # |
| 0x0000 | 0x00, 0x10, 0x20, 0x30 | 0x52 | 0x43 |
| 0x0001 | 0x00, 0x21, 0x22, 0x35 | 0x32 | 0x41 |
| 0x0002 | | | |
| 0x0003 | | | |
| 0x0004 | | | |

Fig. 7B

| CONSISTENT HASHING TABLE (LAYER #3 (GEO))   212B | | |
|---|---|---|
| EXIST NODE # | REDUNDANT CODE(1) EXIST NODE # (HASH) | REDUNDANT CODE(2) EXIST NODE # (HASH) |
| 0x0000 | 0x3A22 | 0x5012 |
| 0x0001 | 0x1024 | 0x3F25 |
| 0x0002 | 0x120E | 0x4869 |
| 0x0003 | 0x5932 | 0x9A23 |
| 0x0004 | 0x4012 | 0x592C |

Fig. 7C

LIST OF INTERFACES

| | COMMAND NAME | ARGUMENT | OUTPUT | DESCRIPTION |
|---|---|---|---|---|
| 3401 | D_WRITE | 1: DRIVE NUMBER<br>2: LBA<br>3: TRANSFER DATA LENGTH | 1: ADDRESS IDENTIFIER | WRITE DATA AND RETURN ADDRESS IDENTIFIER |
| 3402 | P_WRITE | 1: DRIVE NUMBER<br>2: TRANSFER DATA LENGTH<br>3: DATA STORAGE INFORMATION<br>3-1) DRIVE NUMBER<br>3-2) LBA<br>3-2) ADDRESS IDENTIFIER | N/A | WRITE DATA WITH INFORMATION ON DATA STORAGE LOCATION |
| 3403 | D_READ | 1: DRIVE NUMBER<br>2: LBA<br>3: TRANSFER DATA LENGTH | N/A | RETRIEVE LATEST DATA |
| 3404 | OLD_D_READ | 1: DRIVE NUMBER<br>2: ADDRESS IDENTIFIER | N/A | RETRIEVE OLD DATA (FOR GARBAGE COLLECTION/ REBUILDING) |
| 3405 | P_GET | 1: DRIVE NUMBER | 1: PARITY SOURCE-DATA INFORMATION [ ]<br>1-1) DRIVE NUMBER<br>1-2) LBA<br>1-3) ADDRESS IDENTIFIER | ACQUIRE INFORMATION ON SOURCE DATA OF PARITY FROM DRIVE |
| 3406 | P_PUSH | 1: DRIVE NUMBER<br>2: PARITY SOURCE-DATA INFORMATION [ ]<br>2-1) DRIVE NUMBER<br>2-2) LBA<br>2-3) ADDRESS IDENTIFIER | N/A | IN RESPONSE TO DESTAGING, NOTIFY OTHER DRIVE(S) OF INFORMATION ON SOURCE DATA OF PARITY (IN CASE OF TWO OR MORE PARITIES) |
| 3407 | STAT_GET | 1: DRIVE NUMBER | 1: USAGE OF DRIVE | MONITOR FOR CAPACITY DEPLETION |
| 3408 | INVALID | 1: DRIVE NUMBER<br>2: ADDRESS IDENTIFIER | N/A | INVALIDATE LOG INFORMATION AND DATA ASSOCIATED WITH SPECIFIED ADDRESS IDENTIFIER |
| 3409 | SEARCH | 1: DRIVE NUMBER | 1: INFORMATION ON PARITY TO BE DELETED<br>1-1) DRIVE NUMBER<br>1-2) LBA<br>2: SOURCE-DATA INFORMATION ON PARITY TO BE DELETED [ ]<br>2-1) DRIVE NUMBER<br>2-2) LBA<br>2-3) ADDRESS IDENTIFIER<br>2-4) INFORMATION ON NEW OR OLD | SEARCH PARITY STORAGE DRIVE FOR PARITY TO BE DELETED AND ACQUIRE SOURCE DATA INFORMATION ON DETECTED PARITY |

Fig.34

LIST OF INTERFACES

| | COMMAND NAME | ARGUMENT | OUTPUT | DESCRIPTION |
|---|---|---|---|---|
| 3401 | D_WRITE | 1: DRIVE NUMBER<br>2: LBA<br>3: TRANSFER DATA LENGTH | 1: ADDRESS IDENTIFIER | WRITE DATA AND RETURN ADDRESS IDENTIFIER |
| 4201 | P_WRITE2 | 1: DRIVE NUMBER<br>2: LBA<br>3: TRANSFER DATA LENGTH<br>4: PARITY SOURCE-DATA INFORMATION [ ]<br>4-1) DRIVE NUMBER<br>4-2) LBA<br>4-2) ADDRESS IDENTIFIER | N/A | WRITE PARITY WITH INFORMATION ON SOURCE DATA OF PARITY |
| 3403 | D_READ | 1: DRIVE NUMBER<br>2: LBA<br>3: TRANSFER DATA LENGTH | N/A | RETRIEVE LATEST DATA |
| 3404 | OLD_D_READ | 1: DRIVE NUMBER<br>2: ADDRESS IDENTIFIER | N/A | RETRIEVE OLD DATA (FOR GARBAGE COLLECTION/ REBUILDING) |
| 3407 | STAT_GET | 1: DRIVE NUMBER | 1: USAGE OF DRIVE | MONITOR FOR CAPACITY DEPLETION |
| 3408 | INVALID | 1: DRIVE NUMBER<br>2: ADDRESS IDENTIFIER | N/A | INVALIDATE LOG INFORMATION AND DATA ASSOCIATED WITH SPECIFIED ADDRESS IDENTIFIER |
| 3409 | SEARCH | 1: DRIVE NUMBER | 1: INFORMATION ON PARITY TO BE DELETED<br>1-1) DRIVE NUMBER<br>1-2) LBA<br>2: SOURCE-DATA INFORMATION ON PARITY TO BE DELETED[ ]<br>2-1) DRIVE NUMBER<br>2-2) LBA<br>2-3) ADDRESS IDENTIFIER<br>2-4) INFORMATION ON NEW OR OLD | SEARCH PARITY STORAGE DRIVE FOR PARITY TO BE DELETED AND ACQUIRE SOURCE DATA INFORMATION ON DETECTED PARITY |

Fig.42

DISTRIBUTED STORAGE SYSTEM

CLAIM OF PRIORITY

This application is a continuation application of U.S. application Ser. No. 16/680,772, filed Nov. 12, 2019, which is a continuation application of U.S. application Ser. No. 16/108,265, filed Aug. 22, 2018, now U.S. Pat. No. 10,496,479 which is a divisional application of U.S. application Ser. No. 15/120,840, filed Aug. 23, 2016, now abandoned, which is a National Stage Entry of International Patent Application No. PCT/JP2015/077853, filed Sep. 30, 2015, and claims priority from International Patent Application No. PCT/JP2014/076105 filed on Sep. 30, 2014, the contents of which are hereby incorporated by reference into this application.

BACKGROUND

This invention relates to a distributed storage system.

The amount of data keeps increasing while IT investment has leveled off. Cost saving in storage has become more important. For example, a type of distributed storage systems, ServerSAN-type storage systems, are expected to be popular in the future. The ServerSAN-type storage system is composed of a large number of general-use servers connected by a network to create a storage pool. The ServerSAN storage system could be an effective solution especially for a system including server nodes equipped with high-speed SSDs to conduct high spec analysis such as large-scale big data analysis.

Background art of this technical field includes U.S. Pat. No. 7,546,342 B2, which discloses: A relative importance for each file associated with the web site is calculated. This relative importance is used to calculate several subsets of the content which are distributed to several devices within a computer cluster, such as a server array, peer-to-peer network, and the like. The subsets may include coded messages created using an erasure coding scheme on packets containing portions of one or more files. Upon retrieving a file, a fixed number of distinct coded messages are retrieved from the devices based on the erasure coding scheme. The file is re-created with these distinct messages. Because multiple devices hold the content, the web site may be retrieved significantly faster and the reliability is increased without consuming a large amount of storage space or bandwidth of any one computing device (Abstract).

CITATION LIST

U.S. Pat. No. 7,546,342 B2

SUMMARY

Traditional ServerSAN storage systems use local storage devices directly connected with server nodes as a final storage place and distribute write data and its redundant data to a plurality of server nodes to protect data. Specifically, the system divides write data from a host into a plurality of data blocks, creates redundant codes from division blocks by erasure coding, and distributes the division blocks and the redundant codes equally to the plurality of server nodes.

In this way, traditional ServerSAN storage systems distribute write data received from a host to a plurality of server nodes. Accordingly, when an application program reads data from the ServerSAN storage, data blocks are transferred through the network among the server nodes. Consequently, the throughput of the network could become a bottleneck to increase data access latency, compared to data read without data transfer through a network.

A representative example of this invention is a distributed storage system including: a plurality of nodes capable of communicating with each other via a network; and a plurality of storage devices, wherein a first node group including at least three nodes is predefined in the plurality of nodes, wherein each node of the first node group is configured to send data blocks stored in storage devices managed by the node to other nodes belonging to the first node group, wherein a first node of the first node group is configured to receive data blocks from two or more other nodes in the first node group, wherein the first node is configured to create a redundant code using a combination of data blocks received from the two or more other nodes, wherein the first node is configured to store the created redundant code to a storage device different from storage devices holding the data blocks used to create the redundant code, and wherein combinations of data blocks used to create at least two redundant codes in redundant codes created by the first node are different in combination of logical addresses of constituent data blocks.

An aspect of this invention achieves high capacity efficiency and high reliability of a storage system.

BRIEF DESCRIPTION OF THE DRAWINGS

FIG. 5A illustrates a configuration example of a virtual volume management table;

FIG. 5B illustrates a configuration example of a pool volume management table;

FIG. 5C illustrates a configuration example of a drive management table;

FIG. 5D illustrates a configuration example of a drive state management table;

FIG. 5E illustrates a configuration example of a node state management table;

FIG. 5F illustrates a configuration example of a site state management table;

FIG. 6A illustrates a configuration example of a page mapping table;

FIG. 6B illustrates a configuration example of a page load frequency table;

FIG. 6C illustrates a configuration example of a page load distribution table;

FIG. 7A illustrates a configuration example of a site static mapping table;

FIG. 7B illustrates a configuration example of a geo static mapping table;

FIG. 7C illustrates a configuration example of a consistent hashing table;

FIG. 34 is a list of communication interfaces between a computer node and a flash drive in Embodiment 3;

FIG. 42 is a list of communication interfaces between a computer node and a drive in Embodiment 4;

DETAILED DESCRIPTION OF THE EMBODIMENTS

Figure 1:
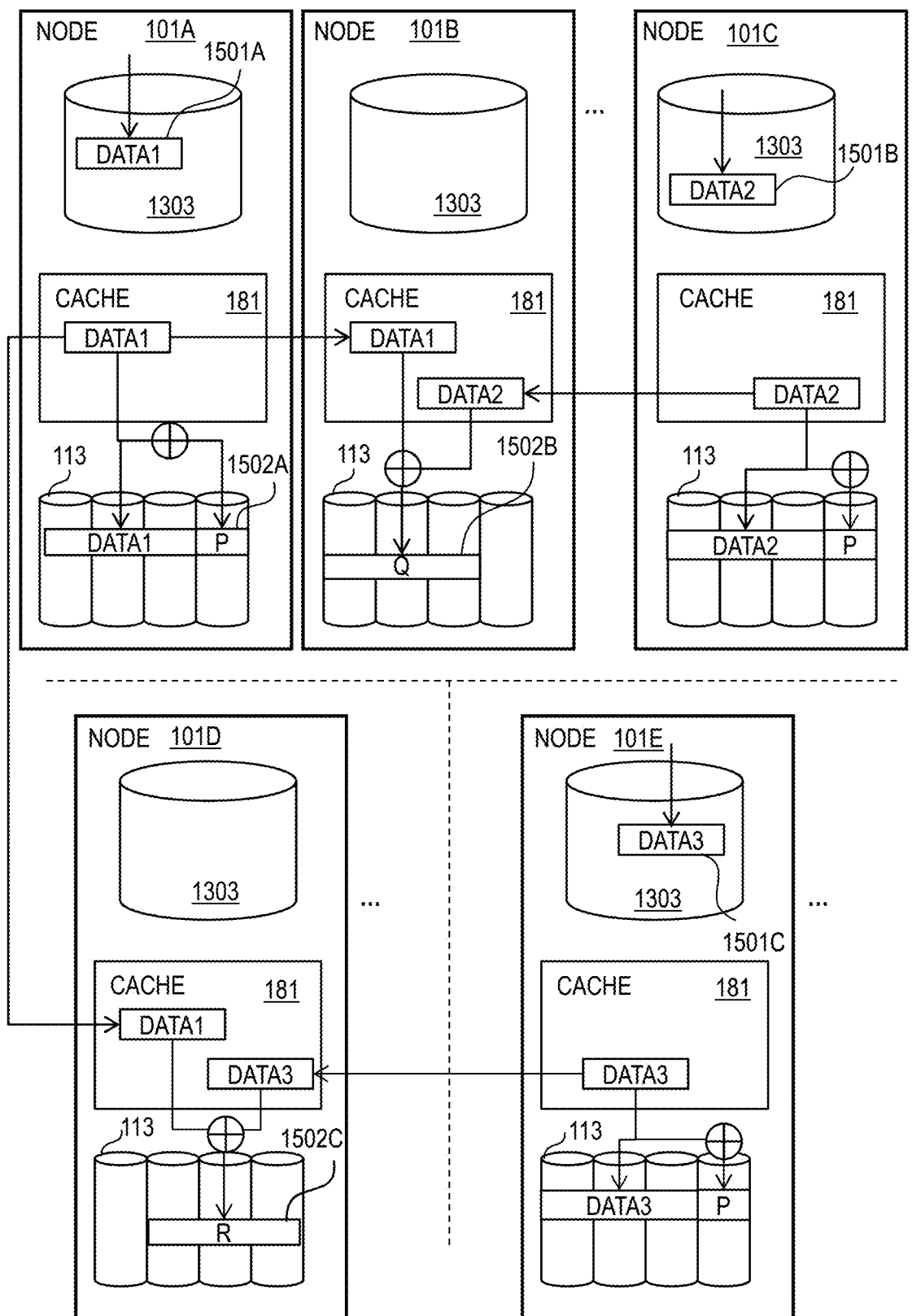
FIG. 1 illustrates an outline of write processing in a distributed storage system.

Embodiments of this invention are described with reference to the drawings. It should be noted that the embodiments described hereinafter are not to limit the invention according to the claims and that not all the combinations of the features described in the embodiments are indispensable for the solving means of the invention.

In the following description, information may be described with the terms such as table, list, and queue; however, the information may be expressed in data structures other than these. To imply independency from the data structure, "xx table", "xx list", or the like may be referred to as "xx information". In describing specifics of the information, terms such as identification information, identifier, name, ID, and number are used; they may be replaced with one another.

Embodiment 1

Overview

This embodiment discloses distributed storage systems. The distributed storage systems are composed of computer nodes each including a storage device and connected by a network. The distributed storage systems provide a virtual storage system implementing a storage pool with the storage devices of the computer nodes.

In an example of a distributed storage system, a computer node stores write data of a host to its local storage device, and further transfers the write data to another computer node to protect the data in case of a failure of the computer node. The other computer node is referred to as transfer destination computer node.

The transfer destination node creates a redundant code from write data transferred from a plurality of different computer nodes. The transfer destination computer node stores the created redundant code to its local storage device.

Placing the data preferably to the node that has received a write request eliminates communications among nodes in reading the data to allow speedy reading. In the meanwhile, creating a redundant code among computer nodes at a node different from the nodes that have received write requests achieves data protection with small overhead. Particularly in constructing a distributed storage system with a large number of nodes with low reliability, the configuration of this invention is effective that guarantees redundancy while maintaining the read performance.

Furthermore, particularly in running an analytical application in the distributed storage system of this invention, each computer node will probably hold most of the data the computer should analyze in its local storage area. This configuration achieves shorter loading time for data analysis, improving business agility and saving the storage cost.

In an example, a distributed storage system provides a virtual volume to a host. The distributed storage system allocates a logical page from a pool volume to a virtual page that has received a write access. The pool volume is a logical volume; the logical storage area of the pool volume is allocated physical storage areas of storage devices.

A computer node selects virtual pages where to allocate logical pages from its local storage device based on the network bandwidth of the distributed storage system and the access frequencies from the host to individual virtual pages of the computer node. For example, the computer node determines a threshold based on the network bandwidth of the distributed storage system and places the logical pages accessed more frequently than the threshold to its local storage device. As a result, speedily accessible page allocation is attained while eliminating a network bottleneck.

In an example, a computer node has an interface for an application program or a user to designate the location of a virtual page. A virtual page is designated with, for example, a logical address related to the virtual volume including the virtual page. The location of a virtual page is indicated with the computer node that holds the data of the virtual page. The interface for designating the location of a virtual page enables page allocation optimized for the user of the virtual pages.

In this embodiment, the distributed storage system can include all the aforementioned plurality of configuration examples but may include part of the configurations.

Description of Terms

In this disclosure, storage device includes a single storage drive such as an HDD or an SSD, a RAID apparatus including a plurality of storage drives, and a plurality of RAID apparatuses. Stripe of or stripe data is a data unit to be a basis of creating a redundant code for data protection. The stripe may be referred to as user data to distinguish from a redundant code. The stripe is stored in a storage device in a computer node and further used in creating a redundant code in another computer node.

Stripe type is a class of stripes for creating a redundant code. The stripe type to which a stripe belongs is determined by, for example, the logical address of the stripe and the computer node holding the stripe. A stripe type number or an identifier of a stripe type indicates a group of associated computer nodes. One stripe can belong to stripe types in different protection layers. Host is a computer that accesses a storage system, the processor operating in the computer, or a program executed by the processor.

FIG. 1 illustrates an outline of write processing in the distributed storage system as an example of this embodiment. Computer nodes 101A, 101B, and 101C are included in a single computer domain (hereinafter, also referred to as domain). In the example described hereinafter, a domain is associated with a site. Computer nodes 101D and 101E are each located in a site different from the other computer nodes. The computer nodes 101A to 101E communicate with one another via a network. Hereinafter, a computer node may be simply referred to as node.

Each of the computer nodes 101A to 101E includes a cache 181 and storage drives 113. Each of the nodes 101A to 101E provides a volume 1303.

The node 101A stores write data DATA1 (1501A) received from a host to the local cache 181 and further stores it to its local storage drives 113. The write data DATA1 is a stripe.

The node 101A creates a node redundant code P from the write data DATA1 and stores it to its local storage drive 113. The node redundant code is a redundant code created from data units stored in its local storage device and denoted by a reference sign P. The node 101A transfers write data DATA1 in its local cache 181 to the cache 181 of another node 101B.

The node 101C stores write data DATA2 (1501B) received from an external apparatus to its local cache 181 and further stores it to its local storage drives 113. The write data DATA2 is a stripe. The node 101C creates a node redundant code P from the write data DATA2 and stores it to its local storage drive 113. The node 101C transfers the write data DATA2 in its local cache 181 to the cache 181 of another node 101B.

The node 101B creates a site redundant code Q (1502B) from the DATA1 and DATA2 stored in its local cache 181 and stores it to its local storage drives 113 to protect the data in case of a failure of the computer node. The site redundant code is a redundant code among the nodes in a site and denoted by a reference sign Q. The site redundant code Q belongs to a protection layer different from the protection layer the node redundant code P belongs to.

The node 101C stores write data DATA3 (1501C) received from a host to its local cache 181 and further stores it to its local storage drives 113. The write data DATA3 is a stripe. The node 101E creates a node redundant code P from the write data DATA3 and stores it to its local storage drive 113.

The node 101A transfers the write data DATA1 in its local cache 181 to the cache 181 of another node 101D. The node 101E transfers the write data DATA3 in its local cache 181 to the cache 181 of another node 101D.

The node 101D creates a geo redundant code R (1502C) from the DATA1 and DATA3 stored in its local cache 181 and stores it to its local storage drives 113 to protect the data in case of a failure of the computer node. The geo redundant code is a redundant code among nodes in different sites and denoted by a reference sign R. The geo redundant code R belongs to a protection layer different from the protection layers the node redundant code P and the site redundant code Q belong to.

Figure 2:
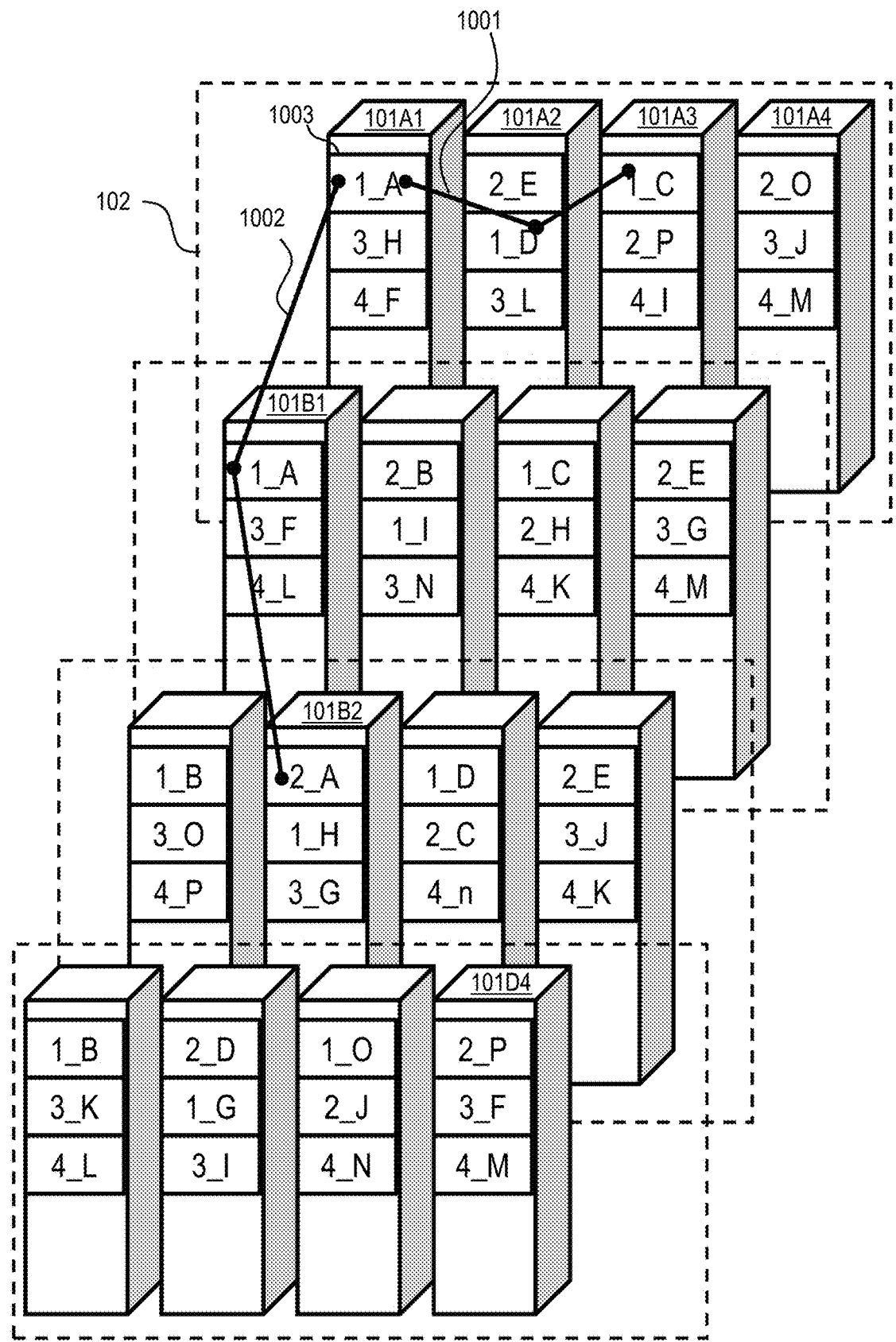
FIG. 2 illustrates an example of a mapping image of multiple protection layers in the distributed storage system.

FIG. 2 illustrates an example of a mapping image of multiple protection layers in the distributed storage system. FIG. 2 depicts an image to implement redundancy among the nodes in the same site and among the sites together. For example, first redundancy is implemented among the nodes in a data center and further, redundancy with a different site is implemented to protect data in multiple layers, so that the reliability of the system can be improved. In FIG. 2, only a part of the elements are denoted by reference signs and the reference signs of the same kinds of elements are partially omitted. In FIG. 2, each square pole represents a node; each broken-lined rectangle represents a site (domain); each rectangle in a node represents a stripe or the address of the stripe (date location). FIG. 2 shows four sites 102 and each site includes four nodes. FIG. 2 does not show redundant codes created from multiple stripes.

The combination of a numeral X and a letter Y (X_Y) in each stripe 1003 represents an identifier of the stripe type the stripe 1003 belongs to, where X represents an identifier of an inter-node stripe type in the site (site stripe type) and Y represents an identifier of an inter-site stripe type (geo stripe type).

One stripe 1003 belongs to one site stripe type and one geo stripe type. For example, the stripe 1_A stored in the node 101A1 belongs to the site stripe type 1001 and the geo stripe type 1002.

The stripes belonging to the site stripe type 1001 are the stripe 1_A in the node 101A1, the stripe 1_D in the node 101A2, and the stripe 1_C in the node 101A3. The node 101A4 which does not hold these stripes creates and holds the redundant code of these stripes.

The stripes belonging to the geo-stripe type 1002 are the stripe 1_A in the node 101A1, the stripe 1_A in the node 101B1, and the stripe 2_A in the node 101C2. The node 101D4 located in the site different from these creates and holds the redundant code of these stripes.

In the above-described configuration, each node transfers each stripe (data unit) received and held by the node to a transfer destination node; the transfer destination node creates a redundant code from the transferred data units and holds it. The stripes and their redundant code are stored in different nodes to achieve data protection against a node failure.

The node that has received a host command sends the received write data to another node without retrieving old data to create a site redundant code or a geo redundant code. Accordingly, performance in responding to a write command improves. Further, a stripe is transferred from a cache to cache to create a redundant code and the drives 113 do not intervene in the transfer; accordingly, if the drives 113 are flash media, less frequent write operations can save their lives.

Since the node stores a stripe received from a host to its local storage device without dividing it, shorter response time and less network traffic are achieved in reading the stripe. Further, the redundant code does not need to be transferred, which achieves less network traffic.

Furthermore, since one stripe belongs to multiple protection layers, the above-described configuration can attain higher fault tolerance of the system. It should be noted that the distributed storage system may be configured with a single protection layer in which only an inter-node redundant code in a site or among sites is created.

Figure 3:
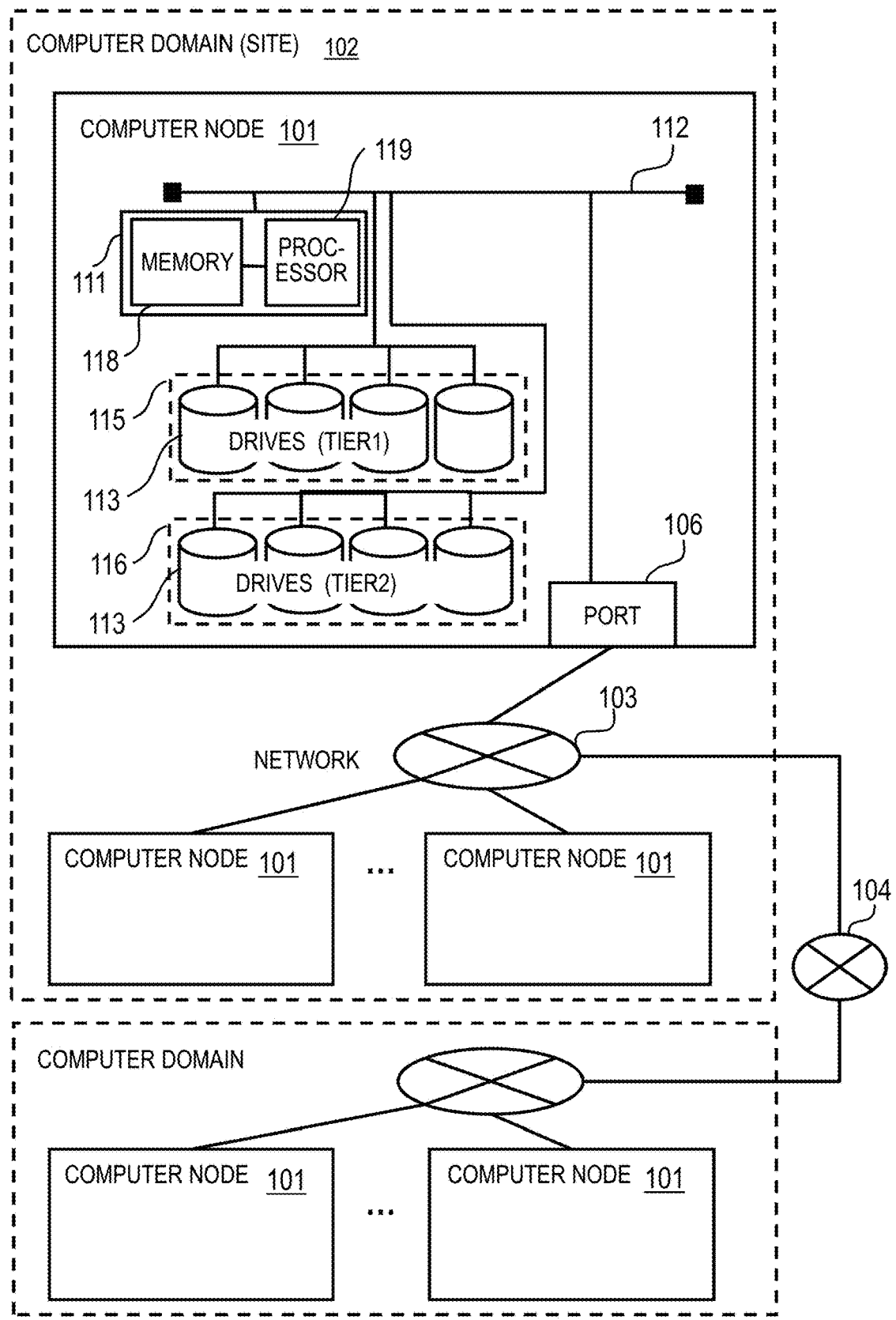
FIG. 3 illustrates an example of a system configuration of the distributed storage system.

FIG. 3 illustrates an example of a system configuration of the distributed storage system. Each node 101 may have a configuration of a common server computer. The hardware configuration of the node 101 is not specifically limited. A node 101 and other nodes 101 are connected by a network 103 through their own ports 106. The network 103 is configured with, for example, InfiniBand or Ethernet.

These plurality of nodes 101 form a domain 102. The domain 102 may be associated with a geographical area or the virtual or physical topology of the network 103. A network 104 connects a plurality of domains 102. In the following, the domains are assumed to be associated with geographically distant sites.

As to the internal configuration of each node 101, a port 106, a processor package 111, disk drives (hereinafter, also referred to as drives) 113 are connected by an internal network 112. The processor package 111 includes a memory 118 and a processor 119.

The memory 118 stores control information required for the processor 119 to process read and write commands and to implement storage functions and also stores cache data for the storage. The memory 118 further stores programs executed by the processor 119. The memory 118 may be a volatile DRAM or a non-volatile SCM (Storage Class Memory).

The drives 113 are configured with hard disk drives and SSDs (Solid State Drives) having an interface of, for example, FC (Fibre Channel), SAS (Serial Attached SCSI), or SATA (Serial Advanced Technology Attachment).

The drives 113 may be SCMs such as NAND, PRAM, and ReRAM, or otherwise volatile memories. In the case of using volatile memories, the storage device may be non-volatilized with a battery.

The aforementioned various kinds of drives have different capabilities. For example, SSDs are superior to HDDs in throughput capability. The node 101 includes different kinds of drives 113. The node 101 in this embodiment classifies different kinds of drives into groups of drives having similar capabilities to form tiers 115 and 116.

The relationship of tiers is defined in accordance with the capabilities of the tiers. The capabilities include access capability and fault tolerance capability. In the example described below, the access capabilities of the tiers go down from TIER1, TIER2 to TIER3 in this order. In the example described below, the drives in each tier are configured as a RAID. Although the number of tiers illustrated in FIG. 3 is two, the number of tiers depends on the design. A tier having high access capability may be used as a cache. A drive, a RAID, a tier, and groups of these are each a storage device.

Figure 4:
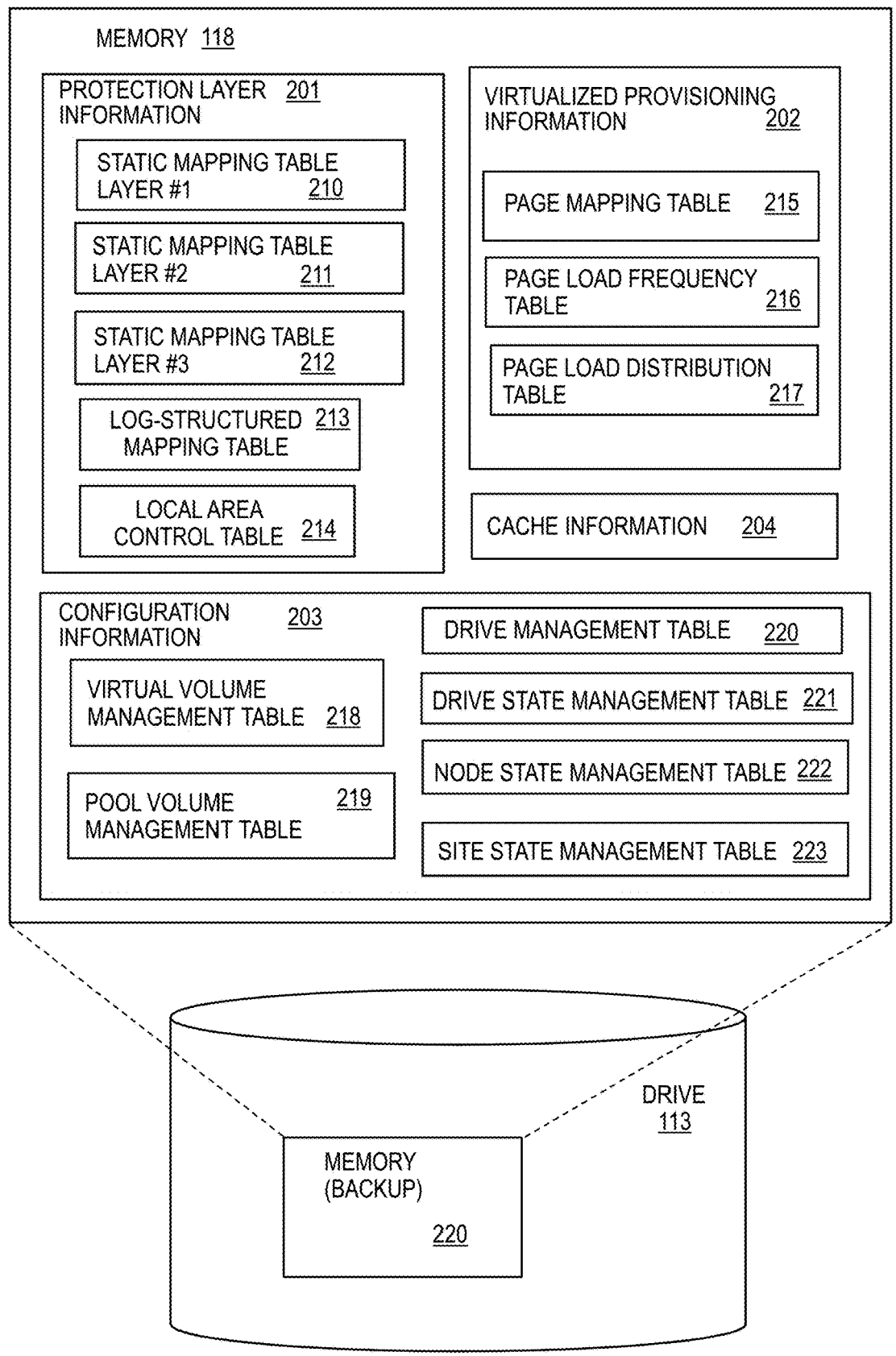
FIG. 4 illustrates information for controlling the distributed storage system.

FIG. 4 illustrates information for controlling the distributed storage system. The memory 118 stores programs including a storage program for implementing storage functions, an OS, and an interface program, in addition to the information shown in FIG. 4. The memory 118 may further store an application program for performing a service.

Protection layer information 201 is information related to data protection. Virtualized provisioning information 202 is information related to provisioning virtual volumes. Cache information 204 is information related to the cache 181. Configuration information 203 is information related to the configuration of the distributed storage system.

The protection layer information 201 includes static mapping tables 210, 211, and 212 for protection layer #1, protection layer #2, and protection layer #3, respectively. The protection layer information 201 further includes a log-structured mapping table 213 and a local area control table 214.

The virtualized provisioning information 202 includes a page mapping table 215, a page load frequency table 216, and a page load distribution table 217. The configuration information 203 includes a virtual volume management table 218, a pool volume management table 219, and a drive management table 220. The configuration information 203 further includes a drive state management table 221, a node state management table 222, and a site state management table 223.

A copy of all or part of the aforementioned information may be synchronously or asynchronously stored to the drives 113. Each node 101 may store the information for each pool. A pool is composed of one or more logical volumes. This logical volume is also referred to as pool volume. A pool has one or more tiers. In the example described below, a pool has three tiers. That is to say, a pool is composed of pool volumes of three tiers. The substance of a pool volume is storage areas of the drives 113. A pool volume can be allocated storage areas of drives of other nodes 101.

Hereinafter, examples of configurations of the tables indicating the information held by each node 101 are described. Each table shows only a part of the entries. In each table, the blank cells represent cells in which indication of data is omitted. In the cells of the tables, "0x" represents a hexadecimal number. Drive numbers are unique to a node and node numbers are unique to a site. Site numbers are unique to the system.

FIGS. 5A to 5F illustrate configuration examples of the tables indicating information included in the configuration information 203. FIGS. 5A to 5C indicate management information on different kinds of storage resources. FIG. 5A illustrates a configuration example of the virtual volume management table 218. The virtual volume management table 218 indicates information on virtual volumes.

In this example, the virtual volume management table 218 indicates information on the virtual volumes provided by the node 101 holding this information 218. The node 101 receives accesses to the virtual volumes the node 101 provides. The virtual volume management table 218 may hold information on the virtual volumes that are not owned by the node in case of occurrence of a failure.

The virtual volume management table 218 includes the size (capacity) of each virtual volume and a list of node numbers of the nodes (owner nodes) providing each virtual volume. Furthermore, it includes information indicating whether writing redundant codes in individual protection layers to the local storage device are synchronous or asynchronous with creating and writing the redundant codes. The size of a virtual volume is not the total size of the allocated logical pages but the virtual capacity (maximum size) of the virtual volume. The information indicating synchronous/asynchronous is provided for each protection layer.

FIG. 5B illustrates a configuration example of the pool volume management table 219. The pool volume management table 219 indicates information on pool volumes. In this example, the pool volume management table 219 indicates information on the pool volumes provided by the node 101 holding the information 219 and other nodes 101 in the pools the node 101 holding the information 219 belongs to. The pool volume management table 219 includes information on the size (capacity) of each pool volume and the node number of the node providing each pool volume.

FIG. 5C illustrates a configuration example of the drive management table 220. The drive management table 220 indicates the drives allocated to each pool volume. In this example, the drive management table 220 indicates information on the local drives 113 included in the node 101 holding the information 220.

The drive management table 220 includes information on the type of drives (such as SSD or NL-SAS drive), a set of numbers of striping drives (a set of drive numbers configured as a RAID group), and the sizes of the drives for each pool volume. If striping is not employed, a pool volume is allocated only one drive. It should be noted that different areas of one drive can be allocated to different pool volumes.

FIGS. 5D to 5F indicate management information on failures in the distributed storage system. The information is held by each node 101.

FIG. 5D illustrates a configuration example of the drive state management table 221. The drive state management table 221 indicates the states and error counts of individual local drives 113 in the node 101.

FIG. 5E illustrates a configuration example of the node state management table 222. The node state management table 222 indicates the states and error counts of the other nodes 101 in the local site 102. The local site 102 of a node 101 is the site 102 to which the node 101 belongs to. When the node 101 detects an error in communication with another node 101, it increments the error count.

FIG. 5F illustrates a configuration example of the site state management table 223. The site state management table 223 indicates the states and error counts of individual sites. This example is based on an assumption that the node 101 can communicate with only the representative nodes of the other sites 102. Accordingly, an error at a representative node 101 means the error in the site.

When the processor 119 of a node 101 detects an error in communications with the local drives 113 and other nodes 101, it increments error counts in the management information 221 to 223 of the node 101.

When the error count of some hardware resource (a drive, a node, or a site) reaches a first threshold, the processor 119 changes the state of the resource from a normal state to a warning state. Furthermore, when the error count reaches a second threshold, the processor 119 changes the state of the resource from the warning state to a failure state. The warning state and the failure state are abnormal states.

When a node 101 detects an abnormal state of some hardware resource, it notifies the other nodes 101 of the information. Specifically, the node 101 notifies all other nodes 101 in the local site 102 and the representative nodes 101 in the other sites 102. Each representative node 101 notifies the other nodes in the site 102 of the information. As a result, information on the hardware resource in the abnormal state can be shared among the nodes. Information on a drive in an abnormal state does not need to be shared among the nodes.

The nodes 101 may share the information on error counts. For example, when a node 101 detects an error in communications with another node or another site, it updates its own management information and broadcasts the updated information to the other nodes 101. A node 101 may determine a state based on the error counts in the other nodes 101 in addition to the error count in the node.

In the configuration where a node 101 communicates with the individual nodes 101 in the other sites 102, the node 101 may count the errors in communications with the nodes 101 in the other sites 102. The error count of a site may be the total sum of the error counts of all nodes in the site 102.

FIGS. 6A to 6C illustrate information included in the virtualized provisioning information 202. FIG. 6A illustrates a configuration example of the page mapping table 215. The page mapping table 215 holds correspondence relations between virtual pages in the virtual volumes and logical pages in the pool volumes.

In this example, the page mapping table 215 holds information on the virtual volumes provided by the node 101 holding the information 215. A virtual page may be allocated directly or indirectly through a later-described local pool volume 1303C to a logical page of a pool volume 1303B in a remote node 101. The page mapping table 215 indicates the relations between virtual pages and local pool volumes 1303C or pool volumes 1303B in the remote nodes.

The page mapping table 215 holds the start LBA (Logical Block Address) and the address range of the virtual page and the start LBA of the logical page of a pool volume corresponding to the start LBA of the virtual page, for each virtual page in individual virtual volumes.

FIG. 6B illustrates a configuration example of the page load frequency table 216. The page load frequency table 216 holds records of I/O frequency (access frequency) to virtual pages. Specifically, the page load frequency table 216 holds the start LBA and the address range of the virtual page and the access frequency to the area, for each virtual page in individual virtual volumes.

The page load frequency table 216 holds information on each virtual page allocated a logical page for storing user data (write data) from a pool volume. Accordingly, the page load frequency table 216 indicates the access frequencies to the logical pages allocated to the virtual pages. The page load frequency table 216 holds information on the virtual volumes provided by the node 101 holding the table 216. Furthermore, the page load frequency table 216 holds information on the accesses the node holding the table 216 receives from the same node or other nodes.

The information on access frequency may be acquired and managed by access source or may be acquired and managed separately depending on whether the access is a read access or a write access. The node 101 may acquire and manage the information on access frequency separately depending on whether the access is a sequential access or a random access, or may acquire and manage the information on access frequency with multiple time frames of monitoring periods.

FIG. 6C illustrates a configuration example of the page load distribution table 217. The page load distribution table 217 classifies the access frequencies of individual virtual pages into a plurality of levels and indicates a page amount for each level. That is to say, the page load distribution table 217 indicates distribution of page amounts to the levels of access frequency (I/O frequency). The page load distribution table 217 indicates the records of page load distribution.

Each node 101 holds page load distribution tables 217 for individual protection layers. Alternatively, one page load distribution table 217 may hold information on access frequencies to individual pages in the node, information on access frequencies to individual pages in all nodes in the site, and information on access frequencies to individual pages in all nodes in the plurality of sites in the system. The node 101 can create the page load distribution table 217 from the page load frequency tables 216 acquired from the same node or other nodes.

In an example where a plurality of nodes 101 provide one virtual volume, the plurality nodes 101 each receive an access to a same single virtual page. Accordingly, the total sum of the accesses to the single virtual page in all the owner nodes of the virtual volume represents all the accesses to the virtual page.

The page load distribution table 217 has a smaller amount of information compared to the page load frequency table 216 and basically does not depend on the storage capacity (the logical page amount) in the node 101. Accordingly, the page load distribution table 217 can be shared among a large number of nodes 101. Furthermore, the page load distribution information among the plurality of nodes 101, such as page load distribution information on the entire site or the entire system, can be created by adding the number of pages in the plurality of nodes 101 to each access frequency level. The page load distribution table 217 may be created by access source node 101.

The page load frequency table 216 is effective to be configured with two kinds of lists: a high-ranking list including more frequently accessed (high loaded) pages (using Lossy Count method, for example) and a list of access frequencies by storage area sections (page loads) obtained by dividing the storage area of a node or nodes by a specific number. In the case of only the high-ranking list of high-loaded pages, if the random loading range is wide as commonly observed in OLTP databases, the high-ranking list is saturated so that the pages to be included in the list cannot be included.

On the other hand, in the case of only the page load list by storage area sections, if the number of storage area sections is small because of the limitation to the memory, the section is so wide that the loads to the pages are leveled, even though a specific page is especially loaded high; the distinctions of the loads to the individual pages might be lost. Accordingly, it is effective to have these two kinds of lists together.

The node 101 may have history tables 216 and 217 by specific period (for example, one week). Although this example provides description based on the mapping table in a block storage (managed by LBA), the node 101 can have similar information with a commonly known file storage (such as NFS/CIFS: Network File System/Common Internet File System) or object storage (such as REST: Representation State Transfer).

In the file storage, management information may associate a page with a file or a small area obtained by dividing a file. In the object storage, management information may associate a page with an object or a small area obtained by dividing an object.

FIGS. 7A to 7C illustrate examples of static mapping tables in the protection layer information 201. Protection Layer number 1 is a protection layer in a node 101; each node 101 holds a node static mapping table 210 of the node 101. The drawing of the node static mapping table 210 is omitted. The tables of FIGS. 7A to 7C are held by, for example, a node 101 belonging to a site number 0 and having a node number 0.

FIG. 7A illustrates a configuration example of the static mapping table 211 of the protection layer number 2 (site). The site static mapping table 211 is information shared by the nodes 101 in a site 102. The site static mapping table 211 holds relations of each site stripe type number with the node numbers of data nodes for storing corresponding stripes (user data/write data) and the node numbers of redundant code nodes for storing redundant codes created from the stripes.

A site stripe type number is identification information for a stripe type in a site. The stripe type is a class of stripes; one or more redundant codes are created from a plurality of stripes in a stripe type. A stripe is a data unit having a predetermined size.

The method of determining the stripe type a stripe should belong to and the method of creating a redundant code will be described later. The stripe type number also represents a group of nodes 101 storing the user data and redundant codes included in the stripe type.

A redundant code is created from a plurality of stripes included in different data nodes belonging to a site stripe. In the example of FIG. 7A, two redundant codes are created and they are stored in different nodes 101. The number of redundant codes depends on the design. The plurality of redundant codes are created by, for example, erasure coding. The site static mapping table 211 may be shared among the sites, unless the memory or security is restricted.

In this example, one stripe belongs to a single site stripe type. As illustrated in FIG. 7A, the stripes stored in a node can belong to different stripe types. For example, in the example of FIG. 7A, a stripe stored in the node 0x00 belongs to a site stripe type 0x0000 and another stripe in the node 0x00 belongs to a site stripe type 0x0001.

FIGS. 7B and 7C illustrate configuration examples of a geo static mapping table 212A and a consistent hashing table 212B included in the static mapping table 212 for the protection layer number 3 (geo). The geo static mapping table 212A basically has the same configuration as the site static mapping table 211. The geo static mapping table 212A is shared among the sites.

The geo static mapping table 212A holds relations of each geo stripe type number with the site numbers of data sites allocated corresponding stripes and the site numbers of redundant code sites allocated redundant codes. One node 101 in each data site stores a stripe. One node 101 in each redundant code site stores a redundant code.

The consistent hashing table 212B indicates information for identifying a node 101 storing a redundant code in a redundant code site. Each site 102 holds a unique consistent hashing table 212B. The information in the consistent hashing table 212 is different among the sites.

The consistent hashing table 212B indicates relations of the node number of each node 101 in a redundant code site with the hash value in the case where the node 101 stores a redundant code (1) and the hash value in the case where the node 101 stores a redundant code (2). The hash value is calculated based on information on the transfer source transferred from another site 102 together with a stripe. The stripe is transferred to the node 101 associated with the calculated hash value and the destination node 101 creates and stores a redundant code.

The static mapping tables described with FIGS. 7A to 7C are changed when the place to store the user data (stripe) and the redundant codes are changed into a spare area at a failure of the node/site. They are also changed at increasing/decreasing a node or site.

The nodes 101 may share the same computing logic to uniquely change the static mapping tables with the information on the failed node/site. As a result, a node 101 does not need to multicast the static mapping tables after changing its own static mapping tables, achieving lower load to the network.

Predefining the nodes belonging to each stripe type with the static mapping tables achieves a redundant configuration appropriate for data recovery. Including data in a node into different stripe types and defining the number of stripe types the node belongs to increase the possibility of data recovery at a failure of the node. The method of using the site static mapping table 211 will be described later with reference to FIG. 11.

Figure 8:
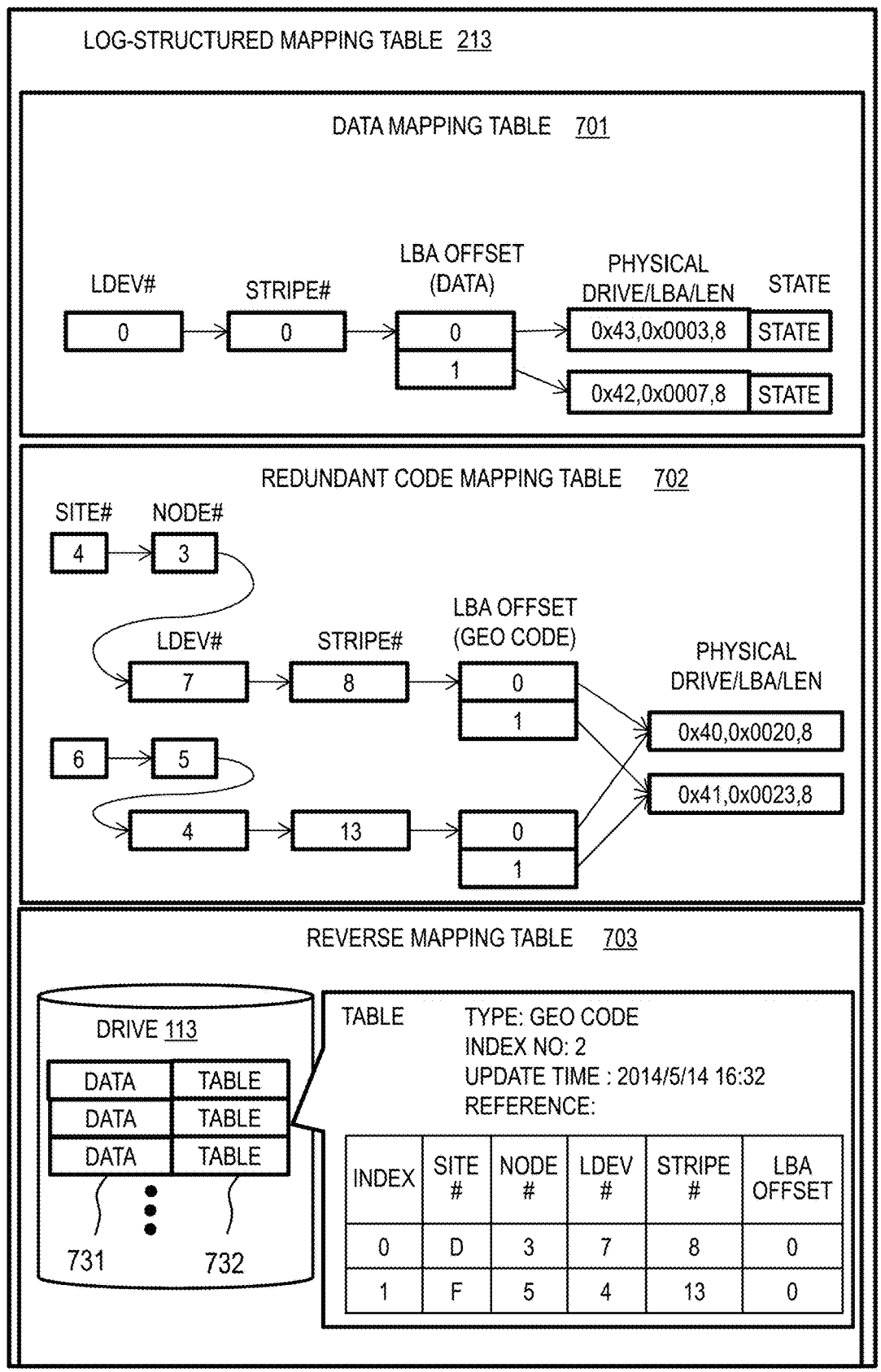
FIG. 8 illustrates a configuration example of a log-structured mapping table.

FIG. 8 illustrates a configuration example of the log-structured mapping table 213 in the protection layer information 201. In FIG. 8, the arrows represent pointers. The log-structured mapping table 213 includes a data mapping table 701, a redundant code mapping table 702, and a reverse mapping table 703.

The data mapping table 701 manages user data (stripes) that the node 101 holding the table 701 stores in its local storage device (drives 113). The node 101 can acquire the storage address (physical address) in the drives 113 (physical storage device) of a stripe from a pool volume-related storage address (logical address) of the stripe.

The data mapping table 701 associates the storage address (logical address) in the pool volume of user data (stripe) with the corresponding storage address (physical address) in the physical storage area of the drives 113.

The pool volume-related storage address of a stripe is specified with the LDEV number of the pool volume and the stripe number of the stripe, and further, each block of the stripe is specified with an LBA offset. The sizes of the stripes are uniform. A stripe number is calculated with, for example, a floor (LBA/Stripe Length). The storage address in the physical storage area is specified with a drive number, an LBA, and a data length.

In the example of FIG. 8, one stripe is separated and stored in two physical areas (blocks). The data mapping table 701 indicates that the data of an LDEV number 0, a stripe number 0, and an in-stripe LBA offset 0 is stored in an area of a drive number 0x43, an LBA 0x0003, and a data length 8. Furthermore, the data mapping table 701 indicates that the data of an LDEV number 0, a stripe number 0, and an in-stripe LBA offset 1 is stored in an area of a drive number 0x42, an LBA 0x0007, and a data length 8.

The physical storage area further stores information indicating the state of the stored data. The state information indicates whether the data has been copied (transferred) to the associated redundant code node. As will be described later, write data (a stripe) is transferred to the redundant code node for creation of a redundant code synchronously or asynchronously with host write of the write data (stripe) in accordance with the setting of SYNC/ASYNC.

The redundant code mapping table 702 manages redundant codes the node 101 holding the table 702 stores in its local storage device (drives 113). The redundant codes to be managed include inter-site redundant codes (geo redundant codes R), in-site redundant codes (site redundant codes Q), and in-node redundant codes (node redundant codes P). The node 101 can acquire the physical address of the redundant code of a stripe from the pool volume-related logical address of the stripe.

The redundant code mapping table 702 associates the pool volume-related logical addresses of the stripes used to create a redundant code with a physical address of the redundant code in a physical storage area of the local drives 113 (local storage device). A redundant code is created by operations (for example, xor) on a plurality of stripes. Accordingly, the physical address of a redundant code is associated with logical addresses of a plurality of stripes.

FIG. 8 illustrates an example that creates one redundant code from two stripes. In the example of FIG. 8, the redundant code mapping table 702 indicates a relation between the physical address of one geo redundant code and the logical addresses of two stripes used to create the geo redundant code. The logical address of a stripe is indicated by the identifiers of a site, node, and a pool volume and an address in the volume. The geo redundant code is separated and stored in two address areas (blocks) in the physical storage area.

For example, a block of a geo redundant code created from a block of the site number 4, node number 3, LDEV number 7, stripe number 8, and LBA offset 0 and a block of the site number 6, node number 5, LDEV number 4, stripe number 13, and LBA offset 0 is stored in the area of the drive number 0x40, LBA 0x0020, and data length 8.

The distributed storage system in this example stores data in accordance with log-structured scheme. In updating data at a logical address with new data, the log-structured scheme updates data at a physical address by adding new data to a new physical address instead of replacing the data with new data. Unnecessary data is deleted as appropriate. The log-structured scheme does not require data retrieval to update a node redundant code P, achieving reduction in time to write to the drives 113. The distributed storage system does not need to implement the log-structured scheme.

Accordingly, for data at a logical address, old data and new data can be stored in physical storage areas. The log-structured mapping table 213 holds information on relations of logical addresses with physical addresses of the latest data, and in addition, information on relations of logical addresses with physical addresses of old data and management information on generations of data. Management information on generations of a redundant code created from a plurality of stripes indicates information on generations of the stripes used to create the redundant code.

The data mapping table 701 and the redundant code mapping table 702 may further include data guarantee codes (such as write sequence numbers and CRCs). This information enables checking data integrity by referring to the information in the mapping table only once at address conversion.

The reverse mapping table 703 is a reverse conversion table of the above-described tables 701 and 702. That is to say, the reverse mapping table is referred to in order to convert an address of a physical area into a pool volume-related address. The reverse mapping table 703 includes tables 732 indicating logical addresses corresponding to individual address areas 731 holding data in the physical area.

Each of the tables 732 includes a type of data (stripe/geo code/site code/node code), the number of indices (the number of references), an update time, and references (each including information on the corresponding area in a pool volume, a site number, a node number, and the like).

For example, FIG. 8 shows information on logical addresses associated with a physical address storing a geo redundant code by way of example. This example corresponds to the example of the geo code mapping table 702 in FIG. 8. The data type is geo redundant code and the number of indices is 2. This means two stripes are used to create the geo redundant code.

Each reference indicates the logical address storing a stripe used to create the geo redundant code. The logical address is indicated by a site number, a node number, an LDEV number, a stripe number, and an LBA offset.

As described above, managing the addresses of the transfer sources of the stripes to create a redundant code in association with the physical address of the redundant code enables appropriate management of redundant codes of various combinations of stripes.

If the drives 113 include non-volatile media, the node may add update information to the reverse mapping table 703 synchronously with writing user data to the drives. This arrangement enables data recovery at an accidental power down. Alternatively, the node 101 may store the update information in the memory 118 and update the reverse mapping table 703 in the drives 113 asynchronously with writing user data to the drives. To enable data recovery at an accidental power down, the reverse mapping table 703 may hold write sequence numbers. The reverse mapping table 703 may hold information on old data in addition to information on the latest data.

Figure 9:
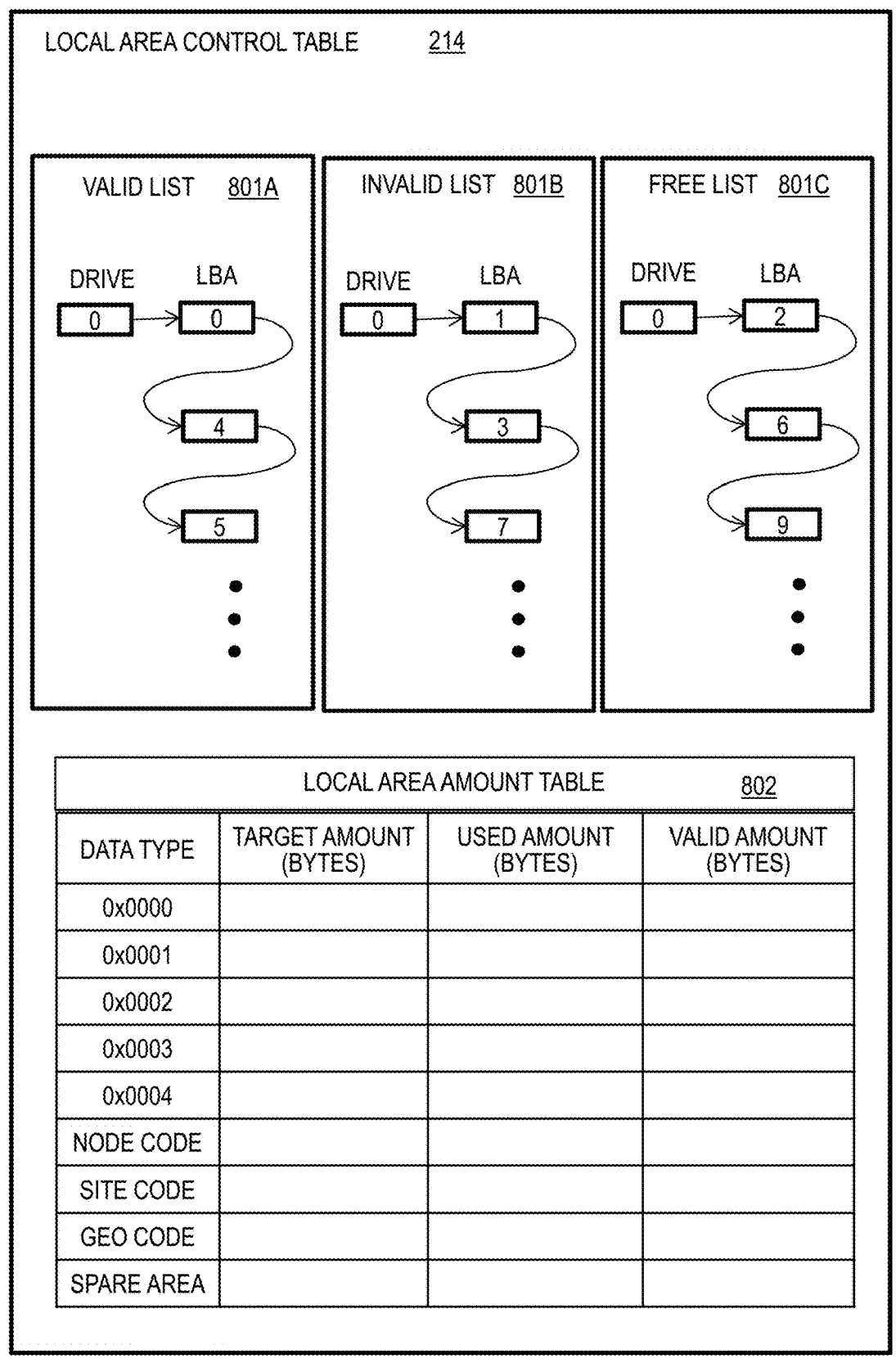
FIG. 9 illustrates a configuration example of a local area control table 214.

FIG. 9 illustrates a configuration example of the local area control table 214. In FIG. 9, arrows represent pointers. The local area control table 214 includes a valid list 801A, an invalid list 801B, a free list 801C, and a local area amount table 802. The local area control table 214 manages the areas of the drives 113 in a node 101. The arrows in the lists 801A to 801C represent pointers. In the lists 801A to 801C, each area is indicated with a drive number and an LBA in the drive.

The valid list 801A is a list of valid areas. A valid area is an area storing latest user data or a latest redundant code. In the example of FIG. 9, the blocks at LBAs 0, 4, and 5 in the drive 113 of a drive number 0 each store valid data.

The invalid list 801B is a list of invalid areas. An invalid area is an area for storing old user data or an old redundant code. An old and invalid redundant code is a redundant code for which all the stripes used to create the redundant code are invalid. In the example of FIG. 9, the blocks at LBAs 1, 3, and 7 in the drive 113 of a drive number 0 each store invalid data. The free list 801C is a list of unused areas.

The local area amount table 802 manages the target amounts of area to use, the amounts of area actually in use, and the amounts of valid area for the individual stripe types, the node redundant codes, the site redundant codes, the geo redundant codes, and the spare area. Each node 101 holds the local area amount table 802 for each tier. Each entry of the local area amount table 802 may indicate the total amount of all tiers. Separately managing the amounts for the stripe types and redundant codes enables appropriate control of the amounts for the individual types of data. The processor 119 updates the local area control table 214 synchronously or asynchronously with a host I/O.

For example, the local area amount table 802 holds entries of only the stripe types the node 101 belongs to. Alternatively, the local area amount table 802 may include entries for the data of stripe types the node 101 does not belong to in order to manage the amount of area used for the data transferred from other nodes 101.

Figure 10:
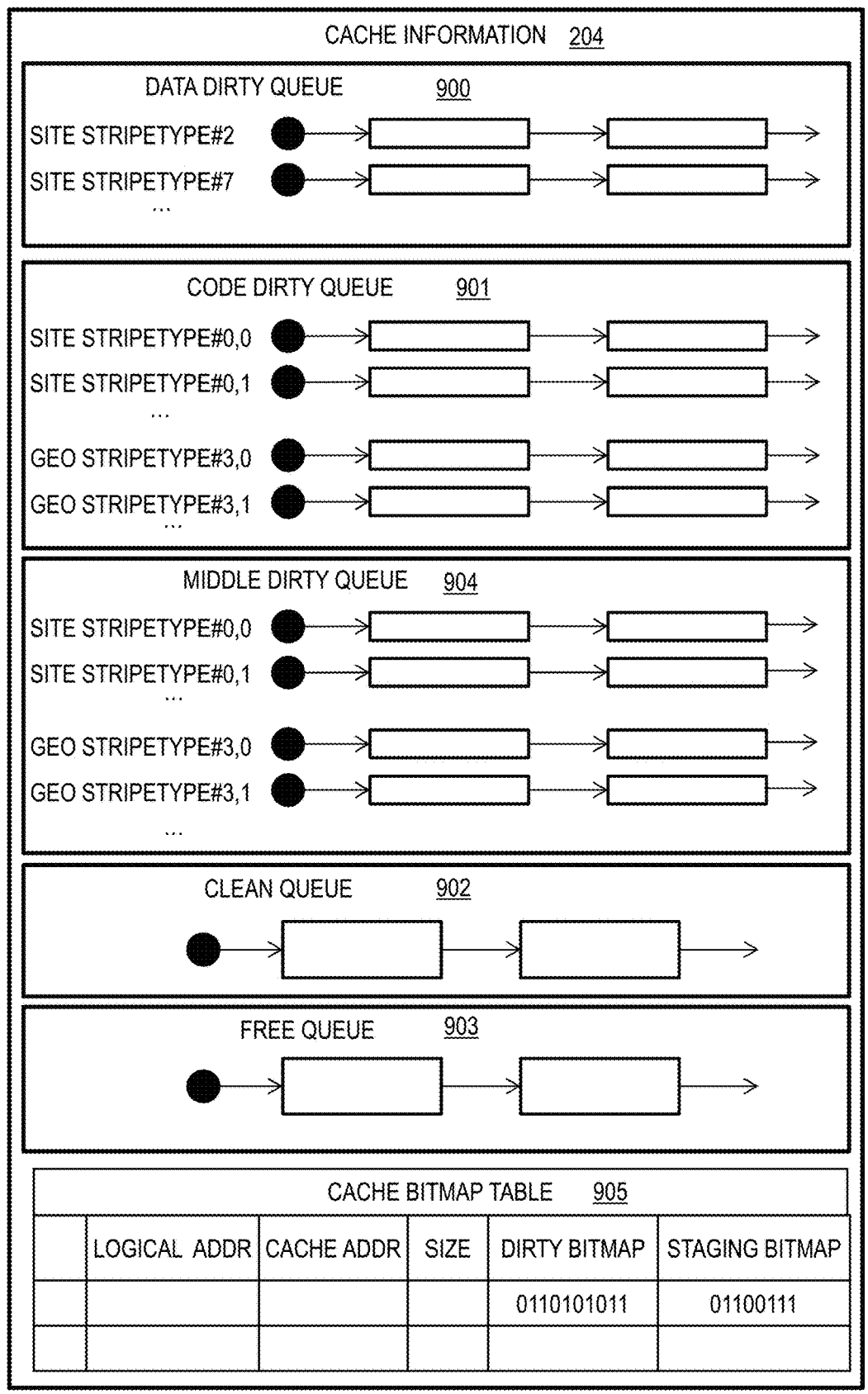
FIG. 10 illustrates an example of cache information.

FIG. 10 illustrates an example of cache information 204. Each node holds unique cache information 204. The cache information 204 includes data dirty queues 900, code dirty queues 901, a clean queue 902, a free queue 903, and middle dirty queues 904. The dirty queues 900, 901, and 904 indicate data in the cache 181 which has not been reflected to the drives 113.

Each cell in a queue represents an entry; information in an entry corresponds to information in a cache bitmap table 905 and the entry stores information selected from the cache bitmap table 905. The arrows in a queue represent pointers connecting entries. Filled circles represent start points.

The data dirty queues 900 indicate write data (stripes) of hosts to be stored to the local drives 113. Each entry of write data belongs to one of the site stripe types. The data dirty queues 900 are the queues of individual site stripe types to which the node 101 belongs as a data node.

The code dirty queues 901 indicate stripes to create redundant codes that are included in the cache 181 and have not been reflected to the drives 113. The stripes and the redundant codes created from the stripes are dirty data.

The code dirty queues 901 include queues for the stripes received from other nodes to create redundant codes. Since the node 101 belongs to a plurality of protection layers, queues for different stripe types of different protection layers are prepared. The example of FIG. 10 shows queues for the site stripe type and the geo stripe type. Dirty queues of individual combinations of different stripe types and different data locations (nodes) are used.

Each queue represents a list of data which belongs to an associated stripe type and is to be stored to a physical area in an associated node. The queue of SITE STRIPETYPE #0, 0 is a queue for the data which belongs to the site stripe of a site stripe type number 0 and is to be stored to the node of a node number 0.

The middle dirty queues 904 are intermediate codes in the cache 181 that have not been reflected to the drives 113. An intermediate code is data created from a new stripe and an old stripe. For example, it is an xor of the new stripe and the old stripe. The intermediate code is difference data between the new stripe and the old stripe; a node 101 can update a redundant code of old stripes stored in the drives 113 to a redundant code of new stripes using the intermediate code. Details of using the intermediate code will be described later.

The configuration of the middle dirty queues 904 is the same as the queues for redundant codes in the code dirty queues 901. That is to say, in this example, queues for individual combinations of different stripe types and different data locations (nodes) are used. Since a node 101 belongs to a plurality of protection layers, queues for different stripe types of different protection layers are prepared. The example of FIG. 10 shows queues of site stripe types and geo stripe types.

The clean queue 902 represents data in the cache 181 that has been reflected to the drives 113. The free queue 903 represents the unused area in the cache 181.

The cache bitmap table 905 includes logical addresses, cache addresses (locations on the memory), and sizes of data, and further, dirty bitmaps and staging bitmaps. For example, one entry indicates information on one slot having a specific size in the cache 181.

A logical address corresponds to the logical address of a stripe described with reference to FIG. 8. The logical address of a stripe transferred from another node 101 includes, for example, a site number, a node number, an LDEV number, and an LBA offset. A dirty bitmap indicates which part of the corresponding area is dirty. A staging bitmap indicates which part of the corresponding area has been staged to the cache 181. For example, one bit corresponds to one block in the drives 113.

Figure 11:
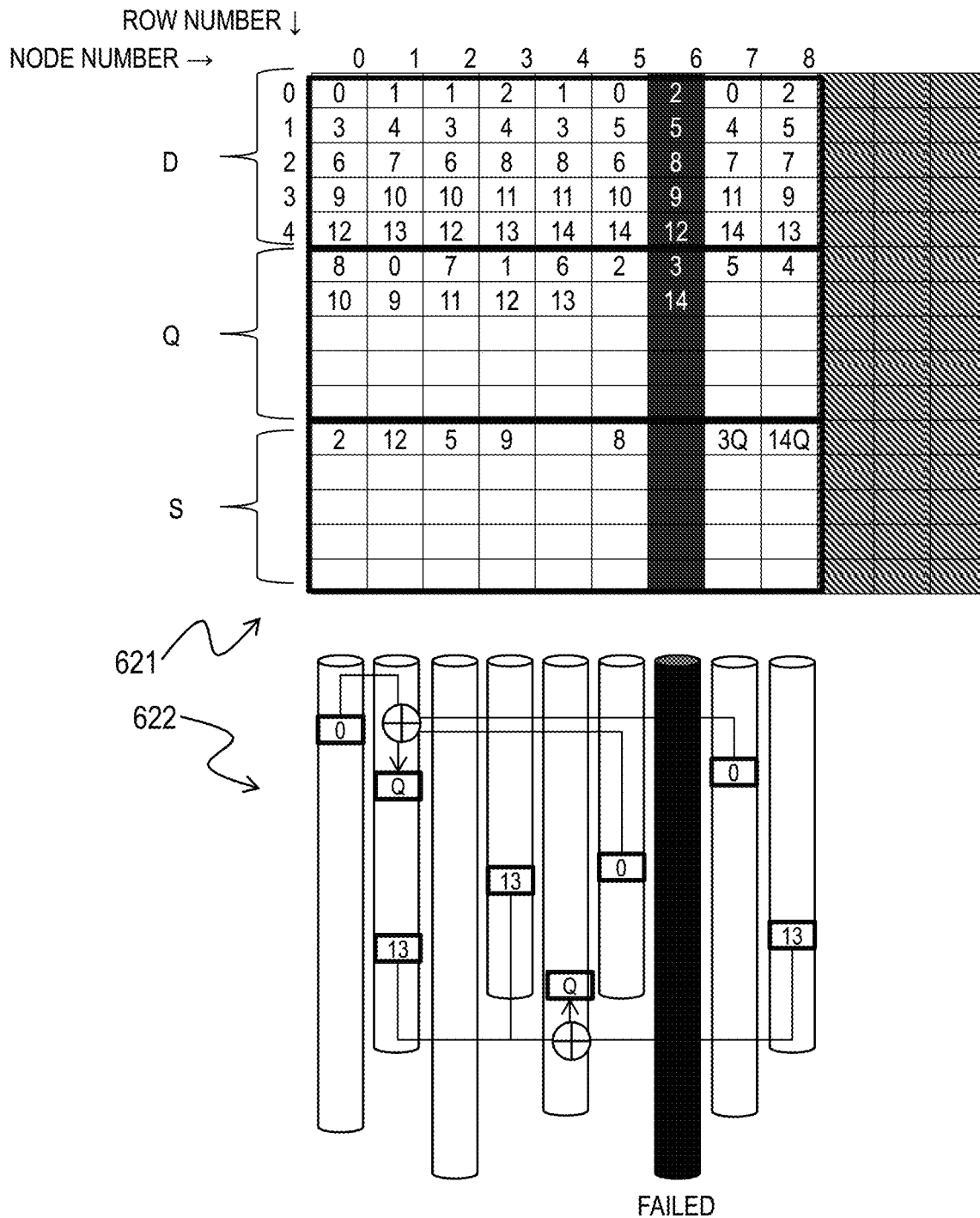
FIG. 11 illustrates a mapping image of the site protection layer.

FIG. 11 illustrates a mapping image of the site protection layer (layer number 2). Basically, this mapping image applies to the node protection layer (Layer number 1) and the geo protection layer (Layer number 3). In the following, the number of stripe types per cycle is denoted by c, the number of redundant codes (the number of parities) is denoted by p, the number of stripes (the number of data units) is denoted by d.

In the example of FIG. 11, the number of stripe types per cycle is 5, the number of redundant codes is 1, and the number of stripes is 3. Specifically, in one site stripe type, one redundant code is created from three stripes at maximum and stored in a node of the same site stripe type. As will be described later, a redundant code is created from 3 or less stripes. If a plurality of redundant codes are created, they are distributed and stored to different redundant code nodes.

The table 621 shows data nodes and redundant code nodes of stripe types. Individual columns correspond to nodes of node numbers 0 to 8. The cylinders 622 represent the physical storage areas of the nodes of node numbers 0 to 8 and the heights of the cylinders 622 represent the capacities of their storage areas.

In the table 621, the numerals in the cells indicate stripe type numbers. Each cell in the section D indicates the stripe type number the data node belongs to. Each cell in the section Q indicates the stripe type number the redundant code node belongs to.

Each cell in the section S indicates the stripe type number the spare node belongs to and the type (stripe/redundant code) of data to be stored. A spare node is a node to temporarily store the data of a failed node to recover the redundancy level at a node failure.

The stripe type number of write data is determined by the stripe number of the write data and the node number of the node to receive and store the write data. Specifically, the node 101 determines a stripe number by (the value of the logical address of the write data÷stripe size). In this example, the logical address is a logical address in a pool volume. Alternatively, it may be a logical address in a virtual volume. Furthermore, the node 101 calculates the row number of the write data by (stripe number mod c).

The node 101 determines a stripe type number from its own node number and the calculated row number with reference to the site static mapping table 211 for Layer number 2. For example, the node 101 selects entries including its own node number as a data node sequentially from the top of the site static mapping table 211 and determines the site stripe type number of the entry whose selection number matches the row number to be the site stripe type number of the write data.

The node 101 further determines the redundant code node of the write stripe type the stripe belongs to with reference to the site static mapping table 211 for Layer number 2. This will be described later in description of write processing.

For example, in FIG. 11, the stripes of row number 0 in the nodes of node numbers 0, 5, and 7 belong to a stripe type of stripe type number 0. The stripes of row number 4 in the nodes of node numbers 1, 3, and 8 belong to a stripe type of stripe type number 13.

Furthermore, the redundant code node belonging to the stripe type of stripe type number 0 is a node of node number 1 and the redundant code node belonging to the stripe type of stripe type number 13 is a node of node number 4. Some of the nodes store redundant codes of a plurality of stripe types.

In the example of FIG. 11, the distribution of stripes in section D is equal. The number of data nodes per stripe type may be different depending on the storage capacities of individual nodes. If the total number of nodes is small or a fraction is generated, the redundant codes for a part of the stripe types may be less than the others. Different stripe types may use different algorithms to implement redundancy.

A redundant code node of a stripe type is selected from the nodes different from the data nodes of the stripe type. Data writes from data nodes concentrate onto the redundant code node. Accordingly, the redundant code node is selected so that redundant codes will be distributed as equally as possible. As a result, the lives of the nodes 101 are equalized. This is effective especially in the case where the drives 113 are SSDs. When the lives of the nodes are unequal, the distribution of redundant code Q may be varied for equalization.

A spare node is a temporal storage to recover the redundancy level at an occurrence of a node failure. The spare node to store a redundant code is selected from the nodes other than the data nodes of the same stripe type. In the example of FIG. 11, a failure occurs in the node of node number 6. The spare node associated with the stripe type number of a stripe or a redundant code temporarily stores the corresponding stripe or redundant code.

For example, the node of node number 0 stores the stripe of stripe type number 2 stored in the node of node number 6. The node of node number 7 stores the redundant code Q of stripe type number 3 stored in the node of node number 6. Data restoration is performed by the node to store the data or a different node. The data (stripes and redundant codes) stored in the spare nodes are returned to one node when the node has recovered or added.

In the above-described example, the stripe type is determined independently from the LDEV number in the pool volume and depending on the address in the pool volume. The data at the same in-volume address located in different pool volumes belongs to the same stripe type. The address area of a pool volume is classified to a plurality of stripe types. As will be described later, a redundant code node selects an appropriate number of appropriate stripes from the stripes of the same stripe type and creates a redundant code from the selected stripes, independently from the in-volume address of the stripe.

Figure 12A:
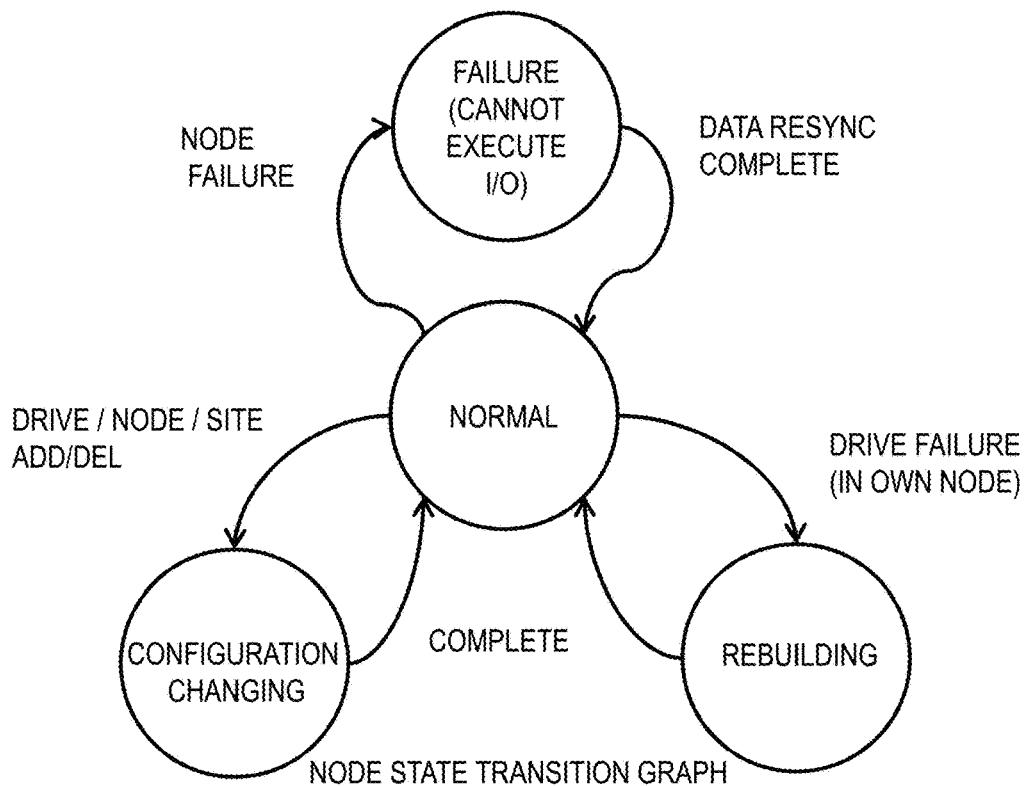
FIG. 12A illustrates state transitions of a node in the distributed storage system.
Figure 12B:
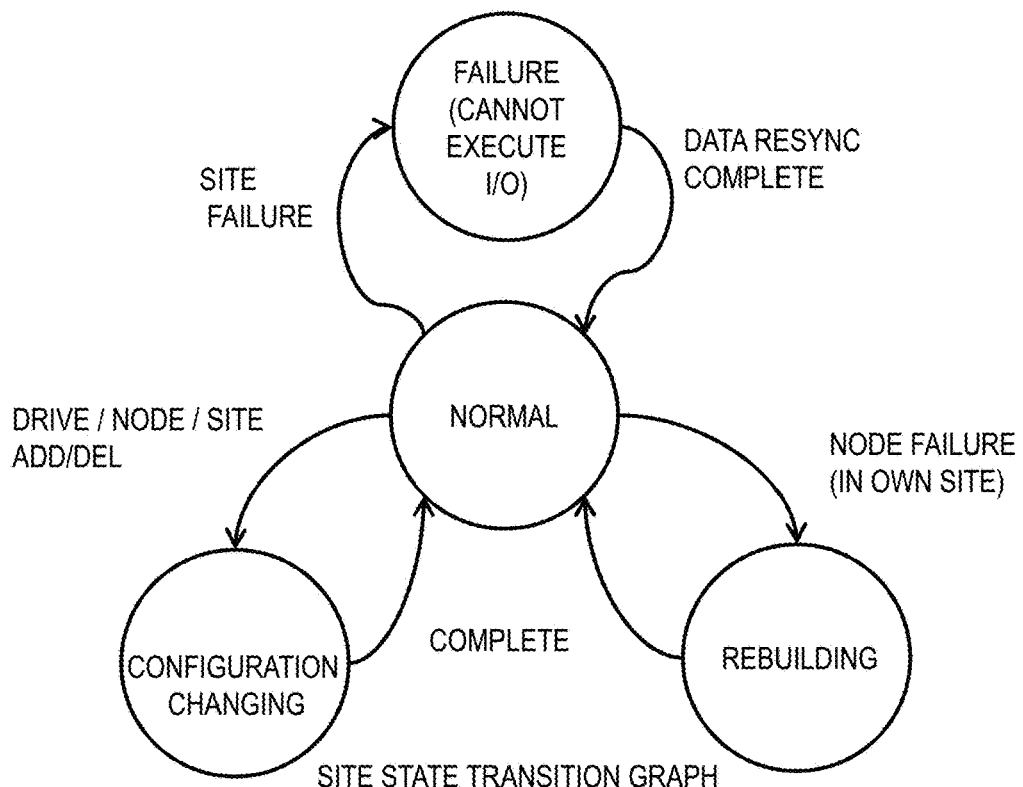
FIG. 12B illustrates state transitions of a site in the distributed storage system.

FIG. 12A illustrates state transitions of a node 101 in the distributed storage system. FIG. 12B illustrates state transitions of a site 102 in the distributed storage system. Basically, state transitions in each protection layer are the same.

A normal state is an initial state or a normal state in operation. The state changes to a rebuilding state when a drive failure occurs. In the rebuilding state, the node 101 can receive I/Os of applications by correction read/write.

In a failure state, the node 101 is down and cannot execute I/O. However, the drives 113 may not be failed. In that case, data can be restored by data resynchronization that reflects only the data newly written to the node 101 after the occurrence of a failure in the node 101, allowing the state to change from the failure state to a normal state.

Figure 13:
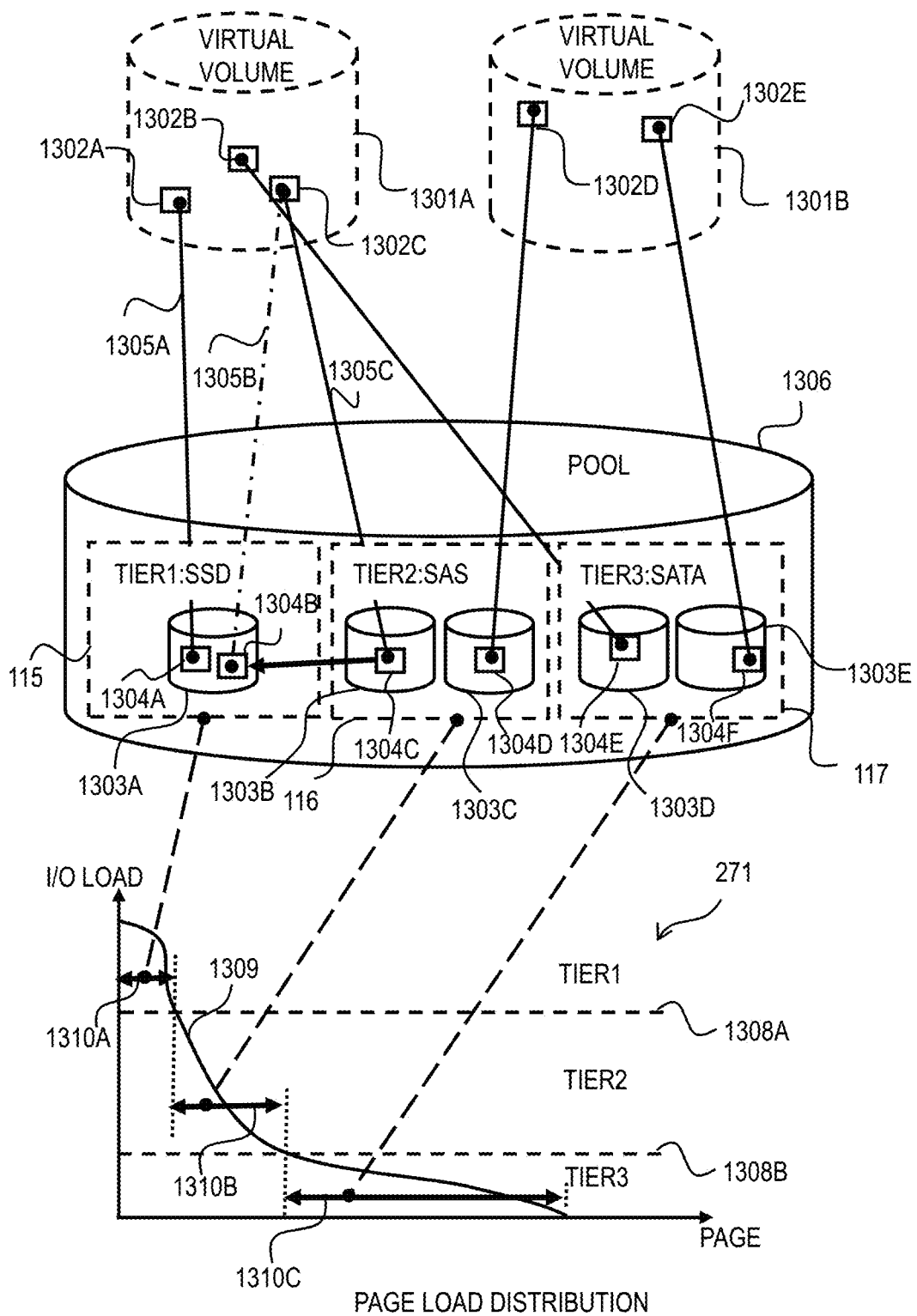
FIG. 13 illustrates an example of the logical configuration of a virtual provisioning layer in a node of the distributed storage system.

FIG. 13 illustrates an example of the logical configuration of a virtual provisioning layer in a node 101 of the distributed storage system. Virtual volumes 1301A and 1301B are virtual storage areas recognized by the hosts (the same node and the other nodes) and volumes to be a target when a read command or a write command is issued by a host.

A pool 1306 is composed of one or more pool volumes. In the example of FIG. 13, the pool 1306 includes pool volumes 1303A to 1303E. The pool 1306 may include pool volumes of other nodes. The pool volumes 1303A to 1303E are composed of the storage areas of the drives 113. Specifically, the processor 119 manages correspondence relations of logical addresses of pool volumes and physical addresses of the drives 113 to configure logical pool volumes. Details will be described later.

The storage administrator can create a plurality of virtual volumes in the pool 1306 through an instruction to the processor 119 via the input and output devices. The processor 119 allocates a physical storage area from the pool 1306 only to the virtual volume storage area for which a write command is issued.

In the example of FIG. 13, the virtual volume 1301A includes virtual pages 1302A, 1302B, and 1302C, which are allocated logical pages 1304A, 1304E, and 1304C, respectively. The virtual volume 1301B includes virtual pages 1302D and 1302E, which are allocated logical pages 1304D and 1304F, respectively.

Logical pages are dynamically allocated to virtual pages. For example, when a write command is issued for the virtual page 1302A in the virtual volume 1301A for the first time, the processor 119 associates the virtual page 1302A with an unused area (logical page 1304A) in the pool volume 1303A (association 1305A). For the next read/write command for the same page, the processor 119 executes I/O processing to the logical page 1304A in the pool volume 1303A based on the association 1305A.

The above-described operation can show the host as if the node 101 executes I/O processing (access processing) to the virtual volume. Allocating an area of a pool volume only to the area to be used by employing virtual volumes efficiently utilizes the limited storage area. When all the data in the logical page allocated to a virtual page is erased, the processor 119 cancels the association of the logical page with the virtual page to manage the logical page as a free page. As a result, the limited storage area can be utilized more efficiently.

The pool 1306 is formed of a plurality of tiers 115, 116, and 117. In this example, the pool 1306 has three tiers: an SSD tier 115 (TIER1), a SAS tier 116 (TIER2), and a SATA tier 117 (TIER3). The SSD tier 115 has the highest capability and the SATA tier 117 has the lowest. The pool volumes are classified into the tiers 115, 116, and 117 and the pool volumes belong to one of the tiers. The pool volume 1303A belongs to the tier 115; the pool volumes 1303B and 1303C belong to the tier 116; and the pool volumes 1303D and 1303E belong to the tier 117.

Each virtual page has characteristics related to I/O processing from hosts. For example, there are virtual pages having higher I/O frequency (access frequency) and virtual pages having lower I/O frequency. This characteristic is called access locality. Allocating the virtual pages having higher I/O frequency to a higher-class tier, that is to say, allocating the virtual pages having higher I/O frequency to logical pages of the higher-class tier improves the performance of the entire system. When a virtual page is allocated to a logical page of some tier, it could be expressed that the virtual page is allocated to the tier or that the virtual page is allocated to a pool volume.

For example, assume that the pool 1306 has an SSD tier 115 capable of 100 IOPS and an SAS tier 116 capable of 10 IOPS and that a virtual page 1302A having a characteristic of 20 IOPS is allocated to the SSD tier 115 and a virtual page 1302C having a characteristic of 50 IOPS is allocated to the SAS tier 116. Since the SAS tier 116 can show the performance of only 10 IOPS at maximum, the node 101 can show the performance of only 10+20=30 IOPS as a whole. This state is called a neck state.

If the allocation of the virtual page 1302C can be promoted from the SAS tier 116 to the SSD tier 115, the node 101 can show the performance of 50+20=70 IOPS as a whole. In this way, the overall performance of the system can be improved by allocating virtual pages having higher I/O frequency to a higher-class tier.

The aforementioned promotion copies the data in the logical page 1304C to an unused logical page 1304B and changes the association (1305C) of the virtual page 1302C with the logical page 1304C to an association (1305B) of the virtual page 1302C with the logical page 1304B. Page demotion is also available in the same way.

The graph 271 shows distribution of I/O frequency (I/O load) to the pages. The processor 119 can create load distribution data to provide this graph 271 from the page load distribution table 217. The distribution curve 1309 is a curve representing I/Os for individual pages when the pages are sorted in descending order of I/O frequency. That is to say, pages having more I/Os are located on the left side and pages having less I/Os are located on the right side. Tier allocation thresholds 1308A and 1308B are thresholds to determine which page having which I/O frequency to be allocated to which tier.

As described above, the overall performance of the system can be improved by allocating pages with higher I/O frequency to a higher-class tier. Accordingly, the virtual pages can be allocated in order of I/O frequency, from the highest I/O frequency to the highest-class tier to the lowest I/O frequency to the lowest-class tier. While the page load distribution 271 has not been created since the start-up of the storage system, the tier allocation thresholds 1308A and 1308B may take initial values at 0, for example.

For example, the processor 119 allocates the pages included in the page range 1310A from the intersection of the tier allocation threshold 1308A and the distribution line 1309 to the page having the highest I/O frequency to the SSD tier 115. The processor 119 allocates the pages included in the page range 1310B between the intersection of the tier allocation threshold 1308A and the distribution line 1309 and the intersection of the tier allocation threshold 1308B and the distribution line 1309 to the SAS tier 116. The processor 119 allocates the pages included in the page range 1310C between the intersection of the tier allocation threshold 1308B and the distribution line 1309 and the page having the lowest I/O frequency to the SATA tier 116.

The storage administrator may specify the values of the tier allocation thresholds 1380A and 1308B or alternatively, the processor 119 may calculate the values for the tier allocation thresholds 1380A and 1308B. For example, the processor 119 may determine a tier allocation threshold for defining the tier based on the I/O frequency distribution to the virtual pages, the capacity of the tier, and the drive capability of the tier. The drive capability of a tier is predefined in accordance with, for example, the I/O data amount per unit time in the tier.

Figure 14:
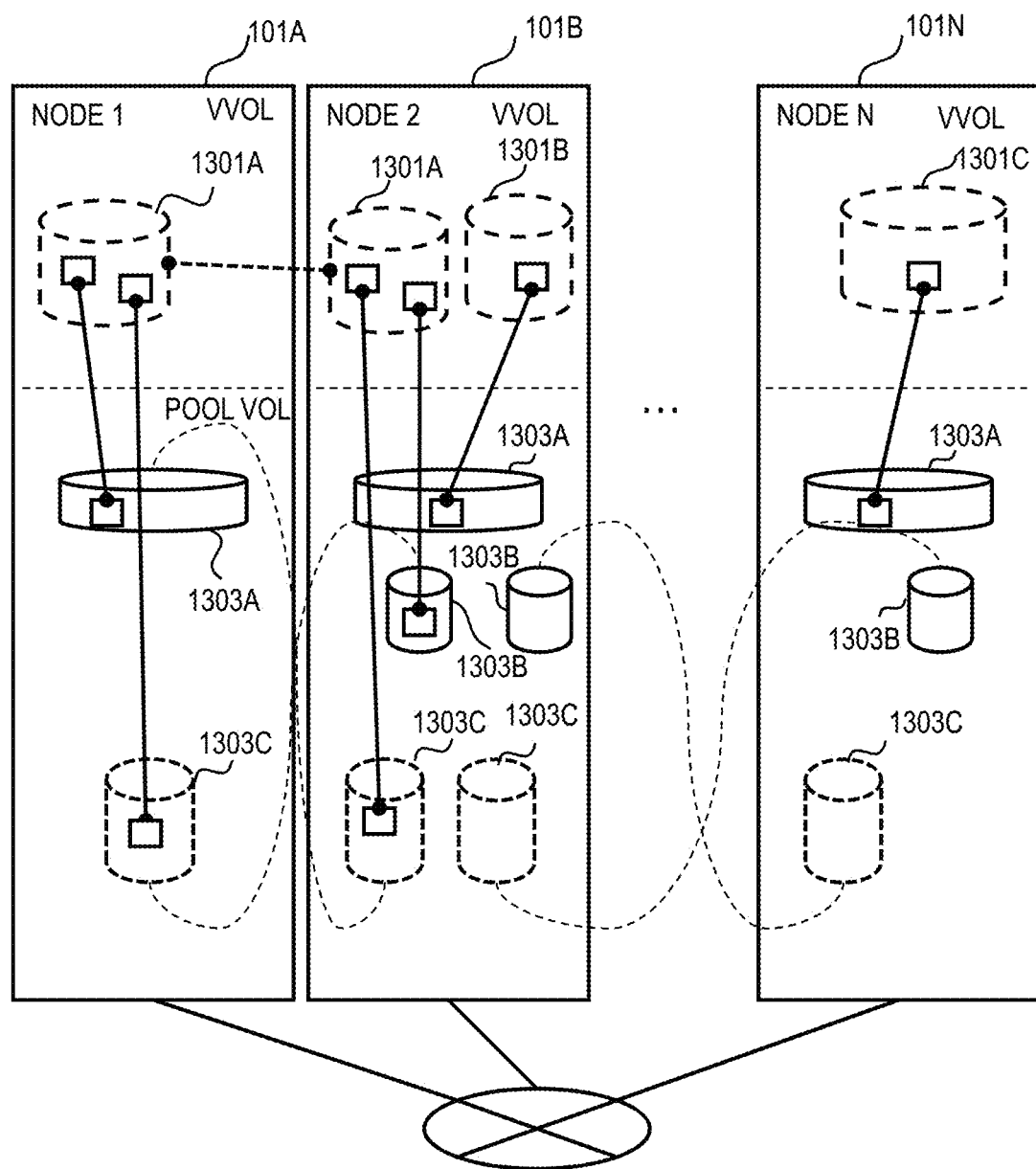
FIG. 14 illustrates an example of page mapping in a plurality nodes in the distributed storage system.

FIG. 14 illustrates an example of page mapping in a plurality of nodes in the distributed storage system. In FIG. 14, the distributed storage system provides virtual volumes 1301A to 1301C. The node 101A provides the virtual volume 1301A; the node 101B provides virtual volumes 1301A and 1301B; and the node 101N provides a virtual volume 1301C.

A node 101 (any one of the nodes 101A to 101N) can hold two types of volumes. One type is pool volume 1303A created from storage areas of the local drives 113. The data to be stored in a pool volume 1303A is placed to the local drive 113.

The other type is volume 1303C straightly mapped to a pool volume 1303B in a remote node 101. A volume 1303C is managed as a pool volume. The node 101 can perform I/O processing on the remote pool volume 1303B through the pool volume 1303C.

This capability is known as storage external connection. The node 101 converts the accessing address in the volume 1303C to the address in the remote pool volume 1303B to send a command to the remote node 101. The node 101 holds a not-shown address mapping table between the pool volume 1303C in the local node and the remote pool volume 1303B in the remote node.

The processor 119 maps virtual pages more frequently accessed directly by hosts to its own pool volume 1303A and maps virtual pages more frequently accessed by hosts via a remote node 101 to the remote pool volume 1303B. Such arrangement can reduce the response time to the hosts. The data in the virtual pages allocated to the remote pool volume 1303B is stored in the remote drives 113.

Each node 101 selects the number of pool volumes to be mapped to the remote nodes and virtual pages to be allocated to remote pool volumes based on the network capability and the capabilities of the local drives of the individual tiers, and allocates logical pages so as to prevent bottle neck in the network. Details of this allocation will be described later with reference to FIGS. 23, 24A, and 24B.

The distributed storage system may consolidate the management of the storage capacity and increase or decrease the pool volumes in individual nodes 101 depending on the amount of used pages in the virtual volume. A node 101 may use a pool volume 1303A as a virtual volume by straight mapping. This arrangement reduces the amount of memory used for the mapping table, improving the performance and the availability.

Figure 15:
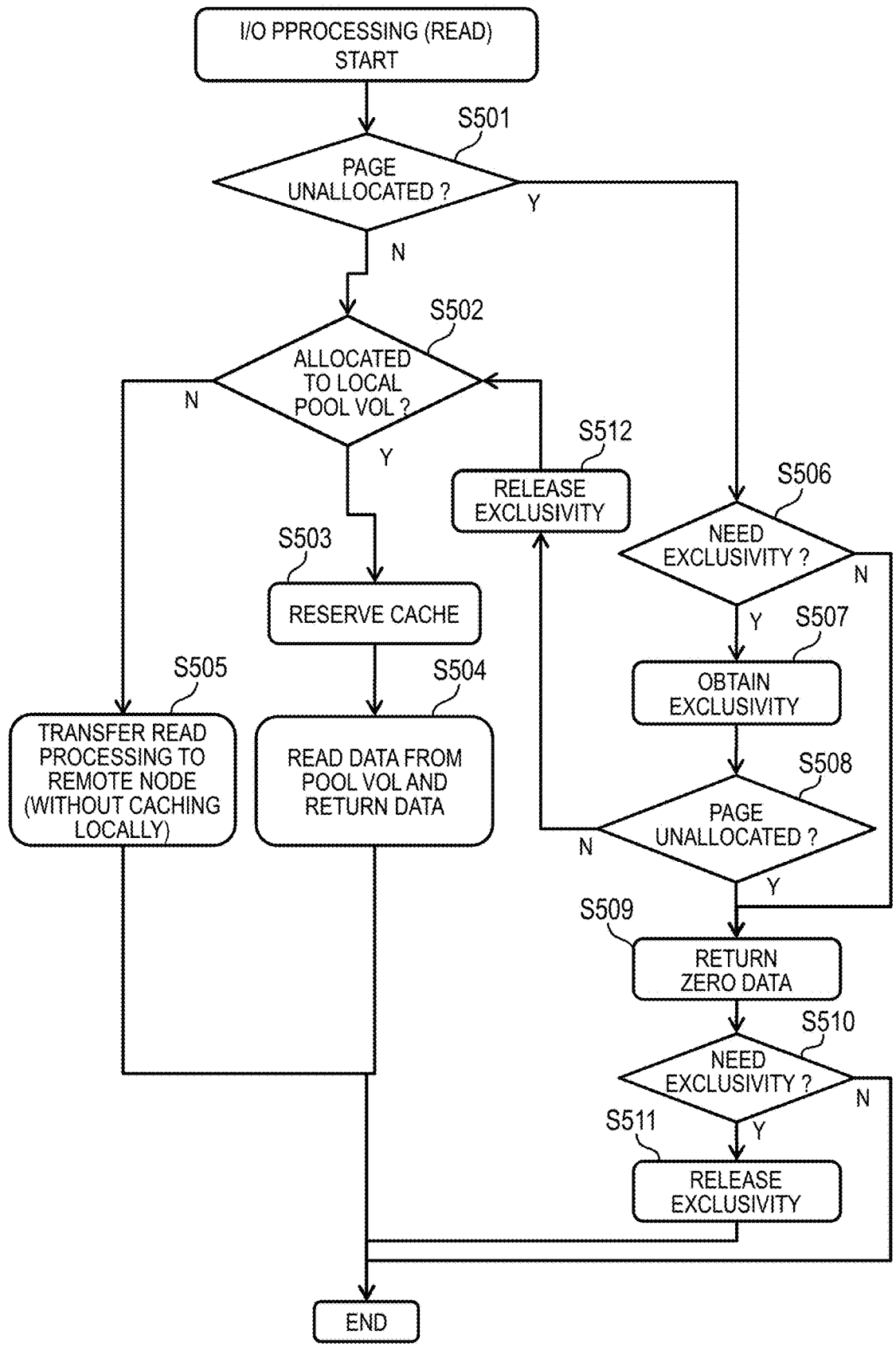
FIG. 15 is a flowchart of read processing in the distributed storage system.

FIG. 15 is a flowchart of read processing in the distributed storage system. The processor 119 determines whether the virtual page to be accessed at the address designated by the received read command is unallocated to a pool volume with reference to the page mapping table 215 (S501). The address is designated with, for example, a virtual volume number and a logical address. An LBA is specified with a start LBA and a block length.

If the virtual page is unallocated (S501: Y), the processor 119 determines whether exclusivity is necessary (S506). The processor 119 refers to the virtual volume management table 218 and determines that exclusivity is not necessary if the owner node of the virtual volume is only the local node.

If the determination is that exclusivity is necessary (S506: Y), the processor 119 obtains exclusivity (S507) and determines again whether the virtual page is unallocated to a pool volume (S508). For an example of a method of obtaining exclusivity, the processor 119 determines a representative node uniquely determined from the read address with a hash function and requests the representative node for coordination; the representative node coordinates the exclusivity.

If the virtual page has been allocated (S508: N), the processor 119 releases the exclusivity (S512) and proceeds to Step S502. If the virtual page is unallocated to a logical page (S508: Y), the processor 119 returns zero data (S509), and determines whether exclusivity is necessary (S510), like the determination at Step S506. If exclusivity is necessary (S510: Y), the processor 119 releases the exclusivity (S511) because the exclusivity has already been obtained.

If, at Step S501, the virtual page has been allocated (S501: N) and further, if the virtual page has been allocated to a local pool volume (S502: Y), the processor 119 reserves a local cache area, reads the data from the pool volume, and returns the read data (S504). The processor 119 determines whether the virtual page is allocated to a local pool volume with reference to the pool volume management table 219 and not-shown external connection management information.

If the virtual page is allocated to a pool volume 1303B in a remote node 101 through a local pool volume 1303C, the processor 119 determines that the virtual page is allocated to a remote pool volume.

In reserving a cache area, the processor 119 locates the cache area associated with the designated logical address with reference to the cache information 204. If no associated cache area exists, the processor 119 reserves a new area from the free queue 903. If the free queue 903 is empty, the processor 119 reserves a new area from the clean queue 902. If the clean queue 902 is empty, the processor 119 destages the data of some area in the dirty queues 900, 901, or 904 to change the area to a free area.

If the virtual page to be accessed has been allocated to a remote pool volume (S502: N), the processor 119 transfers the read command to the remote node (S505). The processor 119 does not cache the read data within the local node. That is to say, if the virtual page is allocated to another node, the processor 119 does not cache the read data to the local memory 118 (read-through caching) and the other node 101 caches the read data.

Figure 16:
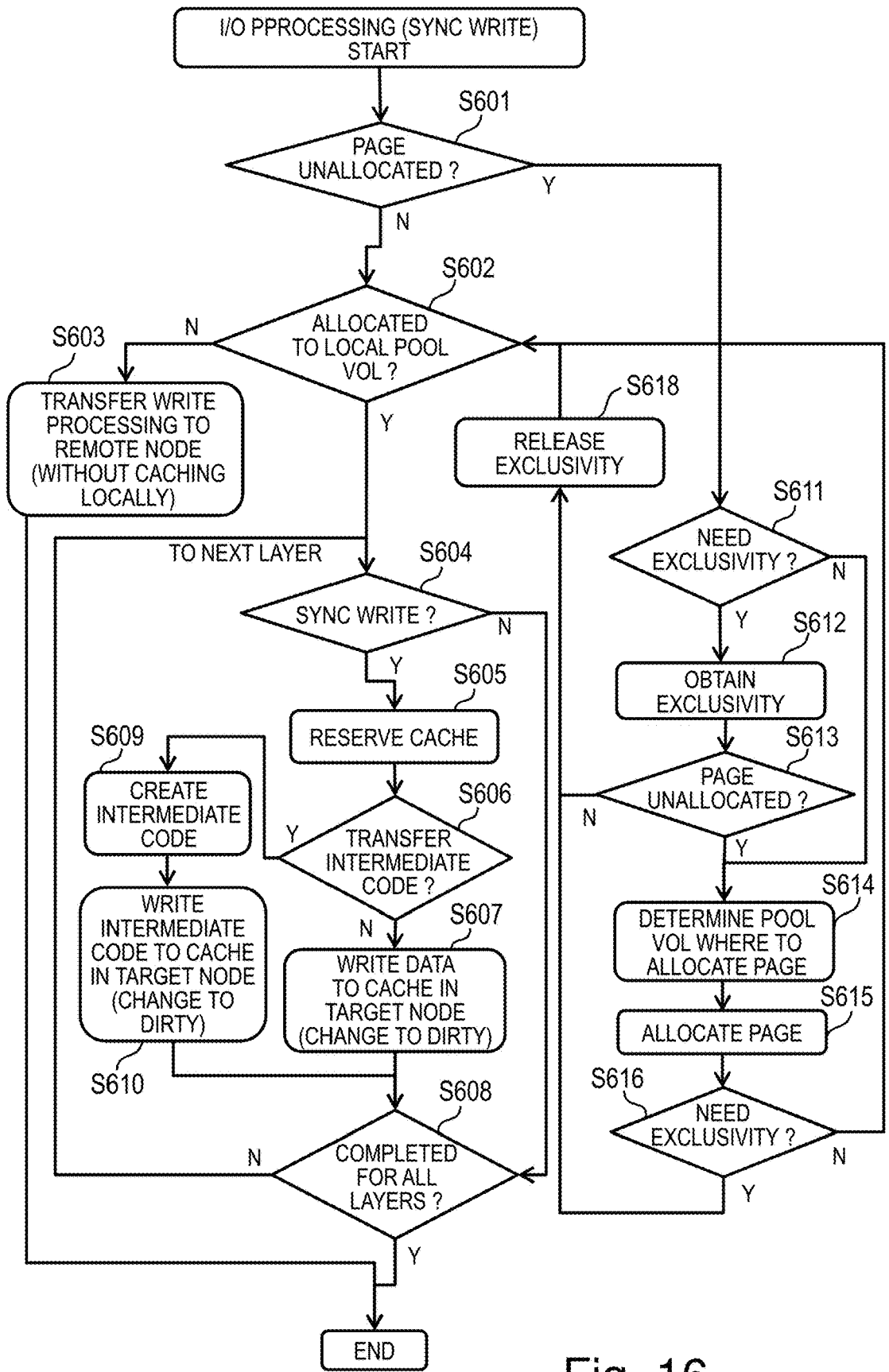
FIG. 16 is a flowchart of synchronous write processing.

FIG. 16 is a flowchart of synchronous write processing. This processing is executed upon receipt of a write command of a host (for example, an application program). This processing stores write data to a local pool volume and in addition, transfers the write data to other nodes to create a site redundant code (inter-node redundant code) and a geo redundant code (inter-site redundant code).

The processor 119 of a node 101 that has received a write command determines whether the page is unallocated (S601). Specifically, the processor 119 searches the page mapping table 215 for the pool volume number and the LBA corresponding to the address (the virtual volume number and the LBA) designated by the write command. The processor 119 determines whether the virtual page is unallocated depending on whether the corresponding address information exists.

In the system of this embodiment, a plurality of applications are running and these applications are run by at least one node in the system. It is supposed that a read request for data is usually issued to the node that has received the write command for the same data. In this application, therefore, data of a write request is preferentially stored in the storage area of the same node that has received the write request. This arrangement increases the probability for the node to provide read data in response to a read request, achieving a speedy response to a read request.

However, if the capability of the drives 113 connected with the node 101 is low compared to the capability of the network 103, distributing data to many nodes may increase the throughput of the system. In view of the foregoing, the storage area to allocate the virtual page may be changed by using a round-robin technique, depending on the capability of the network 103 or the capability of the drives 113 connected with the node 101. The above-described allocation policy may be based on not only the index of capability but also an index of life to achieve efficient cost-effectiveness, if flashes are used as the drives 113.

If the virtual page is unallocated (S601: Y), the processor 119 allocates the virtual page to a pool volume. The processor 119 first determines whether the page mapping table 215 needs exclusivity in updating (S611). The reason why to obtain exclusivity is to prevent allocation of areas of a plurality of different pool volumes to the virtual page when another node simultaneously allocates the virtual page.

The processor 119 refers to the virtual volume management table 218 and if the table 218 indicates any node other than the local node is included in the owner node, the processor 119 determines that exclusivity is necessary. If the owner node is only the local node, the processor 119 determines that exclusivity is not necessary. If the determination is that exclusivity is necessary (S611: Y), the processor 119 obtains exclusivity (S612). The method of obtaining exclusivity is the same as described in the read processing with FIG. 16.

Next, the processor 119 determines again whether the virtual page is unallocated (S613). This is because exclusivity may be obtained by another node after making the determination at Step S601 whether the virtual page is allocated until obtaining exclusivity at Step S612.

If the page is unallocated (S613: Y), the processor 119 determines the pool volume where to allocate the virtual page (S614). The processor 119 first checks whether the local pool volume has a free page.

Specifically, the processor 119 refers to the local area amount table 802 and determines whether the used amount is less than the target amount in the entry of the stripe type of the write data. If the used amount is less than the target amount, the processor 119 allocates the virtual page to a local pool volume. For example, the node 101 may have not-shown local area tier management information and selects a pool volume of the highest-class tier including a free page.

If no free area exists in the local node, the processor 119 mounts a remote pool volume (a pool volume in another node) to the local node, and allocates the page to the area. Upon determination of the pool volume, the processor 119 allocates the virtual page to the pool volume (S615). Specifically, the processor 119 updates a correspondence relation in the page mapping table 215.

This step prevents performance degradation in the node in receipt of a write request so that the system can maintain the capacity efficiency and the performance as a whole, by using the storage area of another node if the node in receipt of the write request has already provided a large amount of storage or if the capability of the drives 113 of the node is insufficient.

Next, the processor 119 determines whether exclusivity is necessary (S616). This determination is the same as Step S611. If exclusivity is necessary (S616: Y), the processor 119 releases the obtained exclusivity (S618). If exclusivity is not necessary (S616: N), the processor 119 proceeds to S602.

The processor 119 determines whether the logical address (virtual page) in the virtual volume designated by the write command is allocated to a local pool volume with reference to the page mapping table 215 (Step 602).

If it is not allocated to a local pool volume (S602: N), the processor 119 transfers the write command to a remote node 101 (S603). The remote node 101 executes write processing in accordance with this flowchart. To maintain data coherency, the processor 119 does not locally cache the write data.

If the virtual page is allocated to a local pool volume (S602: Y), the processor 119 starts write processing for each protection layer (S604 to S610). For example, assume that the distributed storage system is configured with three protection layers. They are, for example, a node protection layer, a site protection layer, and a geo protection layer. The processor 119 repeats the processing three times in total for the three layers. In this example, the node protection layer is set to synchronous write.

The processor 119 determines whether to apply synchronous write to the layer (S604). Specifically, the processor 119 determines it with the virtual volume management table 218 by referring to the SYNC/ASYNC field for the virtual volume to be written.

If synchronous write is not applied to the layer (S604: N), the processor 119 records "UNCOMPLETED" in the state field of the corresponding area in the data mapping table 701 without transferring the write data (stripe) to the remote node 101. The state field indicates the state in the protection layer being processed. The data in the cache 181 for which the state field indicates "UNCOMPLETED" is retained until transfer.

The processor 119 determines whether the processing for all the protection layers has been completed (S608), and if the processing for all the protection layers has been completed, terminates the processing. If processing for all the protection layers has not been completed (S608: N), the processor 119 repeats the processing for the next protection layer from Step S604. If synchronous write is to be applied (S604: Y), the processor 119 reserves a cache area in the local cache area 181 (S605). The method is the same as described with reference to FIG. 15.

Next, the processor 119 determines whether to transfer intermediate code (S606). The intermediate code represents update differences between old data (the latest data at this time) and new data (data to be written in this processing). In the case of redundant data in RAID 5 for example, the intermediate code is the xor value of the old data and the new data. In another case of employing erasure coding, the processor 119 may create a plurality of xor results by multiplying coefficients of the matrix.

Several criteria may be used to determine whether to transfer the intermediate code. For example, the processor 119 may determine to transfer the intermediate code when the remaining amount of the redundant code area in the transfer destination node 101 is smaller than a threshold. As a result, the transfer destination node can store the necessary redundant code unfailingly. The processor 119 acquires information on the amount of local area in the transfer destination node 101 from the transfer destination node 101.

The processor 119 may create the intermediate code if its response degrading effect at cache hit is small in the local node. For example, when the local node is in a write mode, when the local node uses specific low-latency drives, when the local node is loaded higher than a threshold, or when the communication distance between nodes is longer than a threshold, the processor 119 transfers the intermediate code.

Alternatively, the processor 119 transfers the intermediate code when the drives 113 have sufficient lives for write. In the write mode, the processor 119 returns a completion report to the host after destaging the write data from the cache 181 to the drives 113.

If determining to transfer an intermediate code (S606: Y), the processor 119 creates the intermediate code from the stripe (write data) in the cache 181 and the old stripe retrieved from the drives 113 (S609) and writes the intermediate code to the cache 181 of the target node (transfer destination node) (S610).

The processor 119 determines the target node (transfer destination node) of the intermediate code by the following method. The processor 119 calculates the row number (the value of the vertical axis in the area D in FIG. 11) by the following formula. The method of calculating the row number is the same as the method of calculating the row number of a stripe with reference to FIG. 11

(Address value/Stripe size)mod $c$

The processor 119 determines the stripe type number (the numeral in a cell in the diagram of FIG. 11) with reference to the static mapping table for the protection layer.

The processor 119 determines the transfer destination node 101 from the stripe type number with reference to the static mapping table for this protection layer. The processor 119 transfers the intermediate code to the address of the destination node 101 together with information on the sender's address (a site number, a node number, an LDEV number, an LBA, a TL (Transfer Length)) and an identifier identifying that the transferred is an intermediate code. The LDEV number is the identifier of a pool volume.

The processor 119 refers to the static mapping table 211 for Layer number 2, for example, and determines the redundant code node to eventually store the site redundant code Q to be the transfer destination node.

The processor 119 refers to the static mapping table 212A for Layer number 3, for example, and determines the transfer destination site (the site to store the geo redundant code R). For example, a representative node 101 of the site is predetermined and the processor 119 transfers the intermediate code together with the aforementioned accompanying data to the representative node 101.

The representative node 101 calculates a hash value from the transfer source address information using a hash function. The representative node 101 determines the transfer destination node 101 from the calculated hash value with reference to the consistent hashing table 212B. The destination node 101 is the node to eventually store the geo redundant code R (redundant code node).

The transferring data via the representative node 101 has disadvantages of requiring two data transfers, access concentration to the representative node 101, and deterioration of availability caused by a failure in the representative node 101. Accordingly, a plurality of representative nodes 101 may be prepared to select one by round robin.

Instead of the representative node 101, the processor 119 may directly determine the node in the remote site to store the geo redundant code R. Specifically, the transfer source node 101 may hold in advance a consistent hashing table 212B for the transfer destination site and the processor 119 determines the transfer destination node 101 in accordance with this table.

In the case where each node 101 holds consistent hashing tables 212B of the other sites, synchronization of the consistent hashing tables 212B among the sites is overhead. For this reason, the distributed storage system may periodically update the tables without frequent synchronization by exclusive update. In such a case, the destination node that has received an intermediate code from a remote site may determine whether the intermediate code has been sent to the correct destination with reference to its own consistent hashing table 212B and if the intermediate code has been sent to a wrong destination, it may transfer the received data to the correct node 101.

If the transfer destination node 101 has dirty data having the same source address of the intermediate code, the processor 119 of the destination node 101 calculates the xor of the intermediate code and the dirty data and updates the data in the cache with it. The processor 119 of the destination node 101 connects the cache information on the intermediate code to the middle dirty queue 904. The transfer destination node 101 may calculate the xor of the intermediate codes from different sources for the same redundant code and updates the data in the cache 181 with it.

At Step S606, if determining not to transfer the intermediate code (S606: N), the processor 119 writes write data to the cache 181 of the target node (transfer destination) (S607). This example basically stores the write data preferentially to the node that has received the access. As described above, transferring the data to a target node (transfer destination) different from the write target means that redundancy is guaranteed in the cache. Furthermore, separately creating an inter-node redundant code saves the amount of storage for the redundant code while maintaining the redundancy, achieving capacity efficiency.

The method of determining the transfer destination node 101 and the method of transferring data are the same as those of Step S610. The transfer source node 101 transfers the write data together with information on the sender's address (a site number, a node number, an LDEV number, an LBA, a TL) and an identifier identifying that the transferred is normal data. At the destination node, the processor 119 connects the cache information corresponding to the write data to the associated redundant code dirty queue 901.

In writing write data not to a local pool volume but to a remote pool volume in order to reduce the flow rate of write data, an existing erasure coding technique may be employed. The existing erasure coding technique divides write data into stripes, creates redundant data with the divided data, and distributes and stores the divided data and redundant data to a plurality of nodes.

The redundant code may include information on the encoding scheme for identification of which redundant code creation method has been used. The use of the existing erasure coding scheme may be limited to the data which will not cause bottle neck of the network because of read from remote nodes.

Figure 17:
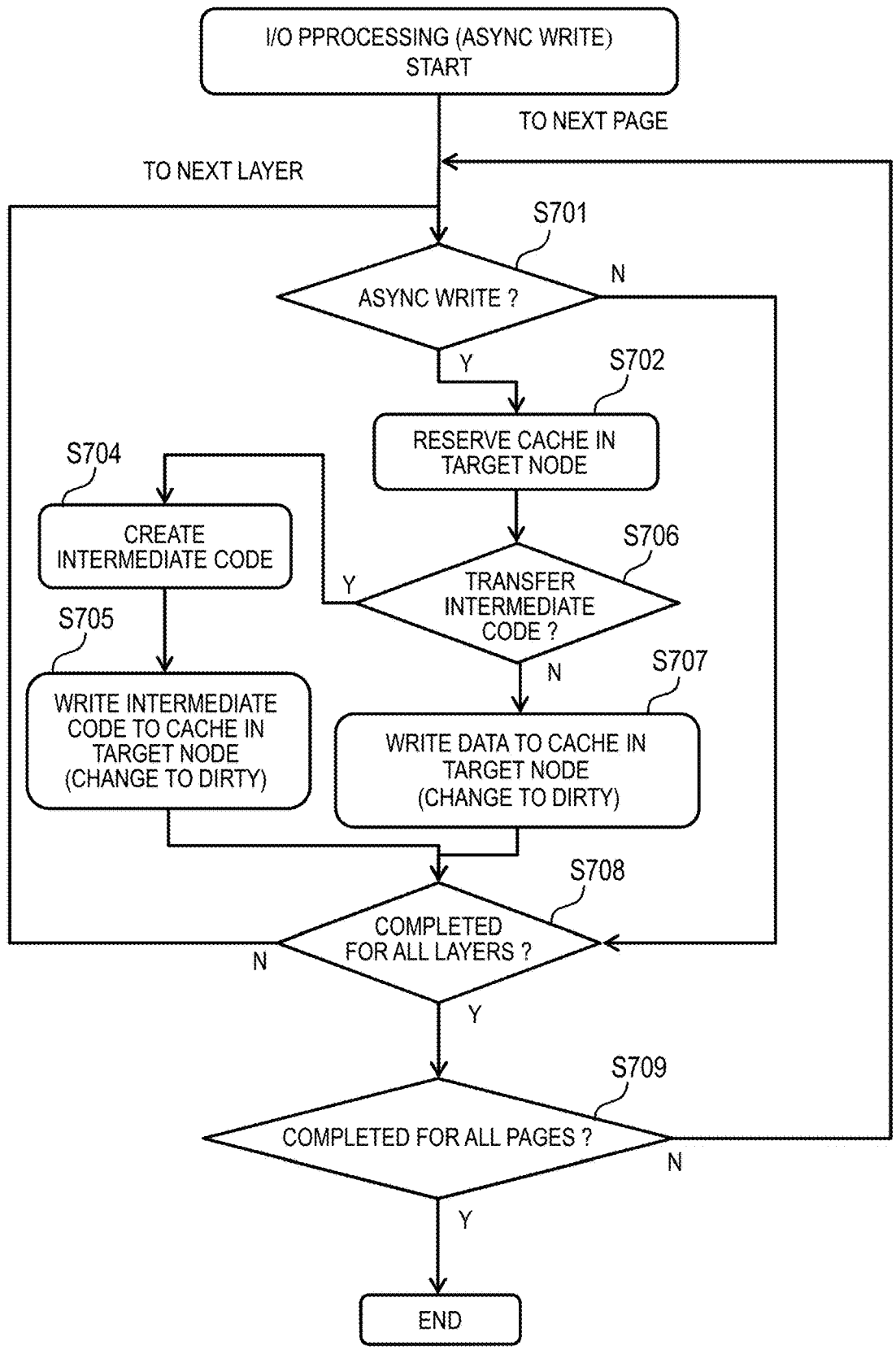
FIG. 17 is a flowchart of asynchronous write processing.

FIG. 17 is a flowchart of asynchronous write processing. This processing is executed asynchronously with a host I/O and transfers data that belongs to a protection layer set to ASYNC and has not been transferred to a remote node. Steps S702 to S708 in FIG. 17 are the same as Steps S605 to S608 in FIG. 16. This section describes only the differences. In each node 101, the processor 119 executes this processing on all virtual volumes registered in the page mapping table 215.

The processor 119 determines whether to apply asynchronous write to the virtual page being processed (S701). Specifically, the processor 119 refers to the data mapping table 701 and checks the state of the pool volume area corresponding to the virtual page. If the state is "UNCOMPLETED" in the protection layer being processed, the processor 119 determines to apply asynchronous write to the virtual page (S701: Y), and proceeds to Step S702.

When processing for all the virtual pages has been completed (S709: Y), the processor 119 exits this flow. The processor 119 may execute the asynchronous write processing periodically or constantly. The processor 119 may dynamically change the frequency of execution of this processing or the data transfer rate depending on the amount of pages in the UNCOMPLETED state.

Figure 18:
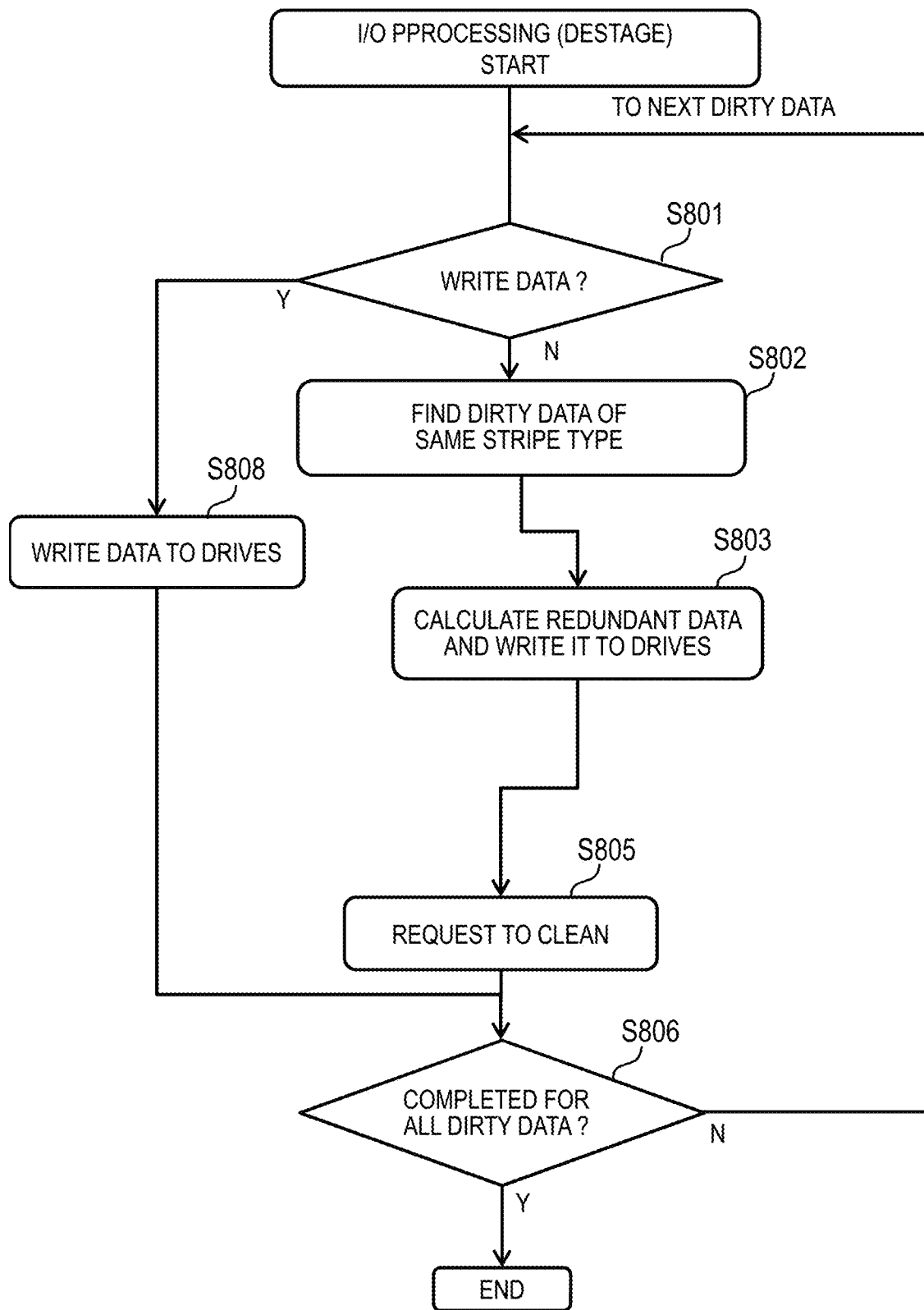
FIG. 18 is a flowchart of destage processing.

FIG. 18 is a flowchart of destage processing. This processing is executed asynchronously with host I/Os when the cache 181 has dirty data or data unreflected to the media (drives 113). Since creation of redundant data is basically completed within the node (each node creates redundant data from data sent from other nodes), the inter-node traffic amount to create redundant data can be small. Furthermore, destinations of redundant data are balanced among many nodes in accordance with the static mapping table 211; the destage processing can be distributed efficiently.

The cache 181 includes two kinds of dirty data. One is write data to be stored in the local drives 113. The other is data transferred from other nodes to create redundant data. The data transferred from other nodes includes intermediate codes.

Dirty data is managed by the data dirty queues 900, the code dirty queues 901, and the middle dirty queues 904. The flowchart of FIG. 18 illustrates destaging of dirty data managed by the data dirty queues 900 and the code dirty queues 901.

Upon start of this processing, the processor 119 finds the dirty data to be processed with reference to the data dirty queues 900 and the code dirty queues 901. The processor 119 determines whether the data is write data to be stored to the local drives 113 (S801). If the data is indicated by the data dirty queues 900, the data is write data.

If the data is write data (S801: Y), the processor 119 writes the write data to the local drives 113 (S808). The data is stored in accordance with the log-structured scheme. When storing the write data to the drives 113 in accordance with the log-structured scheme, the processor 119 records the correspondence relation between the logical address in the pool volume and the physical address in the drives 113 and the state of the data to the data mapping table 701 as illustrated in FIG. 8.

Further, the processor 119 records the correspondence relation between the logical address in the pool volume and the physical address in the drives 113 to the reverse mapping table 703. If the drives 113 do not have free space, the processor 119 may first perform capacity depletion management processing described with reference to FIG. 19 and then execute data write to the drives 113.

The processor 119 determines whether all dirty data has been processed (S806). If all the dirty data has been processed (S806: Y), the processor 119 exits this flow.

If the data is not write data, meaning if the data is a stripe to create a redundant code (S801: N), the processor 119 finds dirty data of the same stripe type (S802).

Specifically, the processor 119 acquires stripes transferred from other different nodes 101 including the data to be processed from the queue including the data in the code dirty queues 901. The processor 119 acquires X stripes if possible in accordance with the data protection policy specified by the user (XDYP: X units of data at maximum to Y codes of redundant data). Designation of data protection policy by the user will be described later with reference to FIG. 27.

Specifically, the processor 119 selects stripes as many as possible within the number of data node IDs in the site static mapping table 211 or the geo static mapping table 212A to implement redundancy satisfying the user's specification as much as possible. The transfer source nodes of the selected stripes are all different. If the queue of the data to be processed includes stripes received from all the data nodes belonging to the stripe type, the processor 119 selects stripes of all the data nodes. The logical addresses in the transfer sources do not matter in selecting the stripes.

As understood from the above, the number of stripes to be the components in creating a redundant code is not fixed and undetermined. The combination of logical addresses of the stripes to be the components in creating a redundant code is also undetermined. This configuration allows a redundant code to be efficiently created only from the stripes in receipt. If the code dirty queues 901 do not include the same stripe type of stripes received from other nodes 101, the processor 119 may create a redundant code only from the data being processed and store it to the drives 113.

In transferring write data to the node to create its redundant code in synchronous write processing, if new synchronous write processing is started when write data has not been destaged to the drives in the transfer source node, the write data in the cache might be overwritten to become unable to be restored.

Accordingly, the node to store the redundant data must use only the data that has been destaged in the source node to create the redundant data. To implement this arrangement, the transfer source node may notify the node to store the redundant data of completion of destaging so that the node to store redundant data destages the data only in the case of receipt of the notification. Alternatively, the transfer source node may transfer the data to the node to store the redundant code when the transfer source node destages the data. Still alternatively, the cache may be configured not to overwrite in updating the data therein (for example, to store data by log buffering).

The processor 119 can also find dirty data from the queue of the same stripe type in the middle dirty queues 904. The processor 119 calculates the xor of the corresponding redundant code stored in the drives 113 and the intermediate code and updates the redundant code. If the updated redundant code is created from only the stripes of the nodes 101 different from the transfer source node 101 of the data being processed, the processor 119 creates a new redundant code from the data being processed and the updated redundant code.

The processor 119 may select stripes to create a redundant code so that the rate of the old data (old stripes) will be as high as possible. If a redundant code can be created with only old stripes, the processor 119 selects only old stripes. Increasing the rate of the old data expedites the time the redundant code becomes invalid data, so that the redundant code storage area can efficiently increase free space.

The processor 119 calculates a redundant code from the selected stripes and writes it to the drives 113 (S803). The write to the drives 113 is basically the same as Step S808 and is addition by the log-structured scheme. This operation omits retrieval of old data to achieve speedy and efficient redundant code creation and drive write.

The processor 119 records the correspondence relation between the physical area holding the calculated redundant code and the pages of the pool volumes to the redundant code mapping table 702, not to the data mapping table 701. The processor 119 further records the correspondence relation between the logical addresses in the pool volumes and the physical address in the drives 113 to the reverse mapping table 703. Since a redundant code is created from a plurality of stripes, the mapping tables have a plurality of references for a single physical address.

After writing the redundant code to the drives 113, the processor 119 notifies the transfer source nodes 101 (S805). Each of the transfer source nodes 101 updates the data mapping table 701 by changing the state of the data in the layer being processed into "COMPLETED". The state field is referred to in order to determine whether to transfer the data again at a node failure. When all the dirty data has been processed (S806: Y), the processor 119 exits this flow.

In the case of employing a coding scheme that provides two or more redundant codes, such as erasure coding, if the plurality of nodes for creating a redundant code independently create a redundant code with different data combination, data restoration could be difficult (because of the loss of maximum distance separability (MDS) or increase in computing amount for restoration).

Hence, after creating a first redundant code, the node that has created the redundant code may determine the nodes to create the second and the subsequent redundant codes with reference to the static mapping table 211 and notifies the nodes to create the second and the subsequent redundant codes of the set of addresses of the data from which the redundant code has been created.

The nodes to create the second and subsequent redundant codes create the second and subsequent redundant codes with the set of the addresses of the data notified of to maintain the maximum distance separability and to allow data restoration. Another method can also be provided that the node for creating the first redundant code creates the second and the subsequent redundant codes and transfers the redundant codes to the relevant nodes.

In destaging an intermediate code, the processor 119 creates a new redundant code from an old redundant code stored in the drives 113 and the intermediate code and overwrites the old redundant code in the drives 113 with it. Since the operation is overwriting, the mapping table does not change. Although updating a redundant code with an intermediate code requires reading old data, the redundant code node can save the use of the local area.

If the middle dirty queues 904 include a plurality of intermediate codes for a single redundant code, the processor 119 calculates the xor of all the intermediate codes to create a new intermediate code, and updates the redundant code with the new intermediate code. The intermediate codes for the same redundant code include different generations of data at the same logical address and intermediate codes of different nodes 101.

For example, assuming that an old redundant code is A xor B, examples of intermediate codes for the single redundant code include an intermediate code A xor A', an intermediate code B xor B', and an intermediate code A' xor A", where A" is the newest data and A' is the oldest data; the data B is new data and data B' is old data.

The processor 119 can know the physical address of the redundant code of an intermediate code selected from the middle dirty queues 904 with reference to the redundant code mapping table 702. The processor 119 can further locate the logical addresses of the stripes of the intermediate codes corresponding to the redundant code with reference to the reverse mapping table 703.

A specific example of updating a redundant code is described as follows. The following example employs RAID 6 using Reed Solomon coding (Galois coefficients: A1 to A3) by way of example.

(1) Code Dirty Queues 901

The processor 119 selects dirty data X1 to X3 from the dirty queues 901 and calculates a redundant code P1 or P2 using the following formula.

$$P1 = X1\,\text{xor}\,X2\,\text{xor}\,X3$$

$$P2 = (X1*A1)\,\text{xor}\,(X2*A2)\,\text{xor}\,(X3*A3)$$

The redundant code P1 or P2 is written to a new area in the local storage device.

(2) Middle Dirty Queues 904

The processor 119 extracts new intermediate dirty data M1 and M2 corresponding to old redundant data P1' or P2, which has been written to the local drives 113, from the middle dirty queues 904. The number of intermediate codes is not limited to 2. The processor 119 calculates a new redundant code MP1 or MP2 using the following formula.

$$MP1 = M1\,\text{xor}\,M2$$

$$MP2 = (M1*A1)\,\text{xor}\,(M2*A2)$$

The processor 119 calculates a new redundant code P1 or P2 using the following formula:

$$P1 = P1'\,\text{xor}\,MP1$$

$$P2 = P2'\,\text{xor}\,MP2$$

The previous area (P1' or P2') is overwritten with the new redundant code P1 or P2.

As described above, a redundant code node 101 dynamically selects stripes from a single stripe type of stripes and creates a redundant code from the selected stripes. This configuration efficiently creates a redundant code from transferred stripes without retrieving an existing redundant code.

The dynamic selection of stripes in this example is selection in which at least either the combination of stripes to be selected or the number of stripes is undetermined. Although the foregoing example selects stripes independent from both of the number of stripes and the combination of addresses, either one may be fixed. The addresses in the combination of addresses are addresses specified with a node, a volume, and an in-volume address.

The drive write of a redundant code does not need to employ the log-structured scheme. That is to say, a node 101 may rewrite an old redundant code with a new redundant code, which has been created from the combination of data at the same addresses as the data for the old redundant code, without adding the new redundant code to the local area. In the configuration which does not employ the log-structured scheme, a redundant code of combination of data at the addresses different from the any combination of addresses of the existing redundant codes is added to the local area.

The above-described example creates a redundant code from only stripes of the same predefined stripe type. Unlike this, the system may create a redundant code from any combination of stripes without defining stripe types.

Figure 19:
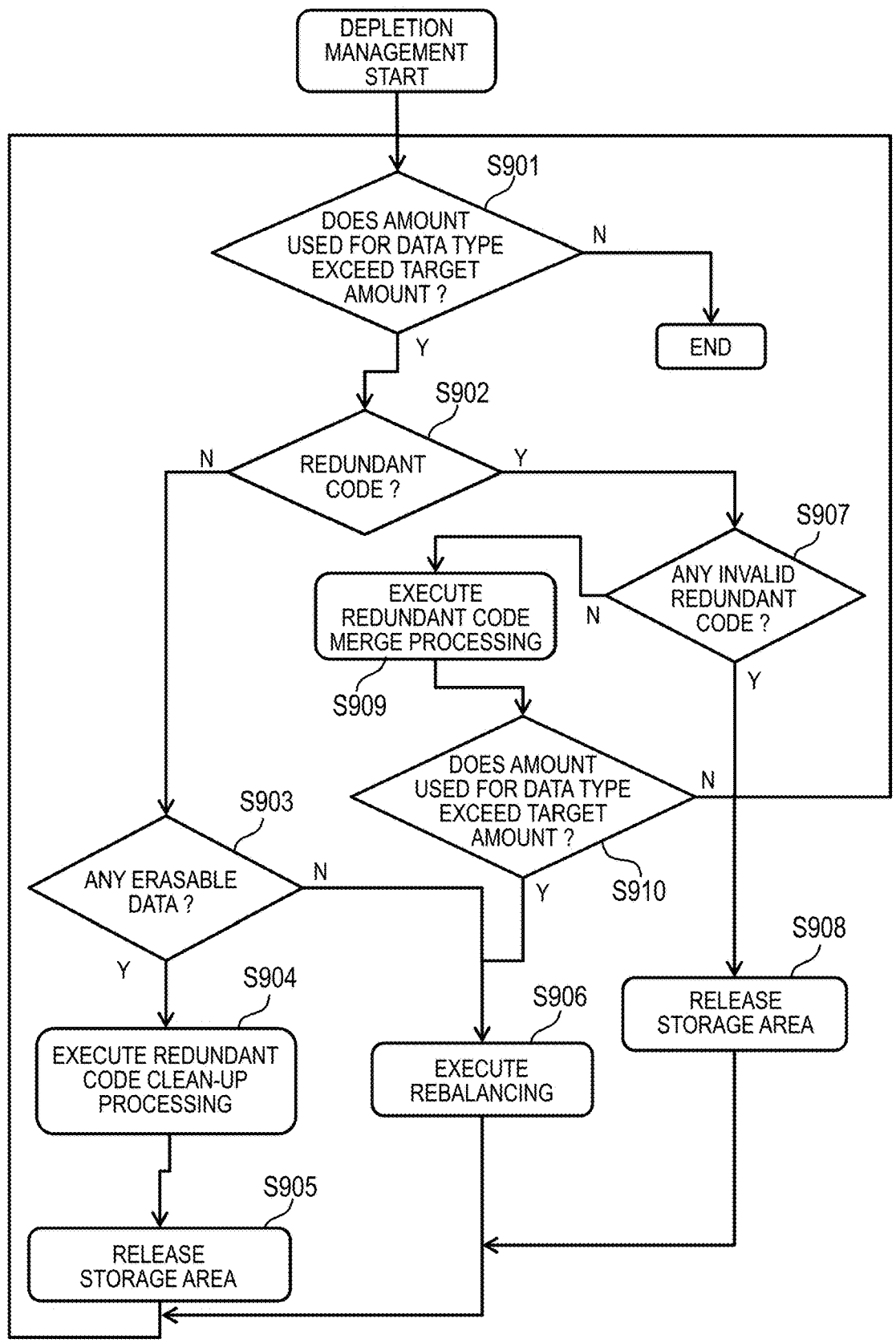
FIG. 19 is a flowchart of processing of capacity depletion management.

FIG. 19 is a flowchart of processing of capacity depletion management. This processing attempts to erase data when the amount of data in the drives 113 exceeds a predetermined target amount, so that necessary data can be stored in the limited area. The types of data to be erased are write data (stripes) and redundant codes. This processing may be performed asynchronously with host I/Os. The relations between used amounts and target amounts are indicated in the local area amount table 802.

The flowchart of FIG. 19 is applied to erasure of data in the redundant code area and data stripe area and is not applied to erasure of data in the spare area. If separate local area amount tables 802 are provided for individual tiers, this processing is executed for each tier.

The processor 119 refers to the local area amount table 802 and checks whether the used amount for the selected data type exceeds the target amount (S901). If the used amount for the selected data type exceeds the target amount (S901: Y), the processor 119 determines whether the data type is redundant code type (S902).

In this example, the data types are categorized to redundant code type, write data type (stripe type), and spare area data type as shown in the local area amount table 802. The redundant code type is further categorized into node redundant code type, site redundant code type, and geo redundant code type; the write data type is further categorized into individual site stripe types.

If the data type for which the used amount exceeds is one of the redundant code types (S902: Y), the processor 119 refers to the invalid list 801B and the log-structured mapping table 213 and searches for the redundant codes of this redundant code type (S907). An invalid redundant code is a redundant code that all the stripes to calculate the redundant code are invalid. Since the all source stripes are updated old data, the redundant code can be erased.

If some invalid redundant code of the redundant code type exists (S907: Y), the processor 119 releases the area (S908). To release the area, the processor 119 deletes the relation of the physical address of the area and the pool volume-related logical address in the redundant code mapping table 702, deletes the area from the invalid list 801B, reconnects the area to the free list 801C, and reduces the used amount for the corresponding redundant code type in the local area amount table 802.

If no invalid redundant code of the redundant code type exists (S907: N), the processor 119 executes redundant code merge processing (S909). This processing can reduce the used amount for redundant codes.

For example, assuming that a redundant code P1=X' xor Y' xor Z (the primes (') denote invalid data) and a redundant code P2=J xor K xor L' exist, if J, K, and Z are stripes existing in different nodes, the processor 119 can calculate a new redundant code P3=J xor K xor Z according to P1 xor P2 xor X' xor Y' xor L'.

The processor 119 acquires logical addresses and generation information of the source stripes of the redundant code with reference to the log-structured mapping table 213. The processor 119 acquires X', Y' and L' from other nodes 101.

The processor 119 releases the areas of the redundant codes P1 and P2 and writes the new redundant code P3 to the drives 113 to reduce the used amount for redundant codes. The processor 119 may preferentially select redundant codes to reduce a larger amount from the used amount for redundant codes.

After the merge processing, the processor 119 rechecks whether the used amount for the specific redundant code type exceeds the target amount (S910). If the used amount still exceeds the target amount (S910: Y), the processor 119 executes rebalancing (S906). As will be described later, the rebalancing adjusts the amount of used pages among pool volumes. For example, it relocates the data to a pool volume in a different tier or pool volume in a remote node 101 (remote pool volume). After completion of the rebalancing, the processor 119 proceeds to Step S901. If the used amount does not exceed the target amount (S910: N), the processor 119 proceeds to Step S901.

If the selected data type is not the redundant code type, meaning if the data type is one of the stripe types (S902: N), the processor 119 determines whether any erasable write data (stripe) exists in the selected stripe type (S903). The erasable stripe is an updated old stripe and an invalid stripe. The processor 119 searches for invalid stripes of this stripe type with reference to the invalid list 801B and the log-structured mapping table 213.

If some erasable stripe exists (S903: Y), the processor 119 executes redundant code clean-up processing (S904). This processing cleans up the redundant codes of the stripe to be erased. The cleaning up is performed for both of the site redundant code and the geo redundant code. Specifically, the following steps are executed in each protection layer.

(1) The processor 119 makes an inquiry to the redundant code node 101 of the stripe to be erased whether the node 101 has any redundant code including the stripe to be erased. The stripe is specified with, for example, a site number, a node number, an LDEV number, and an LBA.

(2) If the redundant code node 101 in receipt of the inquiry has a redundant code including the stripe to be erased, the processor 119 sends the stripe to be erased to the redundant code node 101. If the redundant code node 101 does not have the redundant code, this processing is terminated.

(3) The redundant code node 101 creates a new redundant code by erasing the stripe to be erased from the current redundant code with the received stripe to be erased. For example, the redundant code node 101 calculates the xor of the stripe to be erased and the old redundant code to create a new redundant code. The redundant code node 101 overwrites the old redundant code stored in the drives 113 with the new redundant code.

The above-described update of the redundant code derived from erasure of a stripe prevents the erasure of a source stripe of the redundant code from lowering the redundancy level of the other stripes of the same redundant code.

In erasing a redundant code, the redundant code node may inquire whether the stripes corresponding to the redundant code are the latest version. Each stripe is located by a logical address indicated in the reverse mapping table 703. If the stripe is the latest version, the redundant code node recreates a new redundant code of the stripe.

Next, the processor 119 releases the area (S905). This is the same as Step S908. Thereafter, the processor 119 returns to Step S901.

If the used amount for the spare area is more than the target amount, the processor 119 may execute stripe erasure in the flowchart of FIG. 19, execute redundant code erasure, and then execute rebalancing, for example. The sequence of the stripe erasure and the redundant code erasure may be reversed. When the used amount becomes less than the target amount at one of the steps, the subsequent steps are not necessary.

Figure 20:
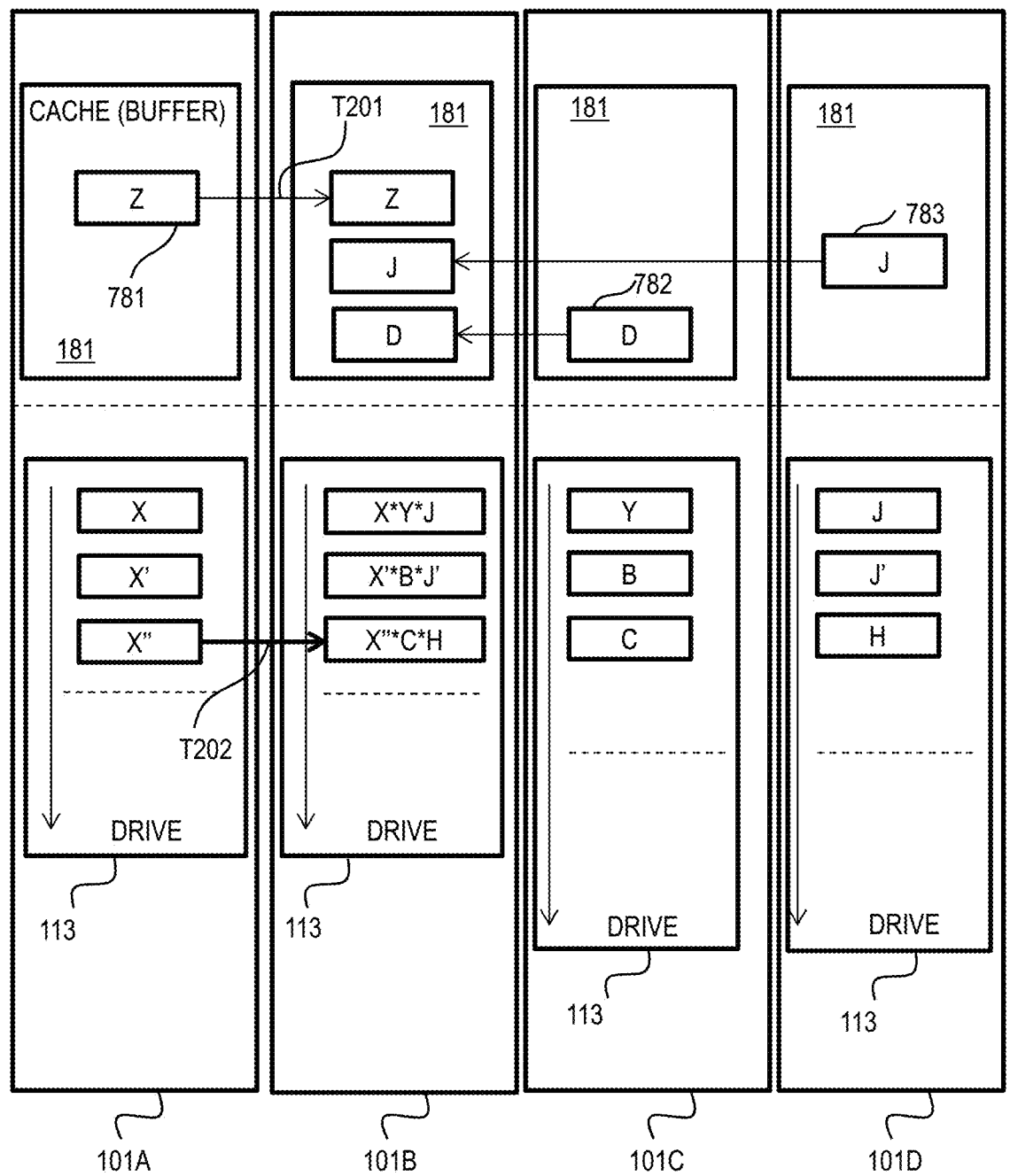
FIG. 20 illustrates a concept of the processing of capacity depletion management.

FIG. 20 illustrates a concept of the processing of capacity depletion management. This drawing illustrates the redundant code clean-up processing. The node 101A transfers a stripe 781 to be written to the node 101B (T212). Likewise, the nodes 101C and 101C transfer stripes 782 and 783 to the node 101B. The transferred stripes 781, 782, and 783 are denoted by Z, D, and J, respectively.

When a drive 113 of the node 101A is depleted, that is, when the used amount in the drive 113 of the node 101A exceeds a threshold, the node 101A attempts to erase old data. An old stripe is denoted by X". The reference signs X' and X" represent past data (invalid data) and X represents current data.

A redundant code created only from past stripes is meaningless to be held any longer and can be erased. However, a redundant code created from a stripe set including a current stripe cannot be erased. If such a redundant code exists, the past stripe used to create the redundant code cannot be erased from the drive because the stripes would become unrestorable.

Accordingly, before erasing the past stripe, the node sends the stripe to the node storing the redundant code of the stripe to request for cleaning up. For example, in FIG. 20, the node 101B has a redundant code of X" xor C xor H. The node 101A sends the past stripe X" to the node 101B before erasing the past stripe X" (T202).

The node 101B calculates X" xor C xor H xor X" from the past stripe X" and the redundant code X" xor C xor H to obtain C xor H. Thereafter, the node 101A erases the past stripe X" in the drive 113.

Figure 21:
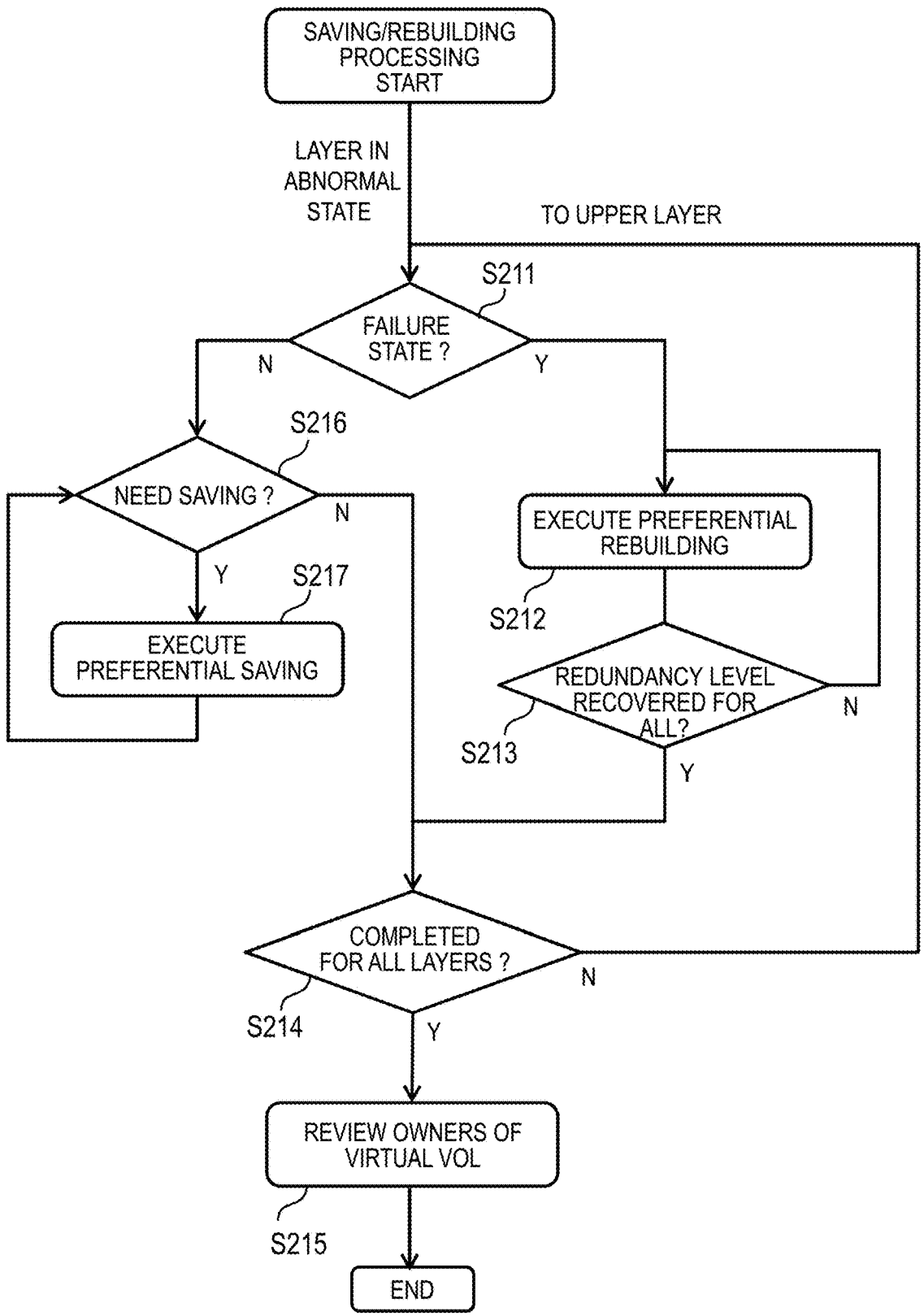
FIG. 21 is a flowchart of saving/rebuilding processing.

FIG. 21 is a flowchart of saving/rebuilding processing. This processing is executed by each node 101 to address a trouble occurred in the distributed storage system. The processor 119 of each node 101 can detect a trouble by referring to the state control tables for individual protection layers, specifically, the drive state management table 221, the node state management table 222, and the site state management table 223. As mentioned above, information on a trouble detected by one of the nodes 101 is shared within the system.

In FIG. 21, the node 101 determines whether the abnormal resource (drive, node, site, or the like) is in a failure state (S211). The resources have three kinds of states: "NORMAL" state, "FAILURE" state, and "WARNING" state. The node 101 can identify the state of the abnormal resource by referring to the state management tables for individual protection layers.

When a failure occurs in a resource such as a node or a site, the node (spare node) to rebuild the data held in the resource is predetermined as described with reference to FIG. 11. Each node 101 holds information indicating the resources for which the node should become a spare node and the data the node should rebuild; the processor 119 rebuilds the necessary data upon detection of a failure in the resource assigned to its local node.

If the state management table indicates "FAILURE", the processor 119 identifies that the abnormal resource is in a failure state (S211: Y) and execute preferential rebuilding (S212). The preferential rebuilding executes rebuilding starting from the data of the stripe type having the lowest redundancy level in the protection layer.

Rebuilding restores lost data from the remaining stripes and redundant data. The node 101 finds out the stripe type for which the redundancy level is lowered by losing data stored in the error resource and the redundancy level with reference to the static mapping tables 210 to 212 for individual protection layers.

Each node 101 notifies the other nodes of the processing to execute and the progress of the processing and waits for the completion of preferential rebuilding for the data having a lower redundancy level in the other nodes 101. For example, a node 101 waits for the completion of rebuilding for the stripe type of the redundancy level 0 at the other nodes 101 to start rebuilding for the stripe type of the redundancy level 1. This arrangement prevents the rebuilding for the stripe type of the redundancy level 0 from taking long because of the rebuilding for the stripe type of the redundancy level 1.

It is commonly known that the technique of erasure coding having MDS (Maximum Distance Separable) property can restore data for which a given number of redundancy levels have been lost.

Basically, a spare node to hold rebuilt data in its local storage device reads the redundant code and stripes to rebuild the data. If the spare node is highly loaded, a different node may rebuild the data and transfer the data to the spare node.

If the data of the failed node is unnecessary, for example, in the case where the virtual volume does not have an owner, only the redundant code may be changed without rebuilding in the spare node. For example, the spare node writes zero data and the redundant code node creates a new redundant code from the stripes other than the lost stripe of the old redundant code and the zero data.

The redundant codes of upper protection layers lost by the failure of the resource can be recreated. For example, when a failure occurs in a drive in some node, the node 101 recreates the site redundant code or the geo redundant code within the node 101. The node 101 requests other nodes 101 to transfer the stripes required to create the site redundant code or the geo redundant code. The node 101 can identify the nodes holding the stripes with reference to the redundant code mapping table 702 and the reverse mapping table 703.

The site redundant codes and the geo redundant codes may be made redundant within the node holding the redundant code. Despite of increase in overhead (operating time of the processor, used storage area, life consumption of flash media, and the like) in implementing redundancy, communications among the nodes involved with a failure in the drive will be unnecessary. After completion of preferential rebuilding, each node updates the node registered for the stripe type in the static mapping tables 210 to 212 with the spare node.

Regarding old data (for which new data has been written), if a redundant code is created using the data, the redundant code node needs to recreate the redundant code by making only the new data dirty among the data corresponding to the redundant code.

Each node 101 checks whether the redundancy levels of all stripe types in the protection layer have recovered (S213). Each node 101 notifies the other nodes of completion of data recovery. When the redundancy levels have recovered in all the stripe types in the protection layer, the processing proceeds to Step 214. If the processing has not been completed on all layers (S214: N), the distributed storage system repeats the processing from Step S211 on an upper protection layer.

If the processing on all the layers is completed (S214: Y), the distributed storage system reviews the owners of the virtual volumes (S215). Specifically, when some node 101 falls into a failure state, a predetermined other node 101 takes over the virtual volumes assigned to the node 101.

If the determination at Step S211 is that the abnormal resource is not in a failure state (S211: N), that is, if the state management table indicates "WARNING", the node 101 determines whether data saving is necessary (S216). This determination is made based on the extent of the risk of data loss in the distributed storage system.

It is generally known that a drive in a warning state has a higher probability to become failed compared with a drive in a normal state. However, even in a warning state, the drive may not become failed. Accordingly, the determination is a trade-off between increase in load of the storage system and risk avoidance against data loss by the saving processing.

For example, in the case where the system redundancy level is 2, it is efficient to preferentially save the data of the stripe type including more stripes in the warning state when two or more drives fall into the warning state. This is because the amount of transferred data for the saving can be small. The system redundancy level is the lowest redundancy level within the entire system.

In an example, the node 101 determines that saving is necessary at Step S216 when N or more resources are in the warning state. The number N is an integer predetermined based on the system redundancy level. If the determination is that saving is necessary (S216: Y), the node 101 executes preferential saving (S217).

The preferential saving copies data of lower redundancy level among the data stored in the resource in the warning state to a predetermined spare area. The place to save the data is the same as the place to be used in rebuilding. In the data saving area (spare area), the saved data may be overwritten at every issuance of a warning, like LRU caching.

The above-described example determines the priority level of the execution based on the redundancy level of the stripe type; the node 101 may determine the priority level of the execution based on the redundancy level of a stripe or redundancy code. Each stripe or redundant code belongs to a plurality of protection layers and the total number of the redundancy levels is the redundancy level of the data. Accordingly, as the rebuilding/saving processing progresses, the system redundancy level rises together.

To continue processing of a node (site) in another node (site) when the node (site) falls into a failure state, the owners of each virtual volume should be distributed in advance as described above. For example, different nodes in a site or nodes in different sites are determined to be the owners of the same virtual volume.

To expedite the rebuilding or saving, the rebuilding or saving processing may be executed across protection layers. For example, in executing rebuilding in response to a failure of a drive, the node may concurrently restore the data in the drive using an inter-node redundant code while executing the rebuilding in the node. The node retrieves data simultaneously from a larger number of drives, expediting the rebuilding. Whether to proceed with the data restoration across protection layers may be coordinated depending on the load to the network and the acceptable load.

Figure 22:
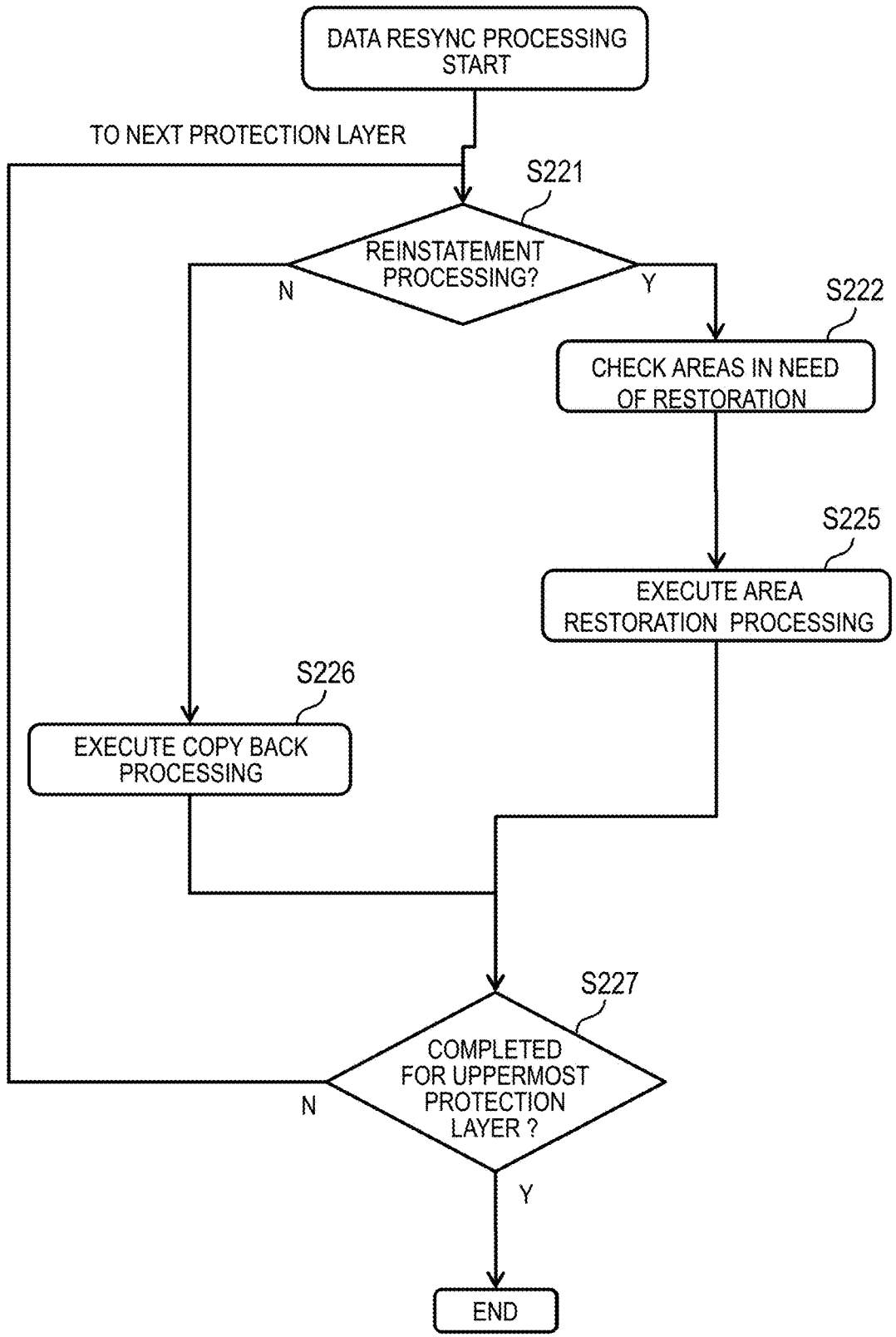
FIG. 22 is a flowchart of data resync processing.

FIG. 22 is a flowchart of data resync processing. This processing is executed as reinstatement processing from a power shut-down or copy back processing. The copy back processing is copying data in a spare area to a new resource after resource replacement subsequent to rebuilding. After completion of this processing, the state of the resource turns to the normal state.

The processor 119 of the node 101 executing this processing determines whether the processing to be performed is reinstatement processing (S221). Specifically, the processor 119 determines whether the local node is a new node or is recovering from a failure such as power shut-down. In the case of recovering from a failure, the processor 119 determines the processing is reinstatement processing (S221: Y).

More specifically, the processor 119 holds a correspondence table between identifiers uniquely identifying nodes like the mac addresses of LAN controllers and node numbers as information shared in the distributed storage system and determines whether the local node is in registration of the storage system.

In the case of reinstatement processing (S221: Y), the processor 119 checks the areas in need of restoration (S222). The specific method of checking an area in need of restoration is, for a redundant code, that the processor 119 refers to the states in the data mapping tables 701 of the other nodes 101 and acquires stripes for the redundant code in unreflected states from the other nodes 101. If the redundant code has already been rebuilt in the spare area, the processor 119 acquires the redundant code.

For write data (a stripe), another node 101 manages differences written after occurrence of the failure in a bitmap; accordingly, the processor 119 copies back only the differences from the spare area for restoration. Alternatively, the processor 119 may identify the latest update time with reference to its local reverse mapping table 703 and requests the other node 101 for valid data written after the latest update time. In this way, the processor 119 determines the write data (stripes) and redundant codes to be restored and executes area restoration processing (S225).

If the processing to be performed is not reinstatement processing (S221: N), the processor 119 executes copy back processing (S226). The processor 119 copies back the write data (stripes) and redundant codes rebuilt in the spare area. The processor 119 executes this processing in each protection layer. In the upper layers, only the redundant codes are copied. After completion of the processing in all layers (S227: Y), the processor 119 exists this flow.

Figure 23:
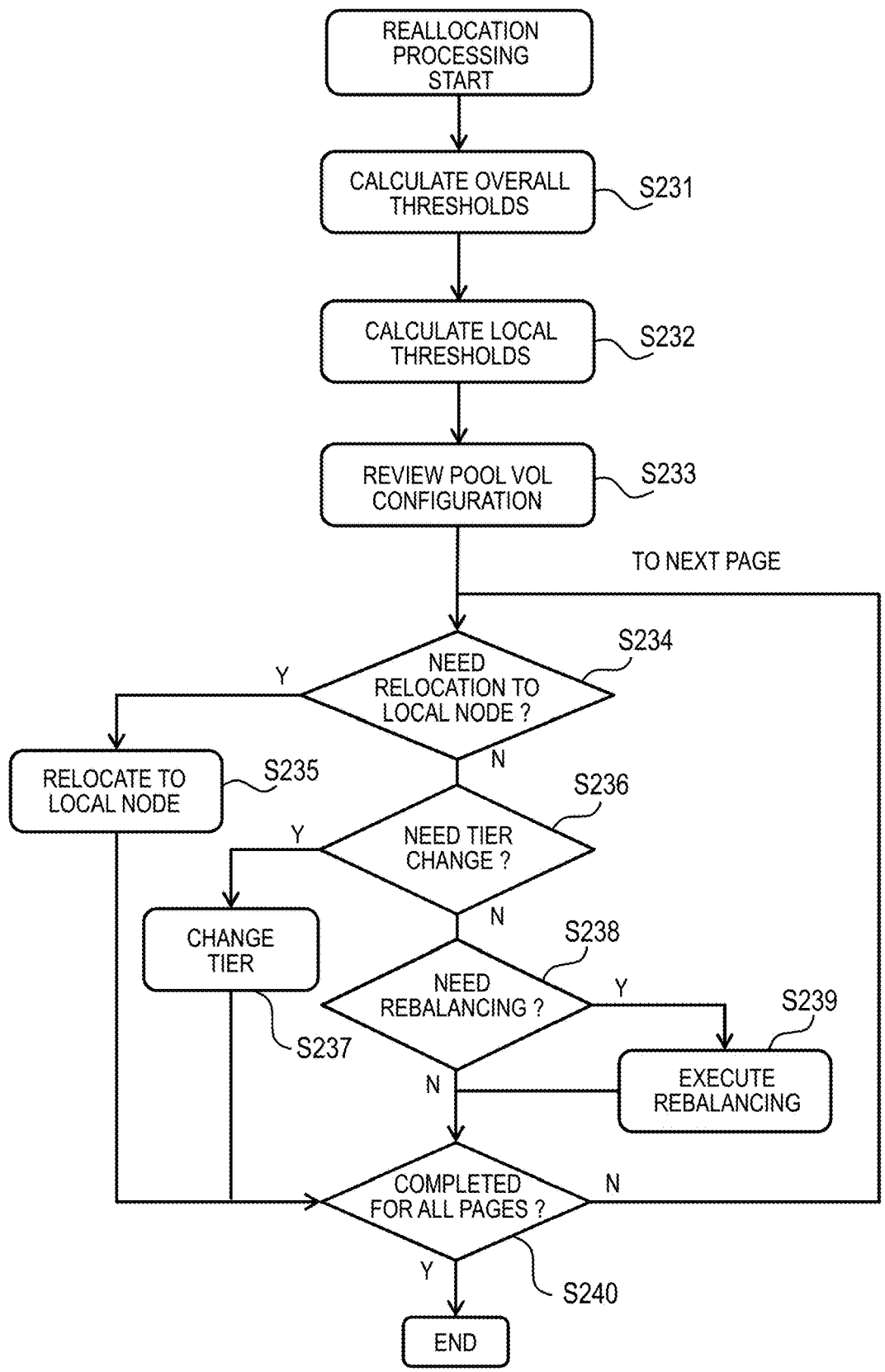
FIG. 23 is a flowchart of reallocation processing and rebalancing processing.

FIG. 23 is a flowchart of reallocation processing. This processing optimizes the page allocation in the distributed storage system. This processing is executed at an occasion such as when a new resource is added to the distributed storage system, when a resource is removed from the distributed storage system, when the capacity of some pool volume is depleted, or at every cycle of checking the change in load, by each of the relevant nodes 101.

Upon start of this processing, the processor 119 calculates overall thresholds of I/O load in the pool based on the page load distribution table 217 indicating the total I/O load to the virtual pages (S231). The total I/O load to a virtual page is a total sum of the host access loads in all owner nodes of the virtual page. The I/O load by the host accesses to the virtual page in each owner node is referred to as local load. The I/O load of a virtual page may be represented by, for example, I/O frequency.

The overall thresholds can be calculated by the same method to calculate tier allocation thresholds described with FIG. 13. Each overall threshold indicates a boundary of page I/O frequency between tiers. The capacity and I/O capability of each tier in the pool are determined in accordance with the capacities and I/O capabilities of all pool volumes in the tier. The tiers, capacities, and I/O capabilities of pool volumes are managed by not-shown management information.

Next, the processor 119 calculates local thresholds for the individual tiers based on the page load distribution table 217 indicating the total I/O load to the virtual pages and the page load distribution table 217 indicating the local loads in the local node (S232). A local threshold indicates the boundary of I/O frequency for the virtual pages the data in which is to be placed in the local node among the virtual pages in a tier determined by the overall thresholds.

Figure 24A:
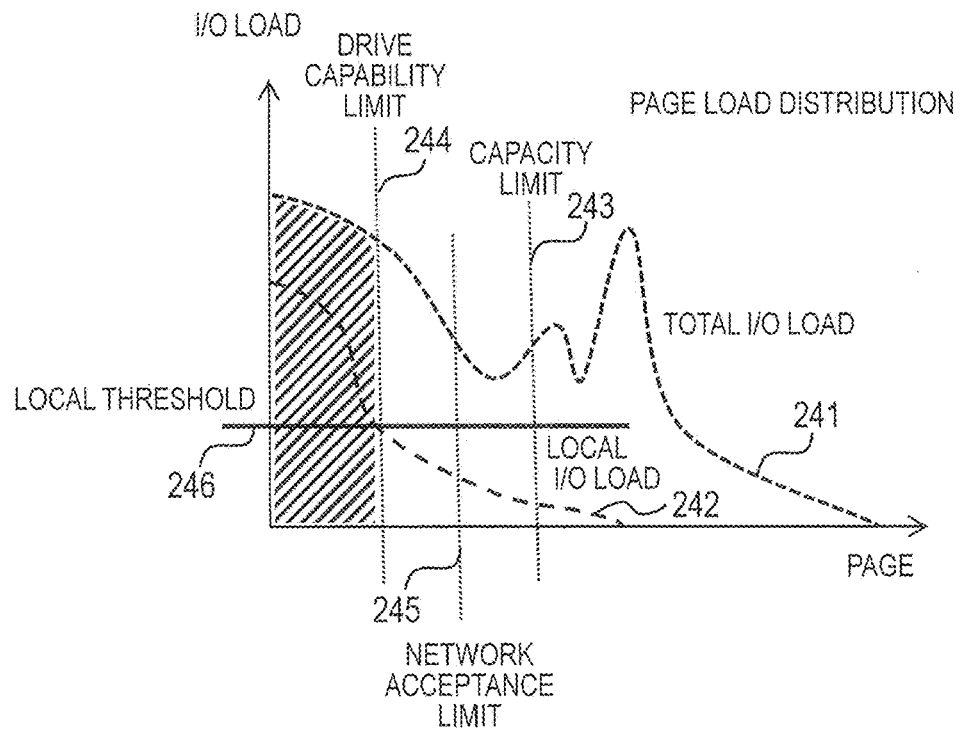
FIG. 24A illustrates an example of determining a local threshold in the reallocation processing.
Figure 24B:
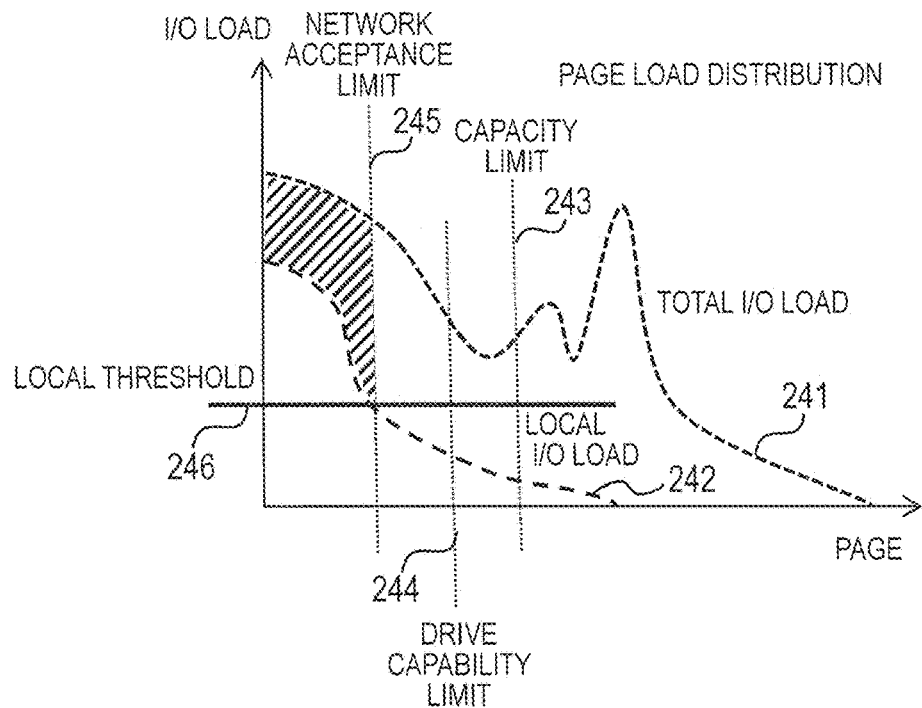
FIG. 24B illustrates an example of determining a local threshold in the reallocation processing.

FIGS. 24A and 24B each illustrate an example of a method of determining a local threshold. The way to read the graphs of FIGS. 24A and 24B is the same as that for the graph 271 in FIG. 13. The virtual axis represents page I/O load indicated by page I/O frequency and the horizontal axis represents virtual pages sorted in the descending order of local I/O load.

FIGS. 24A and 24B each indicate a total I/O load curve 241 and a local I/O load curve 242 in a single tier. As mentioned above, the virtual pages allocated to a tier are determined in accordance with the total I/O load to the virtual pages and the overall thresholds.

FIGS. 24A and 24B each indicate I/O load distribution to virtual pages allocated to one tier among the virtual pages owned by the local node 101. The virtual pages owned by the local node 101 can include virtual pages allocated to local pool volumes and in addition, virtual pages allocated to remote pool volumes.

FIGS. 24A and 24B each indicate a local threshold 246. The virtual pages showing the local I/O load higher than the local threshold 246 are allocated to the local pool volume. The data in the virtual pages currently allocated to remote pool volumes is relocated to the local drives 113.

The virtual pages showing the local I/O load equal to or lower than the local threshold 246 are allocated to the local pool volume or remote pool volumes. Specifically, the processor 119 determines the virtual pages currently allocated to remote pool volumes are to be kept allocated to the remote pool volumes. The processor 119 determines whether to relocate (rebalance) the data in the virtual pages currently allocated to the local pool volume to other nodes 101 depending on the free space in the local pool volume. The details will be described later.

FIGS. 24A and 24B each indicate a capacity limit 243, a drive capability limit 244, and a network acceptance limit 245. The processor 119 determines the local threshold 246 so that the virtual pages allocated to the local pool volume will be in the range below these limit values.

In this example, the processor 119 determines the page I/O load at the intersection of the lowest value among the capacity limit 243, the drive capability limit 244, and the network acceptance limit 245 and the local I/O load curve 242 to be the local threshold 246. In FIG. 24A, the drive capability limit 244 has the lowest value; in FIG. 24B, the network acceptance limit 245 has the lowest value.

The capacity limit 243 is a limit of the capacity allowing allocation to the local node. The capacity limit 243 is determined from the local pool volume capacity and the page size by a predetermined formula. The capacity limit 243 is determined so that the total size of all the virtual pages allocated to the local pool volume will be equal to or smaller than the local pool volume capacity. The local pool volume capacity is the capacity of the pool volume formed of the local drives 113.

The drive capability limit 244 is determined from the access capability of the local pool volume and the total I/O load curve 241 by a predetermined formula. The access capability of the pool volume is represented by, for example, an I/O amount per unit time. The drive capability limit 244 is determined so that the total sum of the I/O loads to all the virtual pages allocated to the local pool volume will be equal to or lower than the access capability of the local pool volume. The hatched area in FIG. 24A represents the total sum of the I/O loads to all the virtual pages allocated to the local pool volume.

The hatched area in FIG. 24B represents the total sum of the I/O loads to all the virtual pages allocated to the remote pool volumes, that is, (total I/O load−local I/O load). The network acceptance limit 245 is determined from the total sum of the I/O loads to the remote virtual volumes and the network capability by a predetermined formula. The network capability is represented by, for example, an I/O amount per unit time.

When a virtual page is allocated to the local pool volume, the node 101 receives remote accesses to the virtual page via the network. Accordingly, the processor 119 determines the network acceptance limit 245 so that the remote I/O load will fall within the network capability.

The above-described local threshold determined based on the drive capability and the network capability can minimize the occurrence of bottleneck in data transfer in host I/Os. The drive capability limit 244 is particularly effective to minimize the occurrence of bottleneck in the network caused by data located in remote nodes. It should be noted that the capacity limit 243 is essential but the drive capability limit 244 and the network acceptance limit 245 do not need to be used.

Next, the processor 119 reviews the pool volume configuration in the pool (S233). The processor 119 has already calculated the total capacity and the total I/O load for the virtual pages (local virtual pages) to be allocated to the local pool volume in each tier in determining the local threshold at Step S232.

The processor 119 determines the number of pool volumes 1303C to be mapped to remote pool volumes 1303B based on the capacity and the capability of the local drives 113 in each tier. If the capacity and the capability of the local drives 113 are insufficient for the total capacity or total I/O load of local virtual pages, the processor 119 increases pool volumes 1303C.

Next, the processor 119 selects virtual pages of the virtual volumes owned by the local node 101 one by one to repeat execution of the following steps.

First, the processor 119 determines whether to relocate the data in the virtual page from a remote pool volume to a local pool volume (S234). Specifically, the processor determines the tier for the virtual volume with reference to the overall thresholds and further determines whether to allocate the virtual page to the local pool volume with reference to the local threshold. As described above, the processor 119 determines to allocate a virtual page with I/O load higher than the local threshold to the local pool volume. The processor 119 determines that a virtual page with I/O load lower than the local threshold does not need to be allocated to the local pool volume.

If the determination is to allocate the virtual page to the local pool volume and if the virtual page is currently allocated to a remote pool volume, the processor 119 determines to relocate the data of the virtual page from the remote pool volume to the local pool volume.

If the determination is that the virtual page does not need to be allocated to the local pool volume, or if the virtual page is currently allocated to the local pool volume, the processor 119 determines that the data of the virtual page does not need to be relocated to the local pool volume.

If the determination is that data relocation is necessary (S234: Y), the processor 119 relocates the data of the virtual page to the local pool volume (local drives 113) (S235). This relocation includes necessary tier change of the virtual page.

The specific procedure includes the following steps. Step 1 stages the data to the local cache 181. Step 2 changes the pool volume area corresponding to the virtual page in the page mapping table 215 to the area in the local pool volume.

Step 3 destages the data to the local pool volume. Step 4 releases the cache area. Step 5 clears the page area of the previously allocated remote pool volume (for example by writing zero data) to free the area. That is to say, this step connects this area to the free list 801 in the local area control table 214 and reduces the used amount and the valid amount in the local area amount table 802.

Each node 101 determines virtual pages to be relocated to its local pool volume using its own local threshold. As a result, even if a virtual page is owned by a plurality of nodes 101, one node to hold the virtual page can be determined.

For example, if a node 101 currently holding data of a virtual page and another node 101 both determine to allocate the virtual page to their own local pool volumes, the data is relocated to the other node 101. Accordingly, the node 101 that is a node different from the node 101 holding data of the virtual page and has last determined to allocate the virtual page to its own local pool volume holds the data of the virtual page.

If the determination is that relocating the data of the virtual page to the local pool volume is not necessary (S234: N), the processor 119 determines whether tier change is necessary (S236). In the case where the virtual page is determined to be allocated to the local pool volume and is currently allocated to the local pool volume, if the current tier is different from the tier determined from the overall thresholds, the processor 119 determines tier change is necessary.

If the determination is that tier change is necessary (S236: Y), the processor 119 executes tier change (S237). The specific method of the tier change can be implemented by basically the same method of Step S235.

If the determination is that tier change is not necessary (S236: N), the processor 119 determines whether rebalancing is necessary with the virtual page (S238). In this example, rebalancing with a virtual page relocates the data of the virtual page from the current pool volume to a remote pool volume.

The processor 119 determines that rebalancing by allocating the virtual page being processed to a remote pool volume is necessary if determining that the virtual page does not need to be allocated to the local pool volume and that the pool volume currently allocated the virtual volume is depleted.

The processor 119 refers to the local area amount table 802 of the tier and determines whether the area of the entry associated with the virtual page is depleted (insufficient). For example, if the amount obtained by subtracting the valid amount from the target amount is less than a threshold, the processor 119 determines that the area is depleted.

If the determination is that rebalancing is necessary (S238: Y), the processor 119 relocates the data of the virtual page from the local pool volume (local node) to a remote pool volume (remote node) (S239). The specific method of page relocation in the rebalancing is implemented by basically the same method of Step S235.

The processor 119 makes inquiries to the other nodes 101 or acquires the local area amount tables 802 from the other nodes 101 to select a node 101 having a sufficient area to store the data of the virtual page as the transfer destination node.

The determination whether a node 101 has a sufficient area is based on the local area amount table 802 of the same tier in the node. The transfer destination node 101 may be selected from the owner nodes of the virtual page and the nodes belonging to the stripe type of the virtual page, for example.

If some unprocessed virtual page remains (S241: N), the processor 119 returns to Step 234. When processing on all the virtual pages has been completed (S241: Y), the processor 119 terminates the processing.

Figure 25A:
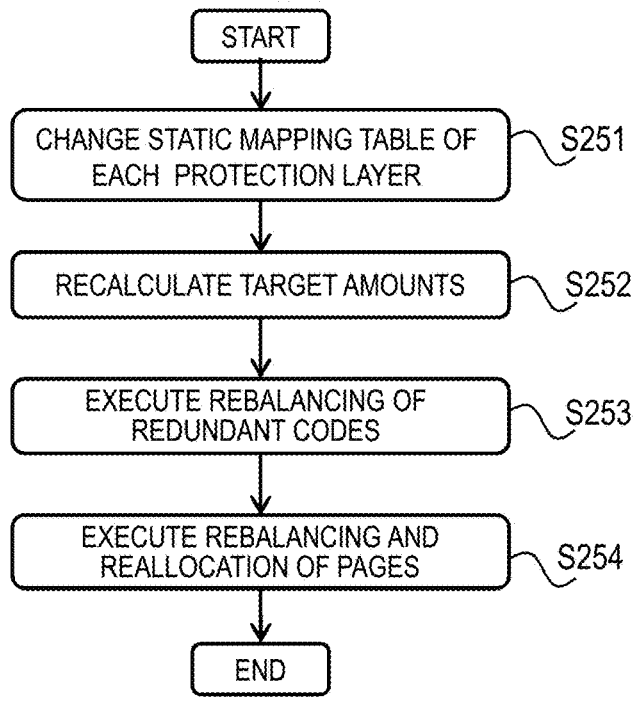
FIG. 25A is a flowchart of configuration change processing.

FIG. 25A is a flowchart of configuration change processing. This processing is executed to change the configuration of the distributed storage system. For example, when a new resource is added to the distributed storage system, each node executes this processing.

Upon start of this processing, the processor 119 alters the static mapping table for each protection layer (S251). For example, when a node is added, each node 101 in the site protection layer increases the stripe types and changes the data nodes and redundant code nodes of individual stripe types. For example, one node 101 determines new node configurations of individual stripe types and the other nodes 101 each update its static mapping table in accordance with it.

The node 101 changes some of the stripe nodes of a part of the stripe types in the current mapping table 211 into the newly added node, and further, includes the some of the nodes into a new stripe type.

Figure 25B:
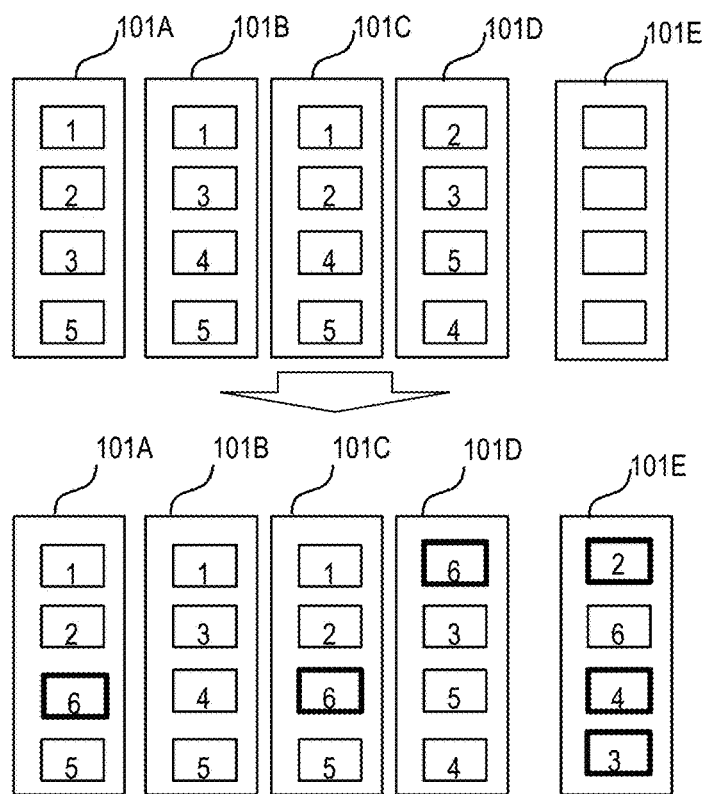
FIG. 25B illustrates an example of adding a stripe type and reallocating stripes when a node is added.

FIG. 25B illustrates an example of adding a stripe type and reallocating stripes when a node is added. The nodes 101A to 101D are existing nodes and the node 101E is the added node. The rectangles in each node represent data locations (addresses) of stripes and numerals in the rectangles indicate stripe type numbers. Stripe Type 1 to Stripe Type 5 are existing stripe types and Stripe Type 6 is the added stripe type.

Before the addition, the stripe addresses in the node 101E do not belong to any stripe type; the rectangles are empty. In the nodes 101A, 101C, and 101D or a part of the existing nodes, the stripe types a part of their stripe addresses belong to are changed to Stripe Type 6. A part of the stripe addresses of the added node 101E are allocated to Stripe Types 2, 3, and 4 that are changed in the existing nodes.

The distributing the stripes of one stripe type to different nodes can increase the tolerance against a node failure. The redundant code nodes are redetermined so that the used amount for the site redundant codes Q will be balanced among the added node and the existing nodes as well as possible.

Although the foregoing example has described the case of node addition, the configuration change processing can be executed in the same way when a drive or a site is added.

Next, each node 101 recalculates the target amounts in the local area amount table 802 (S252). For example, as shown in the local area amount table 802 in FIG. 9, the recalculating the target amounts determines the target amounts for individual site stripe types, for the redundant codes in individual protection layers, and for the spare area. The target amount for the redundant code in each protection layer can be determined by, for example, the following formula in accordance with a data protection policy (XDYP: Maximum number of data units X, number of redundant codes Y) specified by the user (which will be described with FIG. 27).

Target amount=Total capacity×Max($Y\div$Number of resources,$Y\div(X+Y)$), where Number of resources>$Y$ Total capacity is the total capacity of the local areas of the node 101; Max (A, B) is the maximum value in A and B; and Number of resources is the number of resources in the protection layer. The number of resources in the node protection layer is the number of drives in the node and the number of resources in the site protection layer is the number of nodes in the site.

For example, the target amount for the spare area is a fixed value and the target amount for each site stripe type is an equal division of the remaining amount in the total capacity.

Next, each node 110 executes rebalancing of redundant codes (S253). This step is replacing the redundant codes with respect to the differences in the static mapping table for individual protection layers between before and after the change. Specifically, each node 110 sends difference data (an intermediate code) to the redundant code nodes and the redundant code nodes update the old redundant codes with the intermediate codes. Instead of rebalancing the redundant codes, each node may store the previous static mapping tables for the protection layers and hold the correspondence relations of the redundant codes.

Lastly, the processor 119 of each node 110 executes rebalancing and reallocation of pages (S254). This step reallocates pages to the newly added node or drive. The specific method is the same as described with reference to FIG. 23. If any of the determined target amounts for the redundant codes and spare area cannot be attained, the target amount may gradually be lowered using a known technique such as feedback control. This configuration can control data allocation to the nodes included in the system while considering the overall performance of the system.

Figure 26:
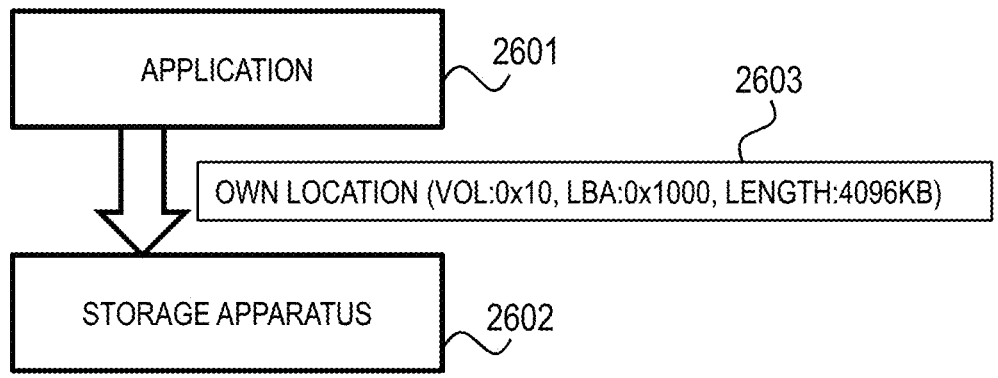
FIG. 26 illustrates an example of a management I/F for a command line.

FIG. 26 illustrates an example of a management I/F for a command line. An application program 2601, an API 2603, and a storage apparatus 2602 implemented by software are running on the same node 101.

The application program 2601 sends a command to the storage apparatus 2602 through the API 2603 with designation of a virtual page in a virtual volume to be allocated to a local logical page of the storage apparatus 2602. The application program 2601 designates the virtual page with, for example, a virtual volume number, an LBA, and a data length. This combination enables page-by-page designation.

The storage apparatus 2602 determines the node having a logical page allocated the designated virtual page with reference to the page mapping table 215. If the virtual page is allocated a logical page of a pool volume in a different node and the data is stored in a drive of the different node, the storage apparatus 2602 retrieves the data from the different node, allocates the designated virtual page to a logical page of the local pool volume, and stores the data to a local drive. If no page is allocated to the storage area designated by the aforementioned API 2603, the storage apparatus 2602 stores data to a local drive when newly allocating a page in accordance with a write request.

This configuration allows a logical page that will be used by the application program 2601 locally next time to be prepared in the local node in advance, achieving page allocation optimum to the application.

The node 101 may receive the designation of a virtual page in a virtual volume to be allocated to a local logical page (local storage device) from a user via a user interface. As described above, a virtual page is designated with an identifier of a virtual volume and a logical address in the virtual volume. Furthermore, the node 101 may receive an instruction for allocation of a virtual page to a logical page in a different node.

Figure 27:
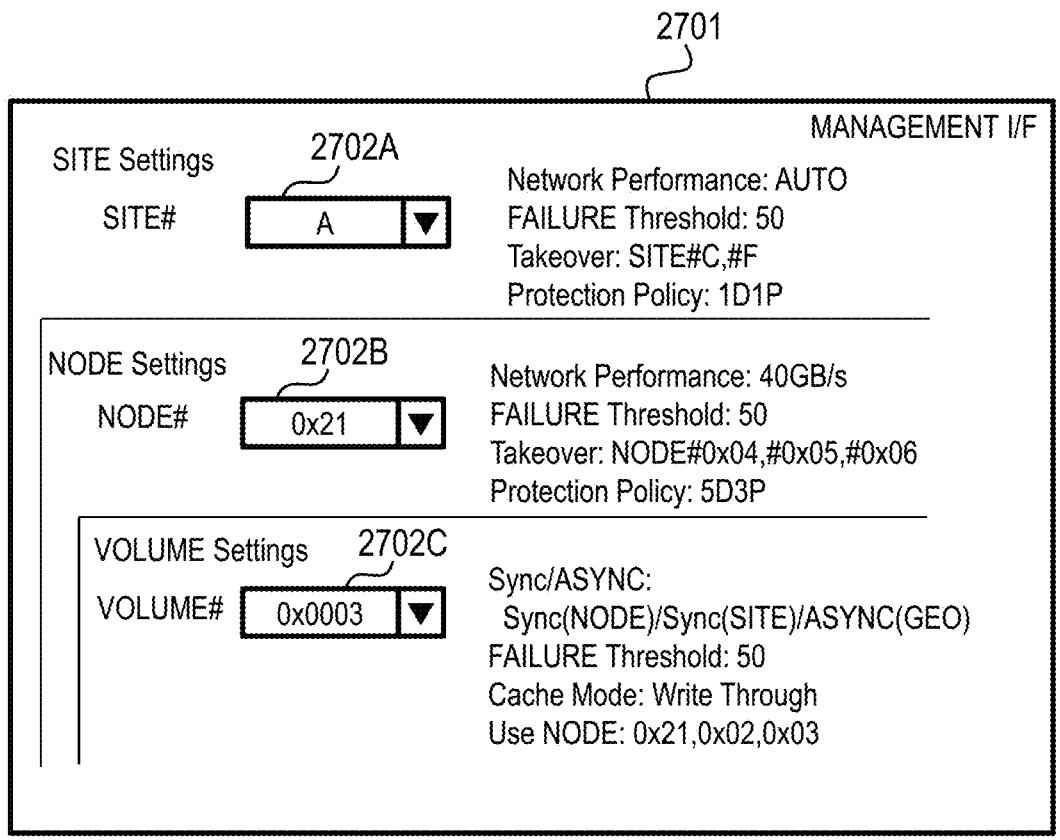
FIG. 27 illustrates an example of a management I/F for a GUI in the distributed storage system.

FIG. 27 illustrates an example of a management I/F for a GUI in the distributed storage system. The GUI 2701 is an interface for the user to provide various settings to the distributed storage system. The node 101 accepts various settings from the user through the input/output devices.

The GUI 2701 accepts designation of resources for individual protection layers (2702A to 2702C) to enable hierarchical settings. For example, when a site A (2702A) is designated, the GUI 2701 accepts selection of nodes (2702B) in the designated site. When a node is designated, the GUI 2701 accepts settings on the volumes (2702C) in the designated node.

The items commonly set to the sites, nodes, and volumes are described. The network performance is information on network bandwidth. When AUTO is selected, each node 101 automatically determines a network bandwidth using the result of measurement of the network bandwidth. If the user specifies it, each node uses the specified network bandwidth in determining page allocation.

The failure threshold indicates the number of errors in, for example, communications to the resource, to determine the resource is failed. The takeover specifies a resource to take over the resource when a failure occurs in the resource. A plurality of resources can be selected. If the user does not specify the resource to take over, the storage system may automatically select it.

The settings allowing protection layer-specific specification include protection policy. The data protection policies (XDYP: Maximum number of data units X, Number of redundant codes Y) for individual protection layers can be specified. If the number of nodes is less than X+Y, or if storage capacities are different among the resources, the storage system uses a proximate value in the real configuration.

The settings allowing virtual volume-specific specification include SYNC/ASYNC information. Either synchronous copy or asynchronous copy can be selected for each virtual volume. Further, disabling copy can be selected for each protection layer.

For example, assume that the geo protection layer may be set to copy disabled. Then, virtual volumes cannot be rebuilt at a site failure and the rebuilding at a site failure is skipped. As understood from this example, operations to asynchronously copy important data and to synchronously copy more important data are available among sites.

The cache mode provides a choice of "write" or "write back". The write mode reflects write data to the drive simultaneously with storing write data to the cache and reports the completion of write to the host (application program). The write back mode reports the completion of write to the host (application program) after storing write data to the cache.

Specifying the use node determines the nodes to mount the virtual volume. This setting is reflected to the virtual volume management table 218.

Figure 28:
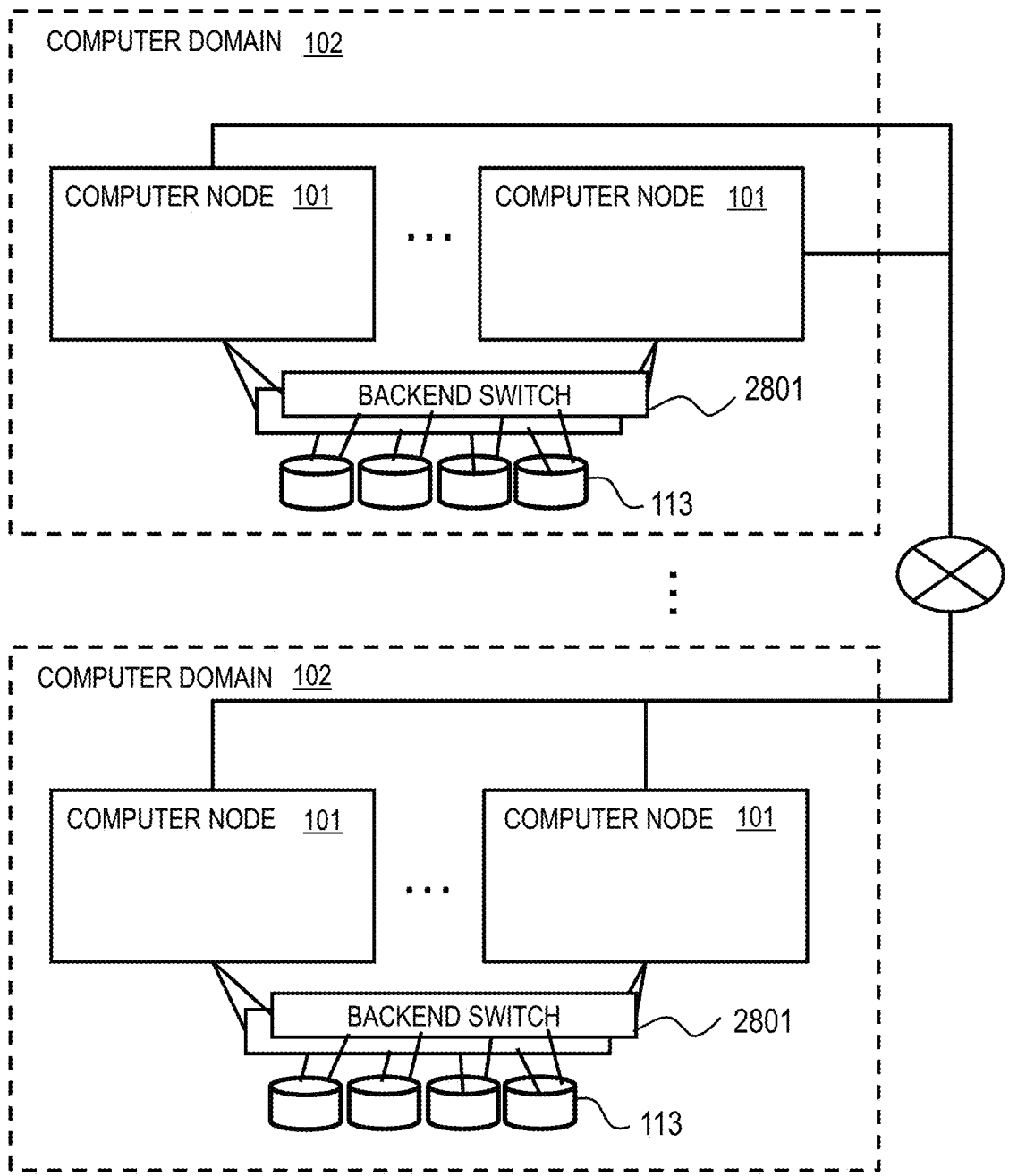
FIG. 28 illustrates an example of hardware configuration of a distributed storage system.

FIG. 28 illustrates an example of hardware configuration of a distributed storage system. The difference from the configuration example shown in FIG. 1 is that a backend switch 2801 is shared by a plurality of nodes 101. The drives 113 shared through the backend switch 2801 can be accessed from the nodes 101 sharing the backend switch 2801 not via another node and the drives 113 are the local drives managed by these nodes 101. Hence, one drive 113 can be included in a plurality of nodes 101 through the backend switch 2801.

In the case of shared backend configuration, the shared range may be defined as a domain to implement multidimensional data protection in a domain and among domains. Alternatively, depending on the transfer bandwidth, an area having a comparatively wide bandwidth may be defined as a domain.

Embodiment 2

Figure 29:
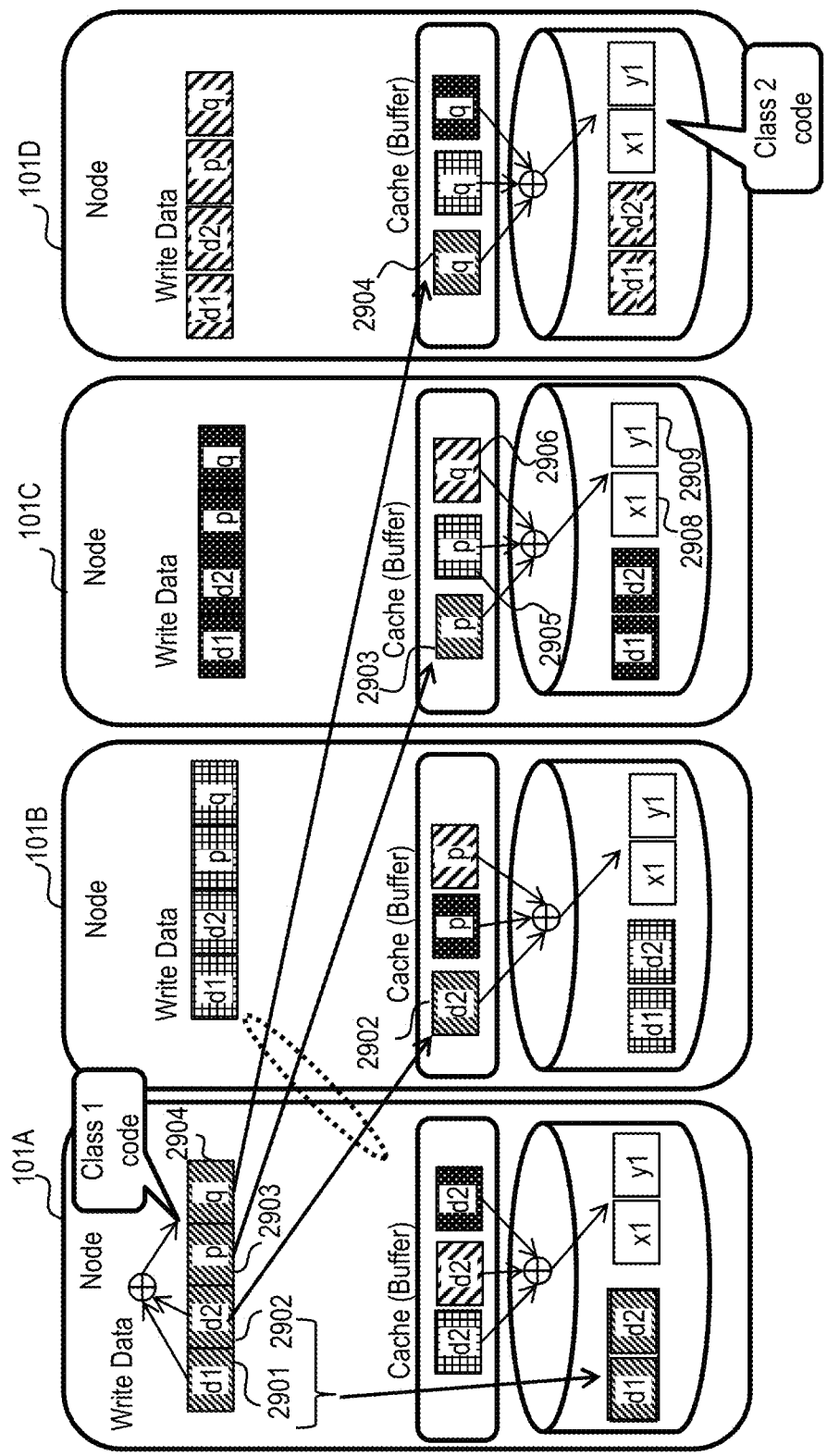
FIG. 29 illustrates a technique for improving efficiency in data transfer among nodes to implement redundancy in Embodiment 2.

FIG. 29 illustrates a technique for improving efficiency in data transfer among nodes to implement redundancy. In the above-described technique, the amount of data to be transferred increases in proportion to the redundancy level for the amount of data to be written to a node. For example, to enable data recovery when two nodes are failed in the example of FIG. 1, write data is transferred from one node to the cache memories 181 of two nodes.

For example, the write data DATA1 (1501A) written to the node 101A is transferred to the cache memories 181 of the node 101B and the node 101D. That is to say, this example generates network transfer twice as much as the amount of data written to a node. Hereinafter, a technique to reduce the transfer for redundant code creation in other nodes is described.

FIG. 29 illustrates an example where four nodes of the nodes 101A to 101D protect data with a 2D2P-redundancy configuration. That is to say, this system has redundancy capable of recovering all data when two nodes are failed.

For example, the node 101A divides received write data having a long data length into two blocks (d1 and d2 blocks) 2901 and 2902 and further, creates two parities (p and q parities) 2903 and 2904 as in-node redundant codes. The parities are also data blocks. Data block is a generic term including data unit. The p parity 2901 and the q parity 2902 are primary redundant codes (Class 1 codes). Next, the node 101A distributes copies of the write data and the parities to the caches (buffers) of the nodes 101B to 101D. A plurality of data blocks combined together may constitute a data block.

This embodiment distributes copies of one write data block (d2 block) 2902 and two parities (p and q parities) 2903 and 2904 to three nodes 101B to 101D. When the copies have been distributed, synchronous write processing is completed because required redundancy is attained (data recovery is available when two nodes are failed).

Likewise, each of the nodes 101B to 101D divides received write data into two blocks (d1 and d2 blocks) and creates p and q parities. Each of the nodes 101B to 101D distributes copies of one write data block (d2 data block) and two parities (p and q parities) to the caches (buffers) of the other three nodes. Each node stores a data block (write data or a parity) received from each of the other three nodes to the cache.

Each of the nodes 101A to 101D asynchronously creates secondary redundant codes (x1 and y1 parities) from the data blocks (each of them is write data or a parity) gathered from the other three nodes, writes them to the local drive, and releases the cache. These redundant codes (x1 and y1 parities) are referred to as Class 2 codes. The Class 2 codes correspond to redundant codes explained with FIG. 1.

For example, the node 101C receives a p parity 2903 from the node 101A, a q parity 2905 from the node 101B, and a q parity 2906 from the node 101D. The node 101C creates an x1 parity 2908 and a y1 parity 2909 from them, writes the x1 parity 2908 and the y1 parity 2909 to the local drive, and releases the cache.

In addition, each of the nodes 101A to 101D writes write data (d1+d2) to the local drive and releases the cache. For example, the node 101A writes a d1 block 2901 and a d2 block 2902 to the local drive and releases the cache.

The example of FIG. 1 transfers write data (d1+d2) to other two nodes to enable data recovery when two nodes are failed. In contrast, this embodiment transfers a part (d2) of the write data and primary redundant codes (p and q parities) created from the write data to other nodes. Accordingly, this embodiment achieves efficiency in data transfer among nodes while maintaining the required redundancy. Meanwhile, all the data (d1+d2) of a stripe is stored in the local drive.

Although FIG. 29 provides an example of a 2D2P-redundancy configuration, the technique of this embodiment is applicable to any mDnP configuration (m and n are natural numbers). The write data (mD) is stored in the local drive and data in a redundancy level of the number reduced by one (a redundancy level of n−1) is transferred to other nodes.

For example, in a 3D2P (d1, d2, d3, p, q) configuration, the write data (d1+d2+d3) are stored in the local drive and data blocks d2, d3, p, and q are transferred to different other nodes. The combination of data blocks to be transferred is not limited to this; for example, data blocks d1, d2, d3, and p may be transferred to other nodes.

Combining the technique of this embodiment with the technique of Embodiment 1, which dynamically selects a stripe from one stripe type of stripes, creates redundant codes from the selected stripe, and stores the information on the redundant codes in the form of metadata (for example, the log-structured mapping table 213), reduces the frequency of read-modify-write and the amount of data transferred in the network, achieving high performance in write processing. The technique of this embodiment is applicable to a system having a plurality of protection layers described prior to this embodiment.

In the cases where the data length of the received write data is short (for example, in the cases of random write), data transfer to implement the redundancy less affects the network bandwidth. Accordingly, the redundancy implementation processing of this embodiment may be executed only when the data length is longer than a threshold (or sequential write). In the cases where the data length is shorter than the threshold, the technique in FIG. 1 can be applied.

As a result, the load to the processor and the usage of the network bandwidth can be improved. In this case, the system adds information indicating whether the technique of creating Class 2 codes is applied to the metadata (for example, the log-structured mapping table 213) to switch the method of data processing in accordance with this information. Alternatively, the system may write Class 1 codes to the local drive as in-node parities to improve the efficiency in parity creation processing.

Figure 30:
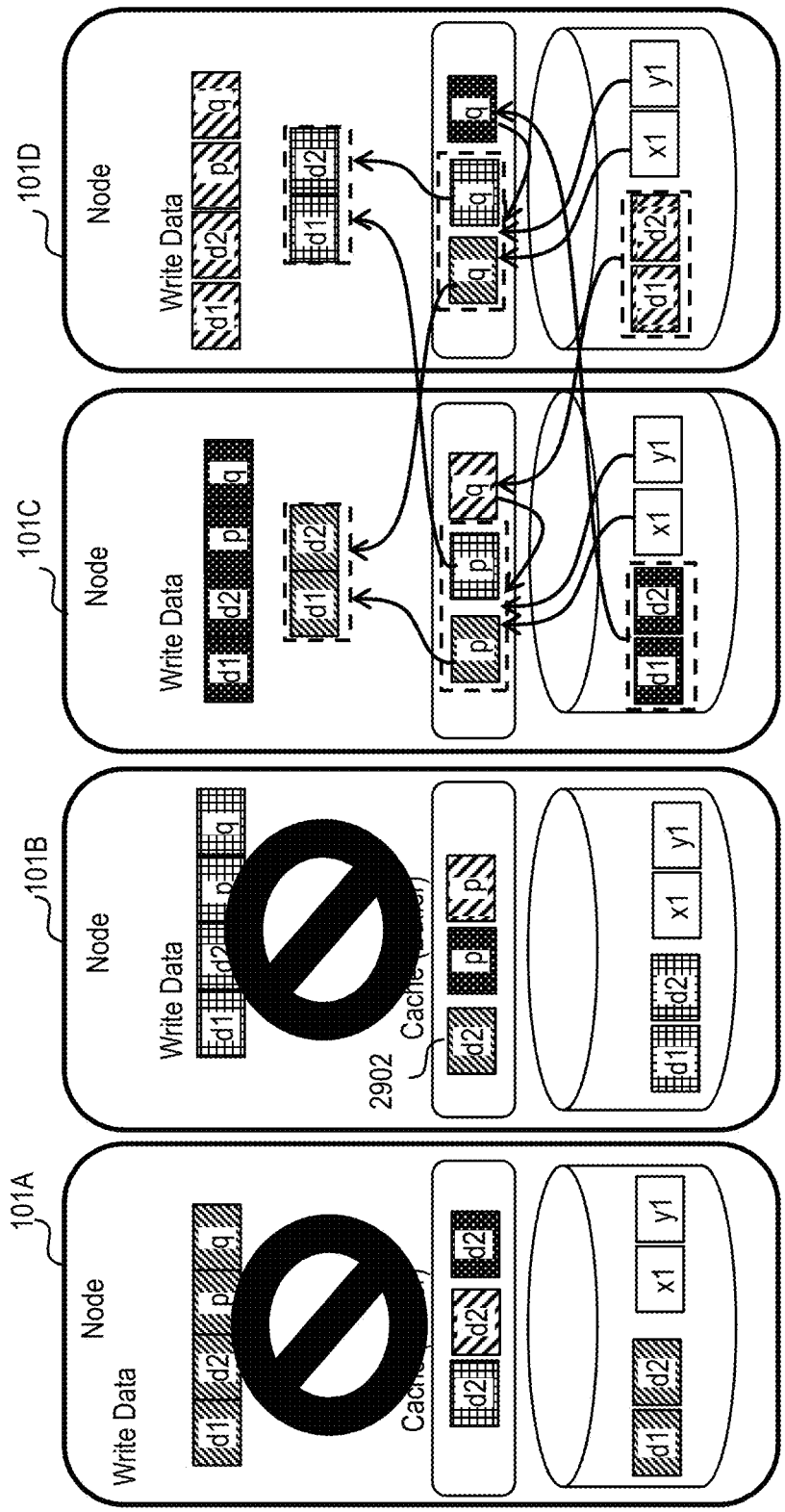
FIG. 30 illustrates a data restoration method in the technique for improving efficiency in data transfer among nodes to implement redundancy in Embodiment 2 described with reference to FIG. 29.

FIG. 30 illustrates a data restoration method in the technique for improving efficiency in data transfer among nodes to implement redundancy in Embodiment 2 described with reference to FIG. 29. FIG. 30 illustrates an example of restoring write data when the node 101A and 101B are failed.

The nodes 101C and 101D each restore the Class 1 codes from the Class 2 codes and further, restore the user data of the nodes 101A and 101B from the Class 1 codes.

Specifically, the node 101C restores the p parities of the nodes 101A and 101B from the q parity of the node 101D acquired from the node 101D and the x1 and y1 parities in the local storage. The node 101D creates a q parity of the node 101D from the user data (local user data) of the node 101D (the q parity stored in the local storage can be used, if it exists).

The node 101D restores the q parities of the node 101A and 101B from the q parity of the node 101C acquired from the node 101C and the x1 and y1 parities in the local storage. The node 101C creates a q parity of the node 101C from the user data of the node 101C.

Further, the node 101C restores the user data d1 and d2 of the node 101A from the q parity of the node 101A acquired from the node 101D and the restored p parity of the node 101A. The node 101D restores the user data d1 and d2 of the node 101B from the p parity of the node 101B acquired from the node 101C and the restored q parity of the node 101B. In this way, the write data can be recovered through two-step restoration.

Embodiment 3

Off-Loading Log Structuring (to Drive)+Parity Creation (to Drive)

Figure 31:
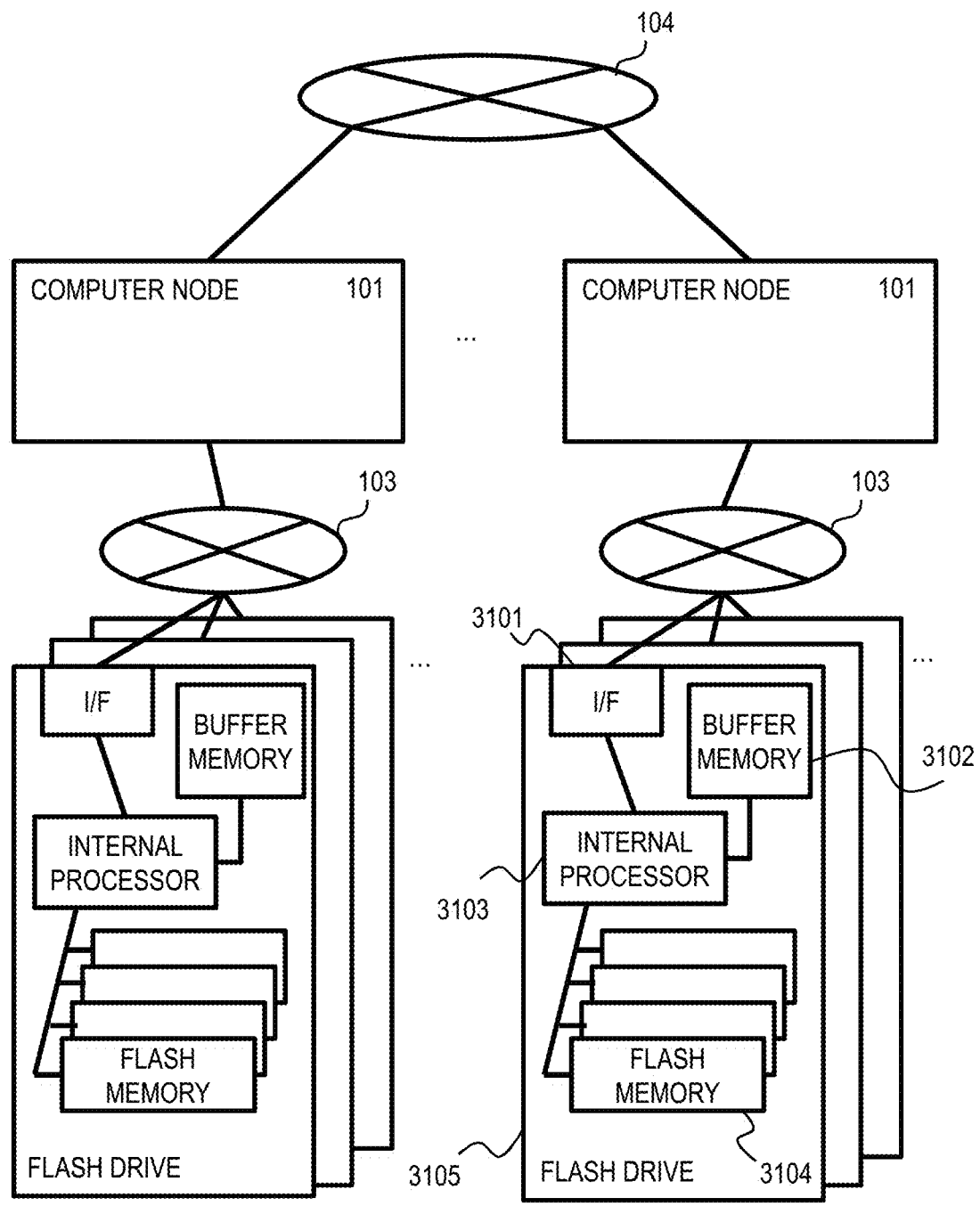
FIG. 31 illustrates an example of a hardware configuration of a distributed storage system in Embodiment 3.

FIG. 31 illustrates an example of a hardware configuration of a distributed storage system. The main difference from the configuration example in FIG. 3 is that the backend port of the computer node 101 connected with the network 104 is connected with a plurality of flash drives 3105 via a virtual or physical network 103. One site includes one or more computer nodes 101.

Each computer node 101 is capable of communicating with each of the flash drives 3105 via the network 103 without mediation by any other computer node to use the flash drives 3105 as local drives. One flash drive 3105 communicates with only one computer node 101.

The backend network 103 may connect a plurality of computer nodes 101; the computer nodes 101 connected by the backend network 103 communicate with one another using the backend network 103. The nodes not connected by the backend network 103 communicate with one another using an external network 104, for example.

Each flash drive 3105 of an example of a storage drive includes an I/F 3101 for connecting to the computer node 101, a buffer memory 3102 for storing data on a temporary basis, an internal processor 3103 for controlling the flash drive 3105, and a plurality of flash memories 3104 for storing data.

Overview

Figure 32:
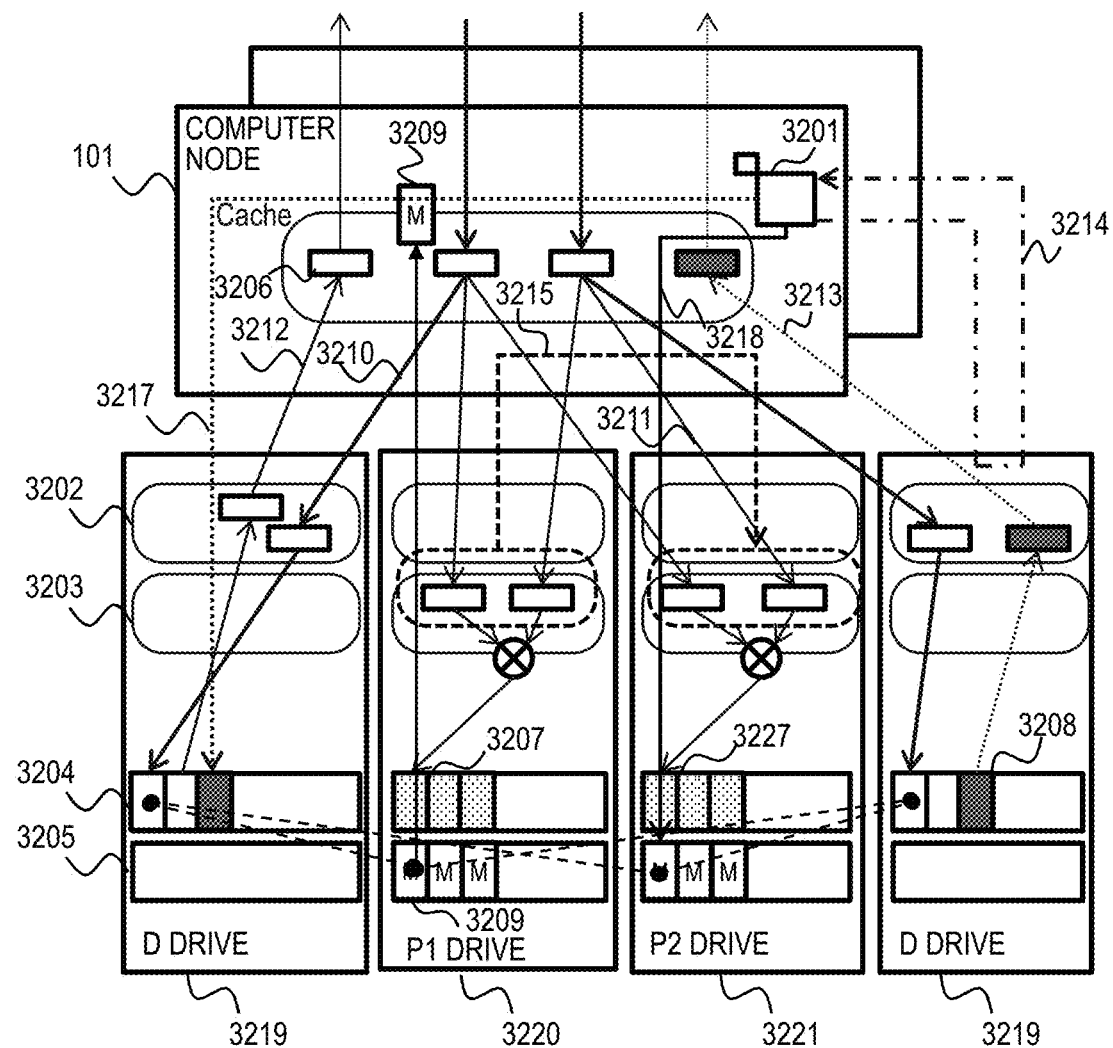
FIG. 32 illustrates an overview of Embodiment 3.

FIG. 32 illustrates an overview of this embodiment. This embodiment performs parity creation processing and data storage processing using a log-structured scheme within the flash drives. As a result, the computer node performs write processing without concerning the creation of redundant codes or the log-structured scheme; the time required for the write processing can be reduced.

A computer node 101 determines the drives to store write data and redundant codes using a static mapping table (for example, the site static mapping table 211) described in Embodiment 1, for example. Instead of the computer nodes in Embodiment 1, drives are determined. For example, two D drives 3219, a P1 drive 3220, and a P2 drive 3221 in FIG. 32 correspond to data drives and redundant code drives for one stripe type.

For example, the computer node 101 selects an entry of the static mapping table based on the access destination (for example, the volume identifier and the in-volume address) of the write data designated by the host and determines the drives specified in the entry to be the drives to store the write data and redundant codes. In the case where the site protection layer is provided, the computer node 101 transfers the write data to a computer node 101 in a different site. The host program may run on the computer node 101.

For example, in writing write data to a drive, the computer node 101 writes data to a drive (D drive) 3219 for storing write data and a drive (P1 drive) 3220 for storing the main parity (double write). In this operation, the computer node 101 performs a write to the D drive 3219 using a normal write command (D_WRITE) (3210) to write the data to the medium (LBA area) 3204 through the data buffer 3202 of the D drive 3219.

The computer node 101 issues a parity write command (P_WRITE) to the P1 drive 3220 and writes the data together with the storage location information of the data stored in the D drive 3219 (3211). After writing the data to the parity creation buffer 3203, the P1 drive 3220 creates a P1 parity 3207 within the drive and writes the P1 parity 3207 to the medium 3204.

As described about creating a redundant code for a stripe type in Embodiment 1, the P1 drive 3220 dynamically combines data blocks written to the parity creation buffer 3203 to create a P1 parity 3227. The P1 drive 3220 writes the storage location of the data used to create the P1 parity 3207 to the metadata storage area 3205 as metadata 3209.

For example, in the case where the number of parities is two, the computer node 101 writes data to the drive (P2 drive) 3221 to store the second parity or sub parity (P2 parity), in addition to the D drive 3219 and the P1 drive 3220 (triple write). The P2 drive 3221 stores data to the parity creation buffer 3203 and dynamically combines the data blocks written to the parity creation buffer 3203 to create a P2 parity 3227, like the P1 drive 3220.

In creating a P2 parity, the combination of data blocks for the P2 drive 3221 to create the parity should be identical to the combination of data blocks for the P1 drive 3220 to create a parity. After creating a P1 parity, the P1 drive 3220 notifies the P2 drive 3221 of the combination of data blocks used to create the P1 parity (P_GET, P_PUSH) through the computer node 101 (3215). The P2 drive 3221 then creates a P2 parity using the specified combination of data blocks.

In reading some latest data, the computer node 101 retrieves the latest data 3206 from the D drive 3219 with a normal read command (D_READ) (3212). In reading some old data 3208, the computer node 101 retrieves the old data 3208 from the D drive 3219 with a read command (OLD_D_READ) to retrieve the old data 3208 (3213).

The computer node 101 monitors the usage (free space) of the drives 3219 to 3221 to preserve the area to be written in the log-structured scheme and executes garbage collection processing as needed. The space management job 3201 of the computer node 101 issues a command (STAT_GET) to acquire the usage (free space) of the drives upon completion of a write or periodically to monitor and detect the usage of the drives (free space of the drives) (3214). When the usage is higher than a threshold (the free space is smaller than a threshold) and depletion of the free space of a drive is detected, the computer node 101 executes garbage collection processing.

The garbage collection processing issues a command (SEARCH) to detect a parity to be deleted to the P2 drive 3221 (3218) and acquires information on the storage location of the parity to be deleted and information on the data used to create the parity to be deleted from the drive 3221. Next, the processing determines whether each data block used to create the parity is latest data with reference to parity source-data information, forwards the latest data to the P1 drive 3220, and returns the data into a dirty state. The parity source-data information indicates information on the data blocks used to create the parity. After returning all the latest data used to create the parity into a dirty state, the processing deletes the parity, issues a command (INVALID) for invalidating old data (3217), and deletes the old data.

Data Management Structure within Drive

Figure 33:
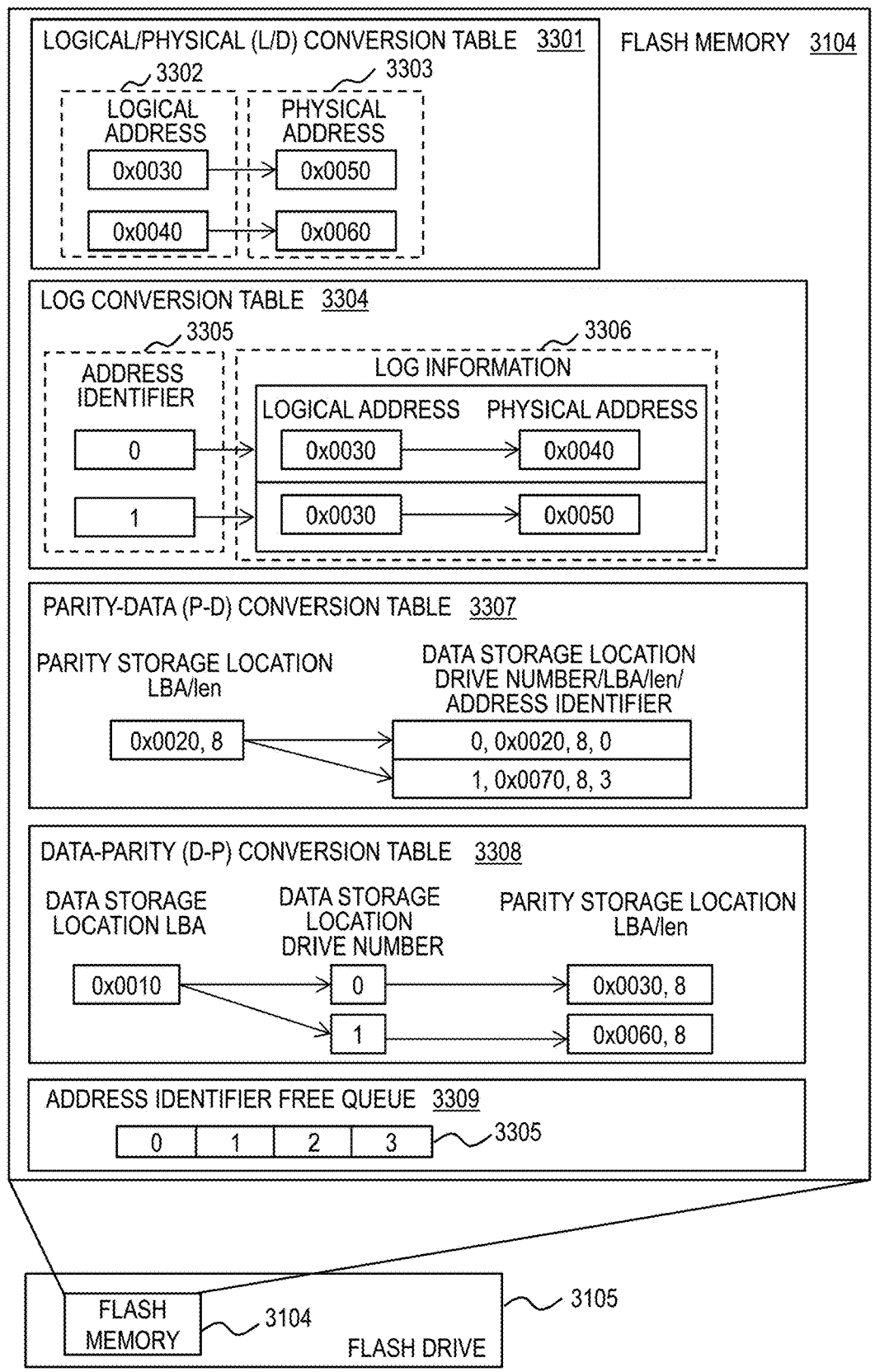
FIG. 33 illustrates structures of tables managed by a drive to control the storage system in Embodiment 3.

FIG. 33 illustrates structures of tables managed by the drive 3105 for controlling the storage system. A flash memory 3104 stores a logical/physical (L/P) conversion table 3301 including information on the log structure, a log conversion table 3304, a parity-data (P-D) conversion table 3307, a data-parity (D-P) conversion table 3308, and an address identifier free queue 3309.

The logical/physical conversion table 3301 indicates correspondence relations between logical addresses 3302 provided by the drive 3105 to the computer node 101 and physical addresses 3303 of the data stored in the physical storage area.

The log conversion table 3304 indicates correspondence relations between address identifiers 3305 for uniquely identifying data and log information 3306 storing logical/physical conversion information. Each time data is written to the drive 3105, the drive 3105 creates log information with updated logical/physical conversion information and assigns an address identifier to the log information for management. The information on source data of a parity stored in a different drive is held with the address identifier.

This management eliminates the drive 3105 from notifying the other drives of a change of the physical address of data stored in the local drive even if such a change happens because of garbage collection processing or wear leveling processing performed by the drive 3105, achieving low overhead for the communications among drives.

The parity-data conversion table 3307 indicates the correspondence relations between the addresses (LBAs and data lengths) of the physical storage areas of parities in the local drive and addresses (drive numbers, LBAs, data lengths, and address identifiers) of the physical storage areas of data in other drives used to create the parities.

Since a parity is created by operations on a plurality of data blocks, one parity is associated with a plurality of logical addresses of data storage locations in other drives. Furthermore, since the data is stored in the log-structured scheme, data on logical addresses may include an address of old data. For this reason, an address identifier is stored together to uniquely locate the data used to create a parity.

The data-parity conversion table 3308 is an inverse conversion table of the above-described parity-data conversion table. The data-parity conversion table 3308 indicates the correspondence relations between the addresses (LBAs and drive numbers) of physical storage areas in other drives holding data and the addresses of physical storage areas in the local drives holding parities.

When a failure occurs in a different drive and requires data restoration, the drive 3105 locates the addresses of the physical storage areas holding the parities required to restore the data in the different drive with reference to the data-parity conversion table 3308. Furthermore, the drive 3105 locates the addresses of the physical storage areas of other drives holding the data required for the data restoration with reference to the parity-data conversion table 3307.

The address identifier free queue 3309 is a queue to be used to perform concurrent write processing and holds unused address identifiers. The concurrent write processing will be described later. In writing data, the computer node 101 acquires (dequeues) an address identifier from the head of the address identifier free queue 3309 and issues a data write to the drive 3105 together with the address identifier.

The drive 3105 stores log information to the log conversion table 3304 with the assigned address identifier. When some old data is invalidated, the computer node 101 registers (enqueues) the invalidated address identifier to the tail of the address identifier free queue 3309.

List of Interfaces

FIG. 34 is a list of communication interfaces between a computer node 101 and a flash drive 3105. A D_WRITE command 3401 includes the drive number of a D drive 3219, an LBA, and a transfer data length as arguments and performs a write to the D drive 3219. After performing the write, an address identifier or metadata in the log structure is output.

The address identifier is an invariable identifier associated with data stored in a drive. Specifically, the address identifier is an identifier unique to the drive assigned to mapping information between a logical address and a physical address in the drive.

A P_WRITE command 3402 includes the drive number of a P1 drive 3220 or a P2 drive 3221 to store a parity, a transfer data length, and data storage information as arguments and performs a write to the drive. The data storage information consists of the drive number of a D drive, an LBA, and an address identifier.

A D_READ command 3403 includes a drive number, an LBA, and a transfer data length as arguments and retrieves latest data from the D drive 3219. An OLD_D_READ command 3404 includes a drive number, an address identifier, and a transfer data length as arguments and retrieves old data from the D drive 3219.

A P_GET command 3405 includes the drive number of a P1 drive as an argument and outputs parity source-data information on a parity which is created in asynchronous destage processing but the P1 drive 3220 specified by the argument has not notified the P2 drive 3221 of the parity source-data information thereon. The parity source-data information consists of the drive numbers of D drives, LBAs, and address identifiers of the data blocks used to create the parity.

A P_PUSH command 3406 includes the drive number of a P2 drive 3221 and parity source-data information as arguments and notifies the P2 drive 3221 of the parity source-data information. The parity source-data information consists of the drive numbers of D drives, LBAs, and address identifiers.

A STAT_GET command 3407 includes a drive number as an argument and outputs information on the usage of the drive specified by the argument. The STAT_GET command 3407 is used to check for capacity depletion in a drive. An INVALID command 3408 includes the drive number of a D drive 3219 and an address identifier as arguments and invalidates unnecessary old data in garbage collection processing.

A SEARCH command 3409 requests a P2 drive 3221 to detect a parity to be deleted in garbage collection processing and outputs information on the parity to be deleted and parity source-data information on the parity to be deleted as a search result. The information on the parity to be deleted consists of the drive number of the P2 drive 3221 and an LBA; the parity source-data information on the parity to be deleted consists of the drive numbers of the D drives, LBAs, address identifiers, and information on whether the individual source data blocks are latest data or not.

The computer node 101 communicates with the drives 3105 using the above-described commands to perform processing.

Read Processing

Reading Latest Data

Figure 35:
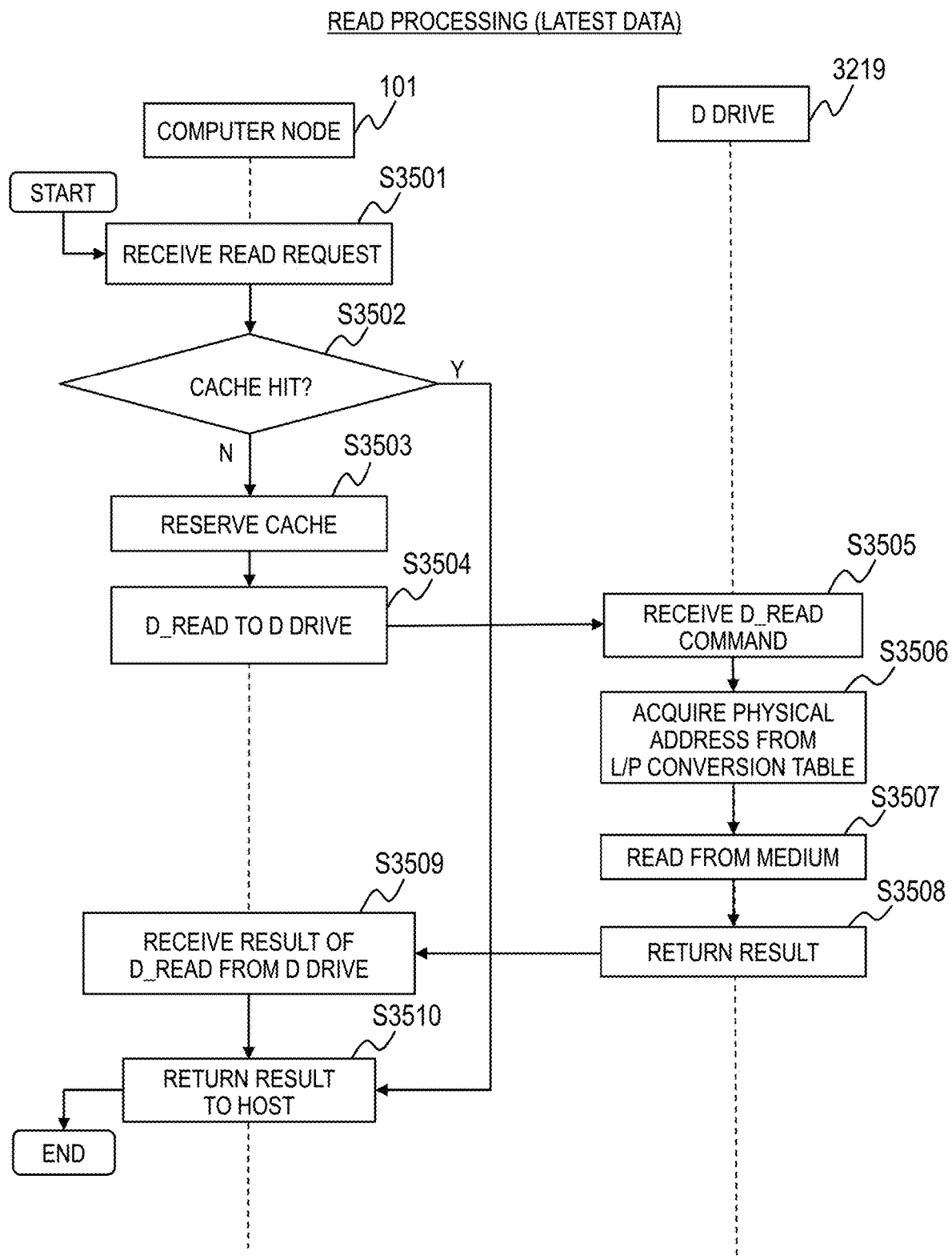
FIG. 35 is a flowchart of read processing for a computer node to retrieve latest data from a D drive in Embodiment 3.

FIG. 35 is a flowchart of read processing for a computer node 101 to retrieve latest data from a D drive 3219. This processing is executed in response to receipt of a read request from a host (S3501).

The processor 119 of the computer node 101 that has received a read request from a host checks whether the cache includes the data (S3502). If the cache includes the data (S3502: Y), the processor 119 returns the data in the cache to the host (S3510).

If the cache does not include the data (S3502: N), the processor 119 reserves the cache (S3503) and thereafter, issues a D_READ command to the D drive 3219 (S3504).

Upon receipt of the D_READ command (S3505), the D drive 3219 acquires the physical address holding the data with reference to the logical/physical conversion table 3301 (S3506). Next, the D drive 329 reads the data from the flash memory (medium) 3104 (S3507) and returns the result to the computer node 101 (S3508). Upon receipt of the result of the D_READ from the D drive 3219, the computer node 101 returns the result to the host (S3510).

Reading Old Data

Figure 36:
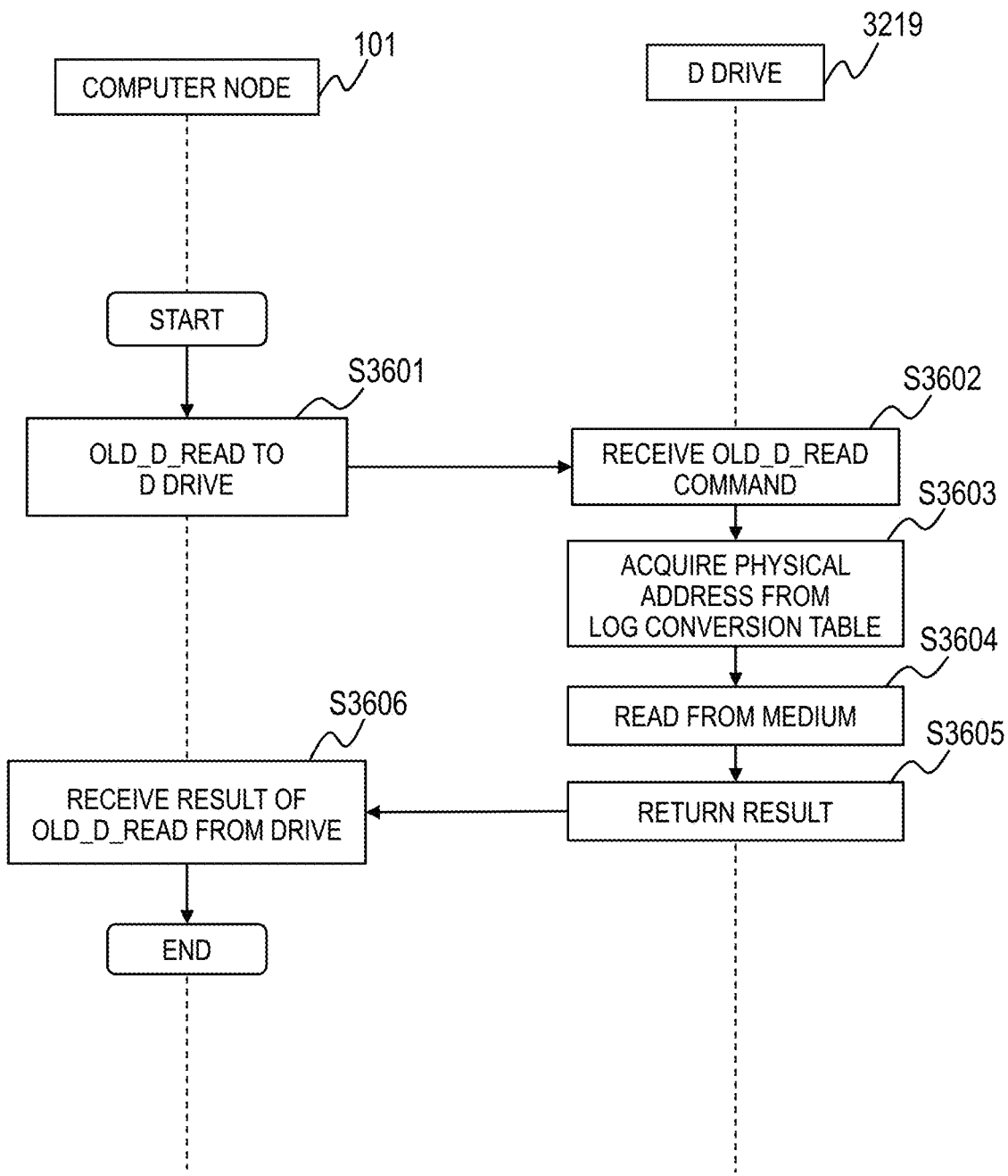
FIG. 36 illustrates read processing to retrieve old data in Embodiment 3.

FIG. 36 illustrates read processing to retrieve old data. In reading old data, the computer node 101 first issues an OLD_D_READ command to the D drive 3219 (S3601). Upon receipt of the OLD_D_READ command (S3602), the D drive 3219 acquires the physical address holding the old data corresponding to the designated address identifier from the log conversion table 3304 (S3603).

Next, the D drive 3219 reads the old data from the flash memory (medium) 3104 (S3604) and returns the result to the computer node 101 (S3605). The computer node 101 receives the result of the OLD_D_READ from the D drive (S3606).

Write Processing

Figure 37:
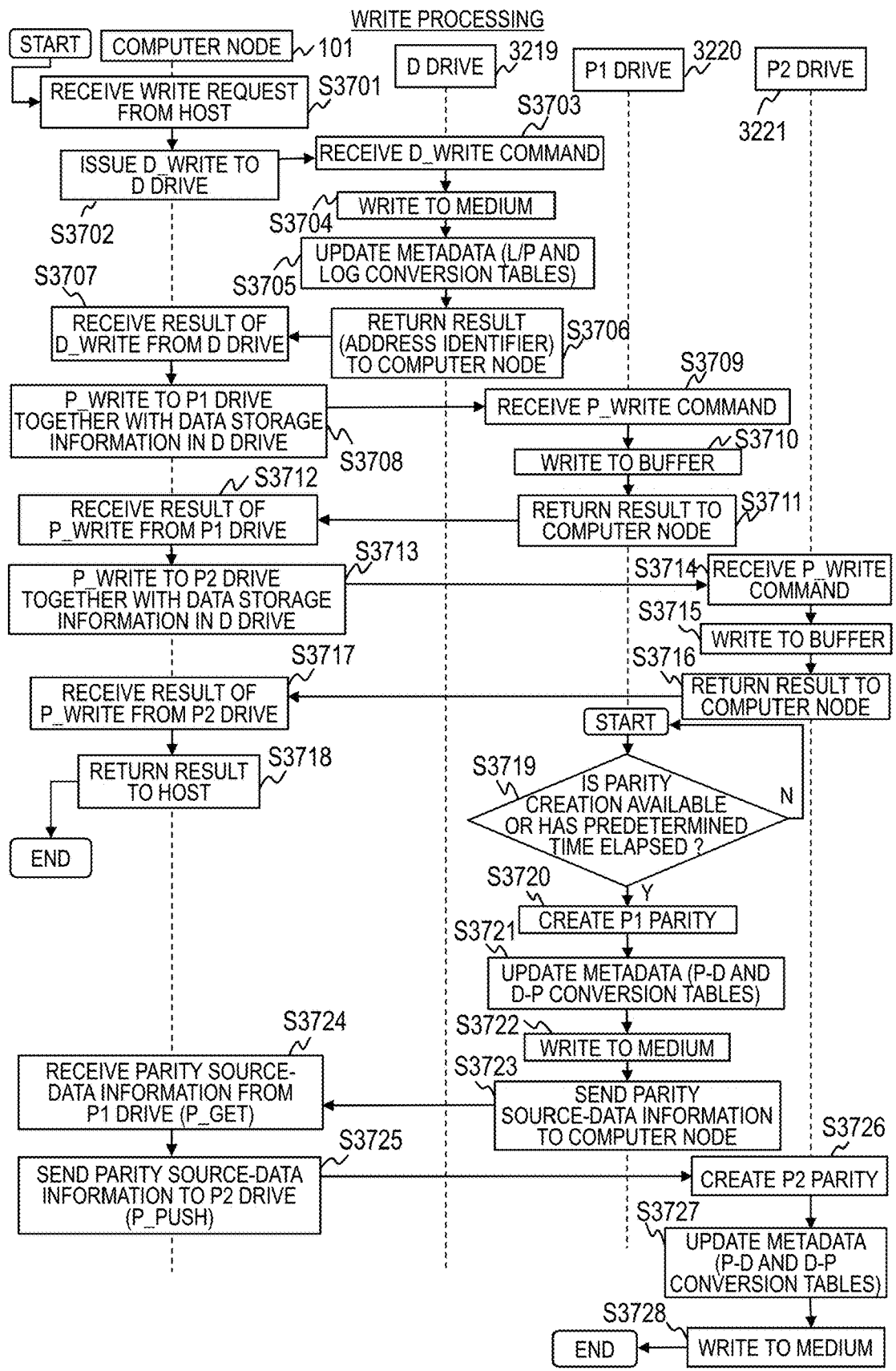
FIG. 37 is a flowchart of write processing for a computer node to write data to a D drive in Embodiment 3.

FIG. 37 is a flowchart of write processing for a computer node 101 to write data to a D drive 3219. The write processing includes two phases of processing. One phase is synchronous write processing until returning a write result to the host. The other phase is asynchronous write processing to create parities from data accumulated in the parity creation buffers in the drives and store the parities to media.

First, the synchronous write processing is described. This processing is executed upon receipt of a write request from the host. This processing stores write data to the D drive 3219 and further, writes the data to the drives (the P1 drive 3220 and the P2 drive 3221) to create parities together with an address identifier.

Upon receipt of a write request from the host (S3701), the processor 119 of the computer node 101 issues a D_WRITE command to the D drive 3219 (S3702). The D_WRITE command includes write data. Upon receipt of the D_WRITE command, the D drive 3219 writes the write data to a flash memory (medium) 3104 in accordance with the log-structured scheme (S3704) and further, the D drive 3219 updates the metadata (the logical/physical conversion table 3301 and the log conversion table 3304) (S3705). The D drive 3219 returns the address identifier of the data storage location to the computer node 101 (S3706).

Upon receipt of the result of the D_WRITE from the D drive 3219 (S3707), the computer node 101 issues a P_WRITE command to the P1 drive 3220 together with the data storage information in the D drive 3219 (S3708).

Upon receipt of the P_WRITE command (S3709), the P1 drive 3220 stores the write data to the parity creation buffer 3203 of the drive (S3710), and returns the result to the computer node 101 (S3711).

Upon receipt of the result of the P_WRITE command from the P1 drive 3220 (S3712), the computer node 101 issues a P_WRITE command to the P2 drive 3221 together with the data storage information in the D drive 3219 (S3713).

Upon receipt of the P_WRITE command (S3714), the P2 drive 3221 stores the write data to the parity creation buffer 3203 (S3715), and returns the result to the computer node 101 (S3716). Upon receipt of the result of the P_WRITE command from the P2 drive 3221 (S3717), the computer node 101 returns a result to the host (S3718).

When the foregoing synchronous write processing is repeated, a predetermined number of data blocks are accumulated in the parity creation buffer 3203 of the P1 drive 3220. In response to this event, or when a predetermined time has elapsed, the P1 drive 3220 executes asynchronous write processing within the drive (S3719).

First, the P1 drive 3220 dynamically selects data blocks from the data accumulated in the parity creation buffer 3203 and creates a P1 parity (S3720). Next, the P1 drive 3220 updates the metadata (the parity-data conversion table 3307 and the data-parity conversion table 3308) (S3721) and writes the P1 parity to a flash memory (medium) 3104 (S3722).

Subsequently, the computer node 101 acquires, by a P_GET command, the parity source-data information on the P1 parity from the P1 drive 3220 (S3723, S3724). The computer node 101 notifies the P2 drive 3221 of the parity source-data information acquired from the P1 drive 3220 with a P_PUSH command (S3725).

Upon receipt of the P_PUSH command from the computer node 101, the P2 drive 3221 creates a P2 parity based on the received parity source-data information (S3726), updates the metadata (the parity-data conversion table 3307 and the data-parity conversion table 3308) (S3727), and writes the P2 parity to a flash memory (medium) 3104 (S3728).

Figure 38:
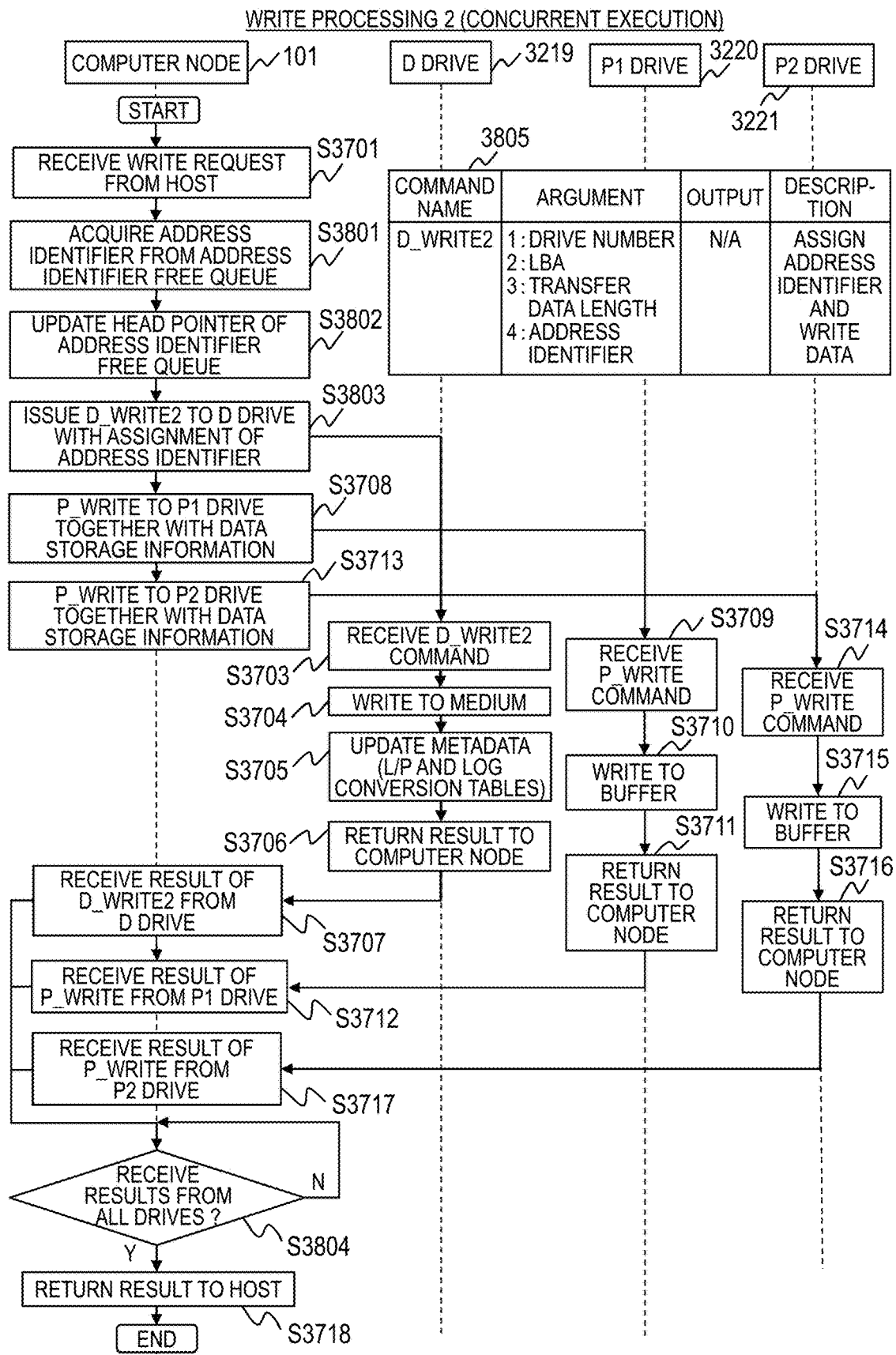
FIG. 38 is a flowchart of processing to concurrently execute data writes to drives in the synchronous write processing in Embodiment 3.

FIG. 38 is a flowchart of the processing in the case of concurrently executing data writes to the drives in the synchronous write processing. The difference from FIG. 37 is that the computer node 101 does not wait a response from the D drive 3219 and issues write commands to the parity creation drives 3220 and 3221 with designation of the address identifier to be used.

For the write to the D drive 3219, a D_WRITE2 command 3805 for assigning an address identifier and requesting a write is used, instead of a D_WRITE command 3401. The D_WRITE2 command 3805 includes the drive number of a D drive 3219, an LBA, a transfer data length, and an address identifier as arguments and is to perform a write to the D drive 3219.

Upon receipt of a write request from the host (S3701), the computer node 101 acquires an address identifier from the head of the address identifier free queue 3309 (S3801) and updates the head pointer in the address identifier free queue 3309 (S3802). Next, the computer node 101 issues a D_WRITE2 command including the acquired address identifier as an argument to the D drive 3219 (S3803).

The computer node 101 further issues P_WRITE commands including the acquired address identifier in the data storage information to the P1 drive 3220 and the P2 drive 3221 (S3708, S3713).

The D drive 3219 stores log information under the assigned address identifier to the log conversion table 3304. The P1 drive 3220 and the P2 drive 3221 each perform the same processing as the processing in FIG. 37 and then return the result to the computer node 101 (S3703 to S3706, S3709 to S3711, and S3714 to S3716).

The computer node 101 stands by until receiving the results from all the drives 3219 to 3221 (S3804). Upon receipt of the results from all the drives 3219 to 3221, the computer node 101 returns a result to the host (S3718).

Each of the P1 drive 3220 and the P2 drive 3221 asynchronously creates a parity and stores the parity to the flash memory (medium) 3104, like in the processing described from S3719 to S3728 of FIG. 37. The above-described concurrent write processing to the drives achieves a shorter response time to the host.

Garbage Collection Processing

Figure 39:
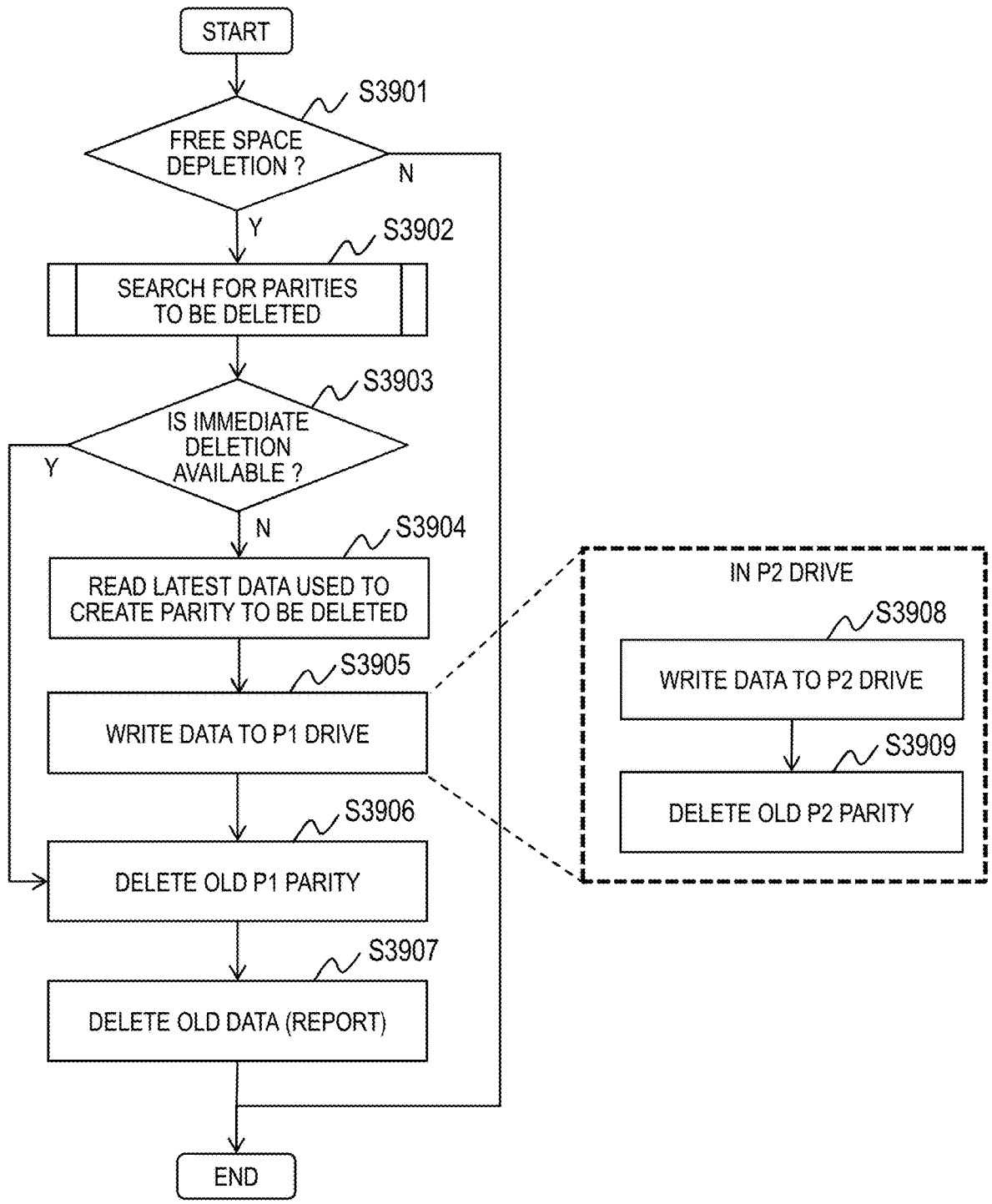
FIG. 39 is a flowchart of garbage collection processing in Embodiment 3.

FIG. 39 is a flowchart of the garbage collection processing. This processing erases unnecessary data when the amount of data stored in a drive exceeds a predetermined target amount (threshold). As a result, necessary data can be stored in a limited area. The kinds of data to be erased are write data and parity. This processing may be executed either synchronously or asynchronously with a host I/O.

The computer node 101 checks whether the usage of a D drive 3219 is higher than a target amount (S3901). Specifically, the computer node 101 makes determination depending on whether the usage is higher than the target amount with reference to the monitoring result of the space management job 3201. The monitoring result of the space management job 3201 may be managed with the local area amount table 802.

If the drive usage is higher than the target amount (S3901: Y), the computer node 101 starts garbage collection processing. In the garbage collection processing, the computer node 101 issues a SEARCH command to detect a P1 parity to be deleted to each of the P1 drives 3220 holding the P1 parities created from data in the D drive 3219 where capacity depletion is detected.

Upon receipt of the SEARCH command, the P1 drive 3220 searches for the P1 parities having the drive number specified by the argument in the parity source-data information with reference to the parity-data conversion table 3307. Upon detection of such a P1 parity, the P1 drive 3220 checks whether the data of the detected result is old data with reference to the data-parity conversion table 3308.

If the data is found old data, the P1 drive 3220 determines that the P1 parity is to be deleted. Next, the P1 drive 3220 checks whether each source data blocks used to create the P1 parity is new or old with reference to the data-parity conversion table 3308 and returns the result (the parity to be deleted and the parity source-data information on the parity to be deleted) to the computer node 101 (S3902).

The computer node 101 acquires the information whether each source data block of the P1 parity is new or old from the returned parity source-data information on the parity to be deleted and determines whether the P1 parity to be deleted can be deleted immediately (S3903). If all the source data blocks of the P1 parity are old data (S3903: Y), the computer node 101 deletes the P1 parity (S3906), and further, deletes the source data blocks of the P1 parity from the D drives 3219 of the data storage locations with INVALID commands (S3907).

In the case of employment of the concurrent write processing, the computer node 101 registers (enqueues) the invalidated address identifiers to the tail of the address identifier free queue 3309 upon receipt of the results of the INVALID commands. The computer node 101 further instructs the P2 drive 3221 to delete the P2 parity created from the identical combination of data blocks.

If the source data blocks of the P1 parity include a data block of latest data (S3903: N), the computer node 101 reads the latest data from the D drive 3219 with a D_READ command and writes it to the P1 drive 3220 and the P2 drive 3221 together with data storage information with P_WRITE commands (S3905, S3908).

After writing, the computer node 101 deletes the old P1 parity and the old P2 parity from the P1 drive 3220 and the P2 drive 3221 (S3906, S3909), and deletes old data from the D drives 3219 with INVALID commands (S3907). The computer node 101 repeats the foregoing processing to delete parities and data.

Meanwhile, the P1 drive 3220 creates a new P1 parity, updates the metadata, and stores the new P1 parity to the flash memory (medium) 3104 in accordance with the asynchronous write processing described in FIG. 37. Likewise, the P2 drive 3221 creates a new P2 parity, updates the metadata, and stores the new P2 parity to the flash memory (medium) 3104 in accordance with the asynchronous write processing.

Embodiment 4

Off-Loading Log Structuring (to Drive)+Parity Creation (to Controller)

Figure 40:
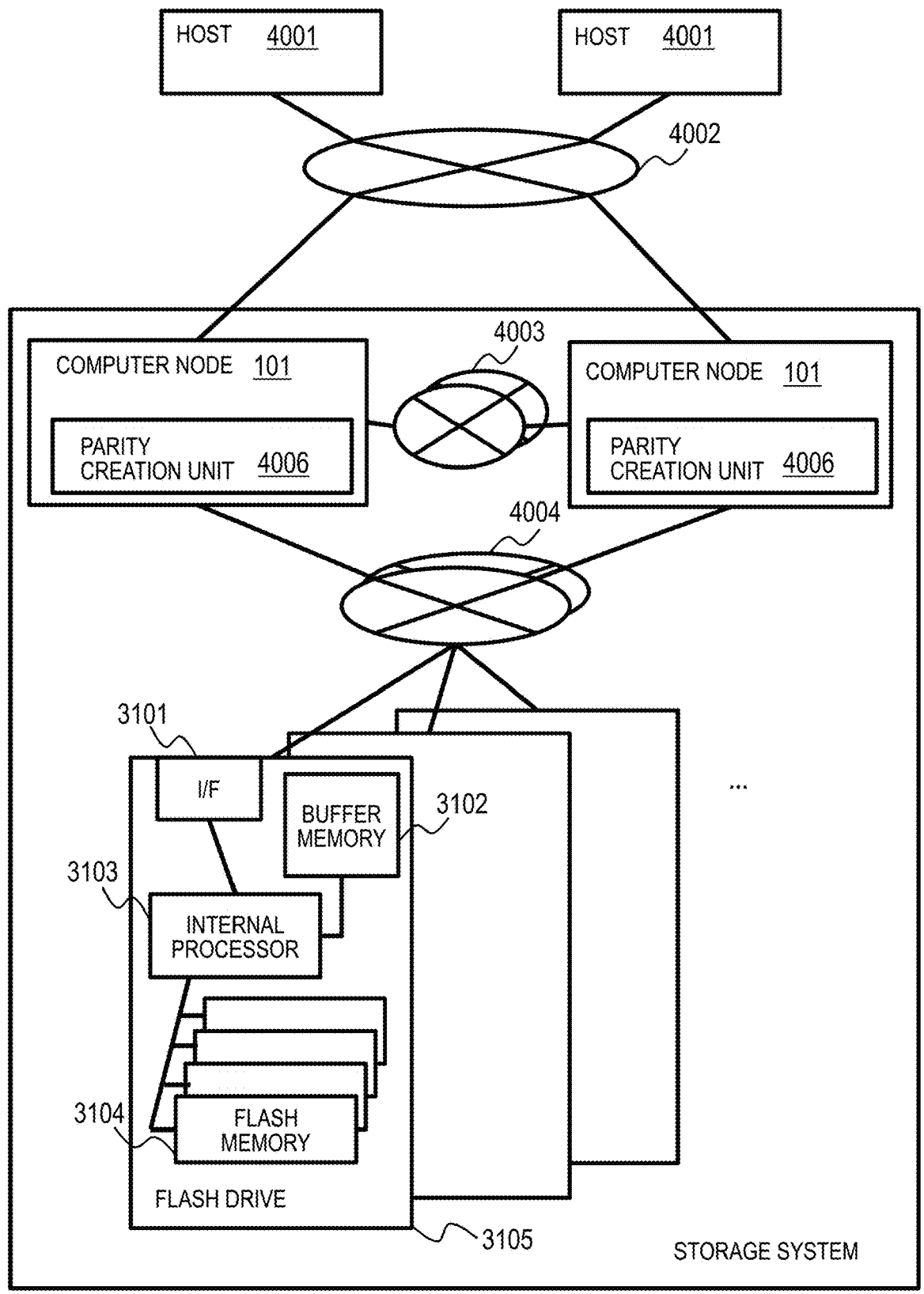
FIG. 40 illustrates an example of a hardware configuration of a distributed storage system in Embodiment 4.

FIG. 40 illustrates an example of a hardware configuration of a distributed storage system. The difference from Embodiment 3 is that the computer node 101 includes a parity creation unit inside thereof. The parity creation unit can be implemented by hardware or software. The storage system includes a plurality of computer nodes 101 and each computer node 101 includes a parity creation unit 4006 having a function to create a parity inside thereof.

Each computer node 101 is connected with host computers 4001 via a frontend network 4002; the computer nodes 101 are connected with each other via an internal network 4003; and the computer nodes 101 are connected with the drives via a backend network 4004. A plurality of computer nodes 101 can access one drive 3105.

Overview

Figure 41:
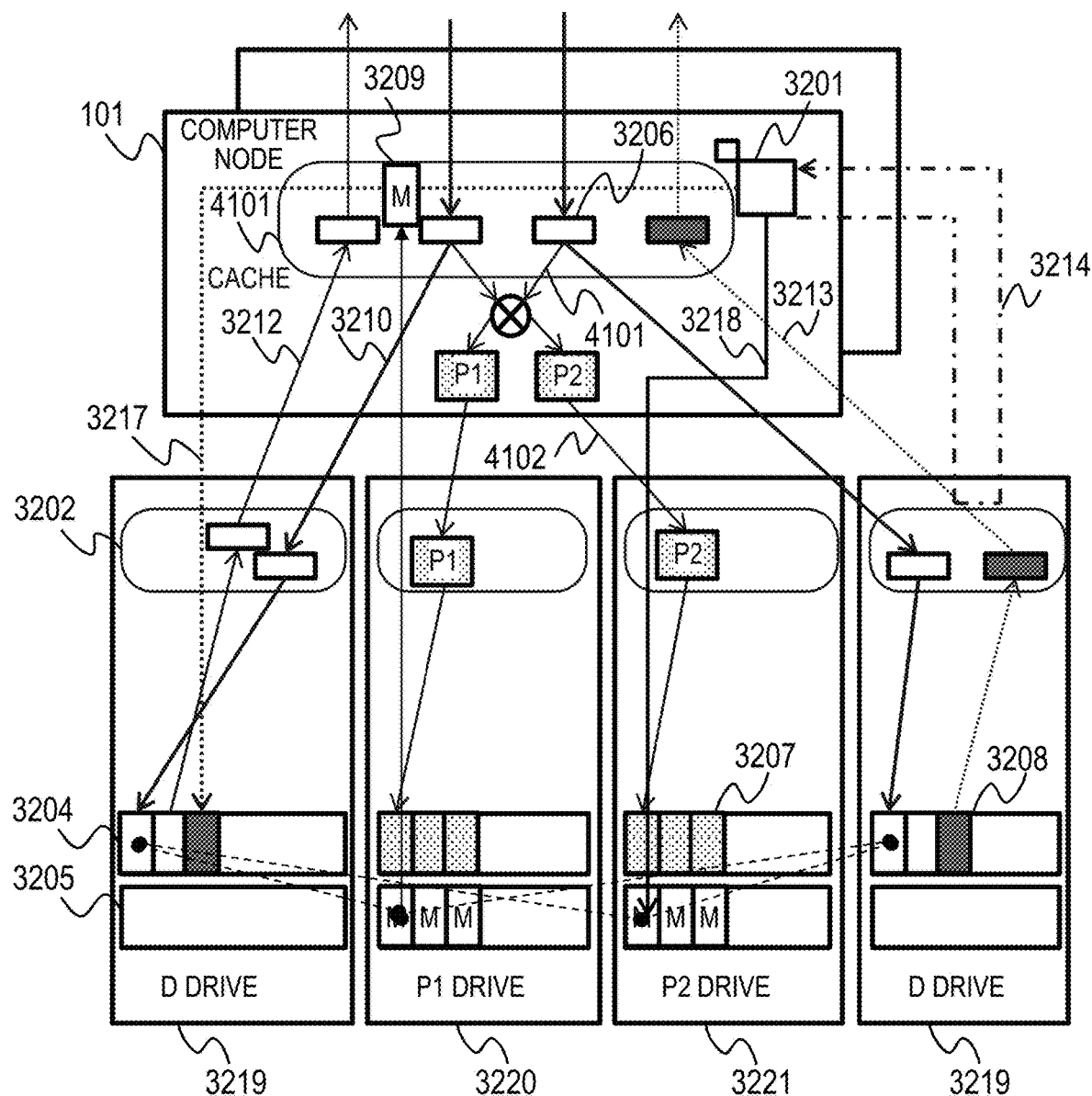
FIG. 41 illustrates an overview of Embodiment 4.

FIG. 41 illustrates an overview of this embodiment. The difference from Embodiment 3 is that the P1 drive 3220 and the P2 drive 3221 do not need to create parities asynchronously with I/O because the parities are created by the computer node 101. Accordingly, in the case of two or more parities, it is not necessary to inform the P2 drive 3221 of the parity source-data information on the P1 parity; the processing load to the computer node 101 and the drives 3219 to 3221 and the write processing time can be reduced.

Specifically, write processing stores data received from a host to a parity creation buffer 4101 in the computer node 101 and the parity creation buffer 4101 requests the parity creation unit 4006 to create parities (4101). Then, the parity creation unit 4006 creates parities and writes the created parities to the drives to store the parities (4102).

The difference from Embodiment 3 in garbage collection processing is that, if the source data of the parity to be deleted include latest data, the latest data retrieved from the D drive 3219 is transferred to the parity creation unit 4006 to create a new parity. Read processing is the same as the read processing in Embodiment 3.

List of Interfaces

FIG. 42 is a list of communication interfaces between a computer node 101 and each of the drives 3219 to 3221. In place of the P_WRITE command 3402 in Embodiment 3, a P_WRITE2 command 4201 is provided.

The P_WRITE2 command 4201 includes a drive number, an LBA, a transfer data length, and an array of parity source-data information as arguments and is to write a parity to a drive. The parity source-data information consists of a drive number, an LBA, and an address identifier. That is to say, the P_WRITE2 command 4201 writes a plurality of data storage locations as the parity source-data information to a drive together with a parity.

Write Processing

Synchronous Write Processing

Figure 43:
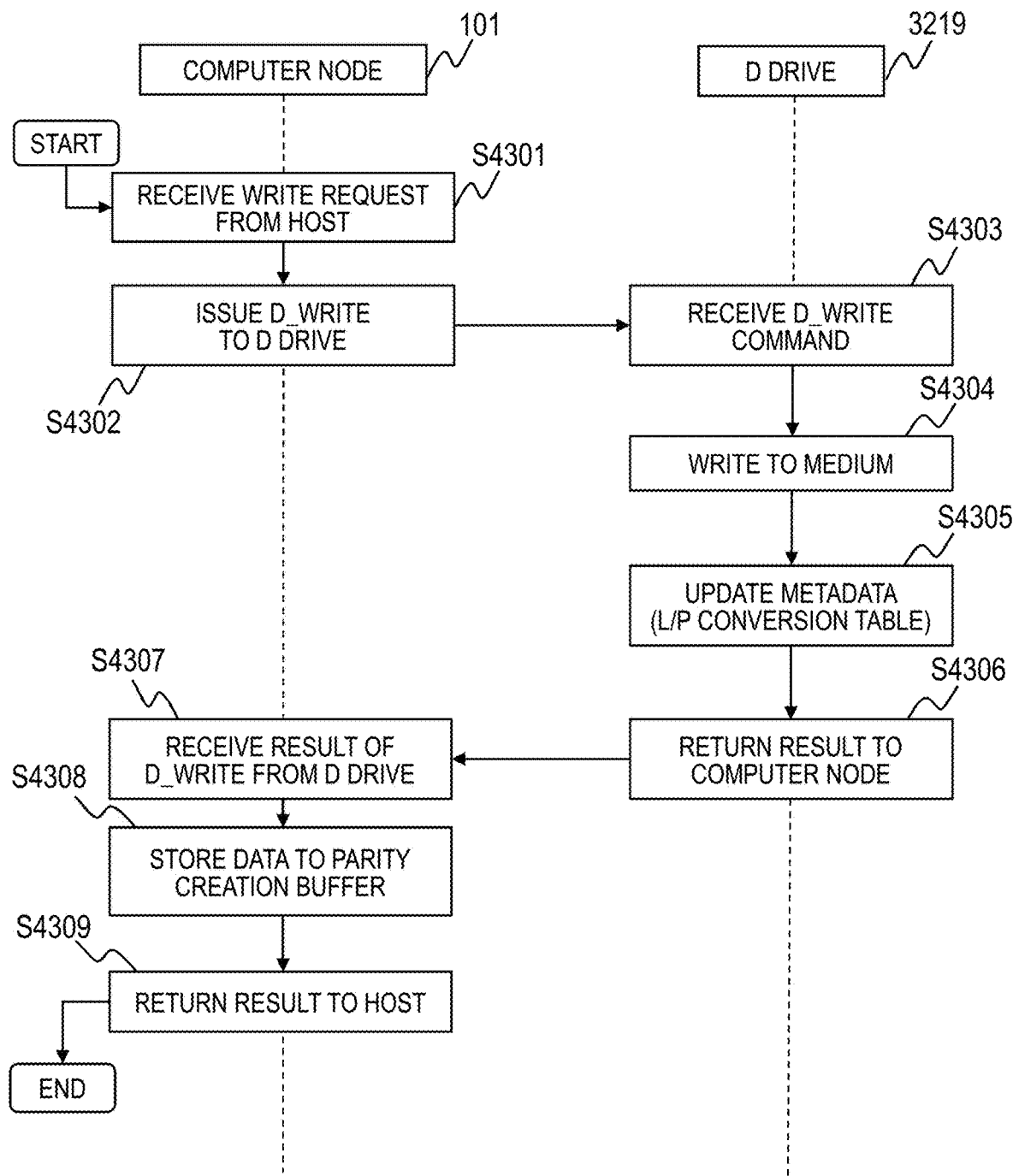
FIG. 43 is a flowchart of synchronous write processing in Embodiment 4.

Write processing in this embodiment includes synchronous write processing and asynchronous write processing like the write processing in Embodiment 3. FIG. 43 is a flowchart of the synchronous write processing in this embodiment. Upon receipt of a write request from a host (S4301), a computer node 101 issues a D_WRITE command to the D drive 3219 (S4302).

Upon receipt of the D_WRITE command (S4303), the D drive 3219 writes data to a flash memory (medium) 3104 (S4304), updates the metadata (the logical/physical conversion table 3301 and the log conversion table 3304) (S4305), and returns a result (an address identifier) to the computer node 101 (S4306).

Upon receipt of the result from the D drive 3219 (S4307), the computer node 101 stores the data to the parity creation buffer 4101 in the computer node 101 (S4308) and returns a result to the host (S4309).

The synchronous write processing may concurrently perform the data write to the D drive 3219 and the data storage to the parity creation buffer 4101 by using the address identifier free queue 3309 and a D_WRITE2 command 3805 as described with reference to FIG. 38.

Asynchronous Write Processing

Figure 44:
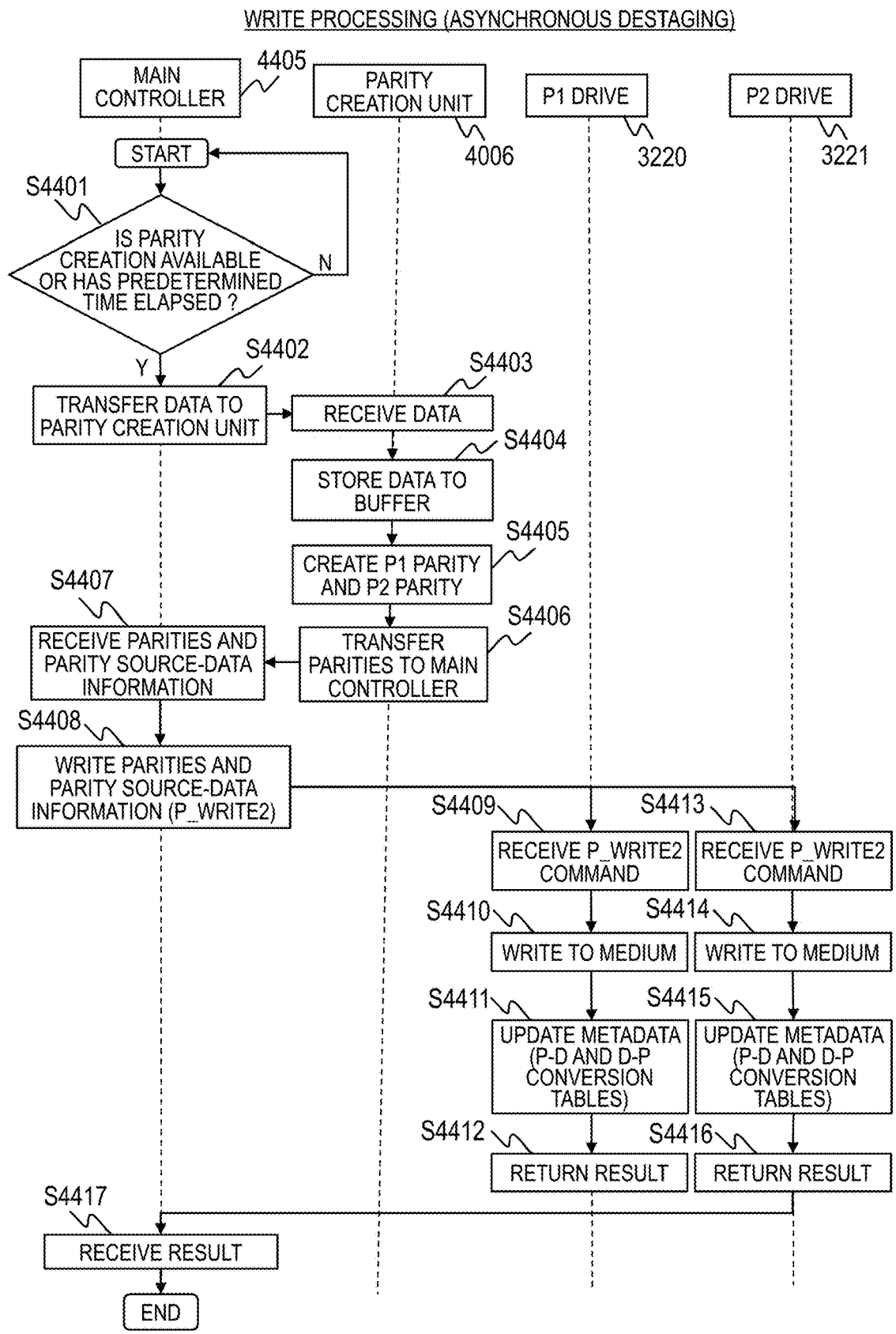
FIG. 44 is a flowchart of asynchronous write processing in Embodiment 4.

FIG. 44 is a flowchart of the asynchronous write processing in this embodiment. When the foregoing synchronous write processing is repeated, a predetermined number of data blocks are accumulated in the parity creation buffer 4101. In response to the event, or when a predetermined time has elapsed, the computer node 101 performs asynchronous write processing (S4401).

The main controller 4405 of the computer node 101 selects data to be used to create a parity from the data accumulated in the parity creation buffer 4101 and transfers the data to the parity creation unit 4006 (S4402). The main controller 4405 is implemented by the processor 119 operating in accordance with a program, for example. Upon receipt of the data (S4403), the parity creation unit 4006 stores the received data to an internal buffer thereof (S4404).

Subsequently, the parity creation unit 4006 creates a P1 parity and a P2 parity using the received data (S4405) and transfers the created parities to the main controller 4405 (S4406).

Upon receipt of the P1 parity and the P2 parity from the parity creation unit 4406 (S4407), the main controller 4405 writes the P1 parity and the P2 parity to the P1 drive 3220 and the P2 drive 3221 together with the parity source-data information using a P_WRITE2 command (S4408).

Upon receipt of the P_WRITE2 command (S4409), the P1 drive 3220 writes the parity to a flash memory (media) 3104 (S4410), updates the metadata (the parity-data conversion table 3307 and the data-parity conversion table 3308) (S4411), and returns a result to the computer node 101 (S4412).

The P2 drive 3221 performs the same processing as the P1 drive 3220 and returns a result to the computer node 101 (S4413 to S4416). Upon receipt of the results from the P1 drive 3220 and the P2 drive 3221, the main controller 4405 terminates the processing (S4417).

Garbage Collection Processing

Figure 45:
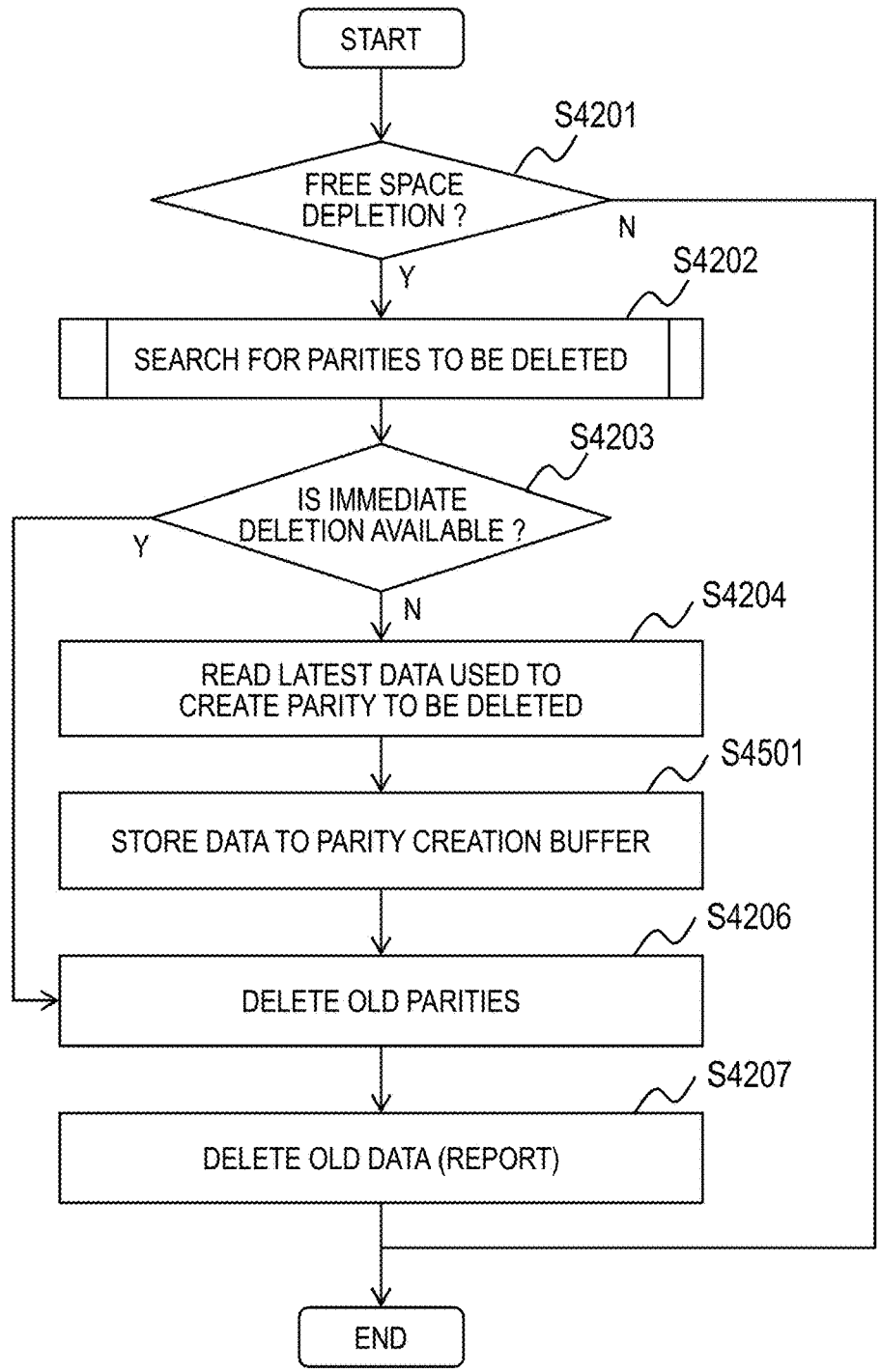
FIG. 45 is a flowchart of garbage collection processing in Embodiment 4.

FIG. 45 is a flowchart of garbage collection processing in this embodiment. Steps S4201 to S4204 and S4207 correspond to Steps S3901 to S3904 and S3907.

The main difference from Embodiment 3 is that latest data in the data used to create the parity to be deleted is stored to the parity creation buffer 4101 in the computer node 101 (S4501). This configuration eliminates rewriting data to a drive as performed in Embodiment 3, improving the performance in the garbage collection processing. Steps S4501 and S4206 are performed in the P1 parity drive and the P2 parity drive.

When a predetermined number of data blocks are accumulated in the parity creation buffer 4101 or when a predetermined time has elapsed, the computer node 101 performs asynchronous write processing described with FIG. 44, creates new parities, and writes the parities to the drives.

In the foregoing embodiments, correspondence relations in addressing between redundant codes and data are managed in each node. In another example, the system may prepare two kinds of virtual spaces and dynamically change the correspondence relations of the virtual spaces to implement the data protection technique. Specifically, the system prepares a first virtual space to be provided to upper logical apparatuses and a second virtual space statically associated with the storage addresses in the physical storage area of redundant codes and data. The system dynamically associates the first virtual space with the second virtual space to create a redundant code from data in a plurality of nodes.

In this case, the system shares information such as a write location pointer among the plurality of nodes forming a stripe type. The write location pointer is a pointer to indicate the current location of write, assuming a plurality of nodes incrementally adds write data to the second virtual space in a log style.

The system further controls the associations of the first virtual space with the second virtual space so that the write location pointer is consistent, which is to say, that data received from a plurality of nodes and redundant codes of the data will be written to be associated with a specific area in the second virtual space.

The data protection technique and the data allocation technique of this disclosure dynamically create redundant codes from a set of data units (data blocks) in the cache that have been transferred from a plurality of different nodes. That is to say, as a result of random selection of the same stripe type of data from the data managed in the code dirty queue 901 (S802 in FIG. 18), the logical addresses of the source data blocks for one node to create an inter-node redundant code are not fixed to a single combination, but allow two or more combinations.

Meanwhile, in this disclosure, data blocks are managed together with transfer source addresses as illustrated in FIG. 8, which allows a redundant code to be created in a dynamic combination of logical addresses. Furthermore, the number of data blocks to be used to create a redundant code is not limited to a specific value but can be changed dynamically. The above-described configuration achieves data protection with small overhead, eliminates network bottleneck, and attains data allocation for providing speedy local accesses. Furthermore, if the drives are SSDs, less frequent write operations can be achieved to save the lives of the SSDs.

The data protection technique and the data allocation technique of this disclosure achieve data allocation suitable for local read and data protection together and also eliminate network bottleneck. Furthermore, since the management information on the data stored in the local storage device can be held in the local node, the information on virtual volumes and pool volumes can be closed within the share among a small number of nodes, achieving less information to be shared. As a result, high scalability is attained independent from the number of nodes. In addition, the high scalability can lower the network cost in constructing the system.

The above-described plurality of functions in the distributed storage system can be independently implemented. For example, the system may implement only one of the functions of creating a redundant code, the function of reallocation, and the function of receiving designation of node to allocate a page. The configuration of a node is not limited to the above-described computer configuration. The node protection layer may be omitted. Further, only either one of the site protection layer and the site protection layer may be implemented.

It should be noted that this invention is not limited to the above-described embodiments but include various modifications. For example, the drives 113 shown in FIG. 3 do not need to be in the package of a computer node 101, as far as the processor recognizes that the drives 113 are the local storage devices to be managed by the processor. The above-described embodiments have described details in order to describe this invention for better understanding; they are not limited to those including all the configurations that have been described. A part of the configuration of each embodiment may be replaced with a configuration of another embodiment or a configuration of an embodiment may be incorporated to a configuration of another embodiment. A part of the configuration of each embodiment may be added, deleted, or replaced by that of a different configuration.

The above-described configurations, functions, and processing units, for all or a part of them, may be implemented by hardware: for example, by designing an integrated circuit. The above-described configurations and functions may be implemented by software, which means that a processor interprets and executes programs providing the functions. The information of programs, tables, and files to implement the functions may be stored in a storage device such as a memory, a hard disk drive, or an SSD (Solid State Drive), or a storage medium such as an IC card, or an SD card.

The drawings shows control lines and information lines as considered necessary for explanations but do not show all control lines or information lines in the products. It can be considered that most of all components are actually interconnected.

In addition to the configurations recited in the claims, features of this disclosure are summarized as follows.

(1)

The storage system includes at least one computer and a plurality of storage drives;

the at least one computer is configured to determine a data drive to store a write data block and a first redundant code drive to store a redundant code of the write data block;

the at least one computer is configured to send the write data block to the data drive and the first redundant code drive;

the data drive is configured to store the write data block to a storage medium; and the first redundant code drive is configured to create a redundant code using a plurality of write data blocks received from the at least one computer and store the redundant code to a storage medium.

(2)

The first redundant code drive is configured to:

determine a stripe type for each of the received write data blocks based on a write location of the write data block, and create a redundant code from a plurality of write data blocks included in the same stripe type.

(3)

The first redundant code drive is configured to:

further receive information on storage locations of the write data blocks from the at least one computer, and manage a relation between a storage location of the redundant code and storage locations of the plurality of write data blocks.

(4)

The at least one computer is further configured to send the plurality of write data blocks to a second redundant code drive together with the information on storage locations of the plurality of write data blocks; and the second redundant code drive is configured to acquire configuration information including information on a plurality of write data blocks used to create the redundant code in the first redundant code drive and create a redundant code using the plurality of write data blocks selected in accordance with the configuration information.

(5)

The storage system includes a computer and a plurality of storage drives;

the computer is configured to determine a data drive to store a write data block and a redundant code drive to store a redundant code of the write data block;

the computer is configured to send the write data block to the data drive;

the data drive is configured to store the write data block to a storage medium;

the computer is configured to create a redundant code using the write data block;

the computer is configured to send the redundant code and configuration information on a plurality of write data blocks used to create the redundant code to the redundant code drive;

the redundant code drive is configured to store the redundant code to a storage medium; and the redundant code drive is configured to manage a relation between a storage location of the redundant code and storage locations of the plurality of write data blocks.

What is claimed is:

1. A distributed storage system including a plurality of nodes, comprising:
   one or more storage devices configured to store data;
   one or more processors configured to process data input/output to/from the one or more storage devices,
   wherein the one or more processors are configured to:
   manage logical addresses provided to an input/output request source in association with physical addresses of storage locations in the one or more storage devices;
   associate a plurality of physical addresses with a single logical address to read the data after an update and the data before the update selectively when the data is updated
   wherein, when the one or more processors update the data of the single logical address, the one or more processors are configured to store update data for updating in a physical address different from the physical address of the data before the update, and add an association between the single logical address and the physical address where the update data is stored.

2. The distributed storage system according to claim 1, wherein the association between the single logical address and each of the plurality of physical addresses is managed by an identifier, and
   wherein the data before the update is read by using the identifier.

3. The distributed storage system according to claim 2, wherein, when a read request does not contain an identifier, the processor is configured to read a latest data out of the data of the plurality of physical addresses for the single logical address.

4. A distributed storage system including a plurality of nodes, comprising:
   one or more storage devices configured to store data;
   one or more processors configured to process data input/output to/from the one or more storage devices,
   wherein the one or more processors are configured to:

manage logical addresses provided to an input/output request source in association with physical addresses of storage locations in the one or more storage devices;

associate a plurality of physical addresses with a single logical address to read the data after an update and the data before the update selectively when the data is updated, wherein each of nodes, which receives data from a host, stores the received data to a local storage device of each of the nodes, respectively, wherein the local storage device of each of the nodes stores the received data and a parity created based on multiple data received from the host by different nodes from each of the nodes, respectively, and stored in the local storage devices of the different nodes from each of the nodes, respectively, wherein, when the data is updated, update data is sent to a node storing the data before update and a node storing a parity of the data, and wherein a processor of the node storing the data before update and a processor of the node storing the parity of the data are configured to update the data and the parity asynchronously.

5. The distributed storage system according to claim 4, wherein the processor of the node storing the data before update and the processor of the node storing the parity of the data are configured to update the data and the parity asynchronously.

6. The distributed storage system according to claim 4, wherein the processor of the node storing the data before update and the processor of the node storing the parity of the data are configured to update the data and the parity in parallel.

7. The distributed storage system according to claim 4, wherein a plurality of parities are created based on data stored in a plurality of different nodes, and the plurality of parities are stored in different nodes.

8. The distributed storage system according to claim 4, wherein a processor of a node which receives the update data is configured to stores the update data in a physical address different from a physical dress of the data before update, and adds an association between the single logical address and the physical address where the update data is stored, and wherein a processor of a node which receives data for updating the parity before update is configured to create an updated parity based on the data for updating the parity before update and the parity before update, store the updated parity in a physical address different from a physical address of the parity before update, and add an association between the single logical address and the physical address where the updated parity is stored.

9. The distributed storage system according to claim 4, wherein the parity is deleted when none of a plurality of data using the parity for data repair is confirmed to include latest data of corresponding logical addresses.

10. The distributed storage system according to claim 4, wherein the one or more processors are configured to check asynchronously with writing of the update data whether each of data used to create the parity is a latest data at a corresponding logical address to determine whether update of the parity is necessary.

11. A method for managing data in a distributed storage system including a plurality of nodes, comprising the steps of:

managing logical addresses provided to an input/output request source in association with physical addresses of storage locations in one or more storage devices;

associating a plurality of physical addresses with a single logical address to read data after update and data before update selectively when data is updated; and when updating the data of the single logical address, storing update data for updating in a physical address different from the physical address of the data before the update, and adding an association between the single logical address and the physical address where the update data is stored.

12. A method for managing data in a distributed storage system including a plurality of nodes, comprising the steps of:

managing logical addresses provided to an input/output request source in association with physical addresses of storage locations in one or more storage devices;

associating a plurality of physical addresses with a single logical address to read data after update and data before update selectively when data is updated; one or more processors configured to process data input/output to/from the one or more storage devices;

storing, by each of nodes, which receives data from a host, the received data to a local storage device of each of the nodes, respectively;

storing, by the local storage device of each of the nodes, the received data and a parity created based on multiple data received from the host by different nodes from each of the nodes, respectively, and stored in the local storage devices of the different nodes from each of the nodes, respectively;

sending, when the data is updated, update data to a node storing the data before update and a node storing a parity of the data; and updating, by the node storing the data before update and the node storing the parity of the data, the data and the parity asynchronously.

* * * * *